(12) United States Patent
Arai et al.

(10) Patent No.: US 12,149,845 B2
(45) Date of Patent: Nov. 19, 2024

(54) IMAGE SENSOR, IMAGING DEVICE, AND RANGING DEVICE

(71) Applicant: SONY SEMICONDUCTOR SOLUTIONS CORPORATION, Kanagawa (JP)

(72) Inventors: Hideki Arai, Kanagawa (JP); Yusuke Otake, Kanagawa (JP); Takuro Murase, Kanagawa (JP); Takeshi Yamazaki, Kanagawa (JP); Taisuke Suwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 46 days.

(21) Appl. No.: 17/759,118

(22) PCT Filed: Jan. 25, 2021

(86) PCT No.: PCT/JP2021/002376
§ 371 (c)(1),
(2) Date: Jul. 20, 2022

(87) PCT Pub. No.: WO2021/153480
PCT Pub. Date: Aug. 5, 2021

(65) Prior Publication Data
US 2023/0044912 A1   Feb. 9, 2023

(30) Foreign Application Priority Data
Jan. 29, 2020  (JP) .................. 2020-012436

(51) Int. Cl.
*H04N 25/65* (2023.01)
*H04N 25/71* (2023.01)
*H04N 25/772* (2023.01)

(52) U.S. Cl.
CPC ............. *H04N 25/65* (2023.01); *H04N 25/71* (2023.01); *H04N 25/772* (2023.01)

(58) Field of Classification Search
CPC ...... H04N 25/65; H04N 25/71; H04N 25/772; H04N 25/705; H04N 25/771; H04N 25/79;
(Continued)

(56) References Cited

U.S. PATENT DOCUMENTS 7,705,900 B2 *  4/2010  Guidash .............. H04N 25/59
                                                 348/308
9,584,800 B2 *  2/2017  Beck ................... H04N 25/68
(Continued)

FOREIGN PATENT DOCUMENTS

EP    3598167 A1    1/2020
EP    3598499 A     1/2020
(Continued)

OTHER PUBLICATIONS

International Search Report and Written Opinion of PCT Application No. PCT/JP2021/002376, issued on Apr. 20, 2021, 10 pages of ISRWO.

(Continued)

*Primary Examiner* — Albert H Cutler
(74) *Attorney, Agent, or Firm* — CHIP LAW GROUP

(57) ABSTRACT

The present technology relates to an image sensor, an imaging device, and a ranging device capable of performing imaging so that noise is reduced.
A photoelectric conversion unit configured to perform photoelectric conversion; a charge accumulation unit configured to accumulate charges obtained by the photoelectric conversion unit; a transfer unit configured to transfer the charges from the photoelectric conversion unit to the charge accumulation unit; a reset unit configured to reset the charge
(Continued)

accumulation unit; a reset voltage control unit configured to control a voltage to be applied to the reset unit; and an additional control unit configured to control addition of capacitance to the charge accumulation unit are included. The charge accumulation unit includes a plurality of regions. The present technology can be applied to, for example, an imaging device that captures an image and a ranging device that performs ranging.

17 Claims, 43 Drawing Sheets

(58) Field of Classification Search
CPC ...... H04N 25/59; H04N 25/63; H04N 25/766; G01S 7/4914; G01S 7/4915; G01S 17/894; G01S 7/4816; G01S 7/486; H01L 27/14643; H01L 27/14603; H01L 27/1461; H01L 27/14656; H01L 27/14612; H01L 27/14636
See application file for complete search history.

(56) References Cited

U.S. PATENT DOCUMENTS

| | | | | |
|---|---|---|---|---|
| 9,936,153 | B1* | 4/2018 | Mao | H01L 27/14636 |
| 2009/0200454 | A1* | 8/2009 | Barbier | H04N 25/59 |
| | | | | 250/214.1 |
| 2015/0136955 | A1 | 5/2015 | Wein | |
| 2018/0366504 | A1* | 12/2018 | Jin | H01L 27/1461 |
| 2020/0049803 | A1* | 2/2020 | Chueh | G01S 7/4863 |

FOREIGN PATENT DOCUMENTS

| | | |
|---|---|---|
| JP | 2004-140149 A | 5/2004 |
| JP | 2018-186398 A | 11/2018 |
| JP | 2019-216379 A | 12/2019 |
| JP | 2020-013910 A | 1/2020 |
| TW | 200625611 A | 7/2006 |
| TW | 201110688 A | 3/2011 |
| TW | 201945755 A | 12/2019 |
| WO | WO-2017154605 A1 | 9/2017 |
| WO | 2018/221261 A1 | 12/2018 |

OTHER PUBLICATIONS

Office Action for JP Patent Application No. 2021-574008 issued on Sep. 10, 2024, 05 pages of English Translation and 04 pages of Office Action.

Office Action for TW Patent Application No. 11320915800 issued on Sep. 5, 2025, 12 pages of Office Action.

\* cited by examiner

IMAGE SENSOR, IMAGING DEVICE, AND RANGING DEVICE

CROSS REFERENCE TO RELATED APPLICATIONS

This application is a U.S. National Phase of International Patent Application No. PCT/JP2021/002376 filed on Jan. 25, 2021, which claims priority benefit of Japanese Patent Application No. JP 2020-012436 filed in the Japan Patent Office on Jan. 29, 2020. Each of the above-referenced applications is hereby incorporated herein by reference in its entirety.

TECHNICAL FIELD

The present technology relates to an image sensor, an imaging device, and a ranging device and to, for example, an image sensor, an imaging device, and a ranging device capable of reducing noise.

BACKGROUND ART

In the related art, for example, image sensors such as charge coupled device (CCD) or complementary metal oxide semiconductor (CMOS) image sensors are used in electronic devices that have imaging functions of digital still cameras or digital video cameras.

Each image sensor includes pixels in which a photodiode (PD) performing photoelectric conversion and a plurality of transistors are embedded, and an image is constructed based on pixel signals output from the plurality of pixels arrayed in a planar form. The pixel signals output from the pixels are subjected to analog to digital (AD) conversion in parallel and output by, for example, a plurality of AD converters disposed in every column of the pixels.

PTL 1 proposes that reading is performed twice before and after exposure start as a scheme of performing cancelation including kTC noise of each pixel. In this proposal, resetting is applied before the exposure start, a reset signal of each pixel is acquired for all the effective pixels, and the reset signal is stored as digital data in a memory or the like. CDS is performed with the digital data which is subtracted from accumulated signals acquired after exposure is completed.

CITATION LIST

Patent Literature

PTL 1

JP 2004-140149A

SUMMARY

Technical Problem

In an image sensor, it is preferable to further reduce noise such as kTC noise.

The present technology has been devised in such circumstances and is capable of reducing noise.

Solution to Problem

According to an aspect of the present invention, a first image sensor includes: a photoelectric conversion unit configured to perform photoelectric conversion; a charge accumulation unit configured to accumulate charges obtained by the photoelectric conversion unit; a transfer unit configured to transfer the charges from the photoelectric conversion unit to the charge accumulation unit; a reset unit configured to reset the charge accumulation unit; a reset voltage control unit configured to control a voltage to be applied to the reset unit; and an additional control unit configured to control addition of capacitance to the charge accumulation unit. The charge accumulation unit includes a plurality of regions.

According to another aspect of the present invention, a second image sensor includes: a photoelectric conversion unit configured to perform photoelectric conversion; a plurality of charge accumulation units configured to accumulate charges obtained by the photoelectric conversion unit; a plurality of transfer units configured to transfer the charges from the photoelectric conversion unit to the plurality of charge accumulation units; a plurality of reset units configured to reset the plurality of charge accumulation units; a plurality of reset voltage control units configured to control voltages to be applied to the plurality of reset units; and a plurality of additional control units configured to control addition of capacitance to the plurality of charge accumulation units. The charge accumulation unit of each of the plurality of charge accumulation units includes a plurality of regions.

According to still another aspect of the present invention, an imaging device includes an image sensor and a processing unit configured to process a signal from the image sensor. The image sensor includes a photoelectric conversion unit configured to perform photoelectric conversion, a charge accumulation unit configured to accumulate charges obtained by the photoelectric conversion unit, a transfer unit configured to transfer the charges from the photoelectric conversion unit to the charge accumulation unit, a reset unit configured to reset the charge accumulation unit, a reset voltage control unit configured to control a voltage to be applied to the reset unit, and an additional control unit configured to control addition of capacitance to the charge accumulation unit. The charge accumulation unit includes an image sensor including a plurality of regions and a processing unit processing a signal from the image sensor.

According to still another aspect of the present invention, a ranging device includes: a light-emitting unit configured to emit irradiation light; and a light-receiving element configured to receive reflected light when light from the light-emitting unit is reflected from an object. The light-receiving element includes a photoelectric conversion unit configured to perform photoelectric conversion, a plurality of charge accumulation units configured to accumulate charges obtained by the photoelectric conversion unit, a plurality of transfer units configured to transfer the charges from the photoelectric conversion unit to each of the plurality of charge accumulation units, a plurality of reset units configured to reset each of the plurality of charge accumulation units, a plurality of reset voltage control units configured to control voltages to be applied to each of the plurality of reset units, and a plurality of additional control units configured to control addition of capacitance to each of the plurality of charge accumulation units. The charge accumulation unit of each of the plurality of charge accumulation units includes a plurality of regions.

According to still another aspect of the present invention, a first image sensor includes: a photoelectric conversion unit configured to perform photoelectric conversion; a charge accumulation unit configured to accumulate charges obtained by the photoelectric conversion unit; a transfer unit configured to transfer the charges from the photoelectric conversion unit to the charge accumulation unit; a reset unit configured to reset the charge accumulation unit; a reset voltage control unit configured to control a voltage to be applied to the reset unit; and an additional control unit configured to control addition of capacitance to the charge accumulation unit. The charge accumulation unit includes a plurality of regions.

According to still another aspect of the present invention, a second image sensor includes: a photoelectric conversion unit configured to perform photoelectric conversion; a plurality of charge accumulation units configured to accumulate charges obtained by the photoelectric conversion unit; a plurality of transfer units configured to transfer the charges from the photoelectric conversion unit to the plurality of charge accumulation units; a plurality of reset units configured to reset the plurality of charge accumulation units; a plurality of reset voltage control units configured to control voltages to be applied to the plurality of reset units; and a plurality of additional control units configured to control addition of capacitance to the plurality of charge accumulation units. The charge accumulation unit of each of the plurality of charge accumulation units includes a plurality of regions.

According to still another aspect of the present invention, an imaging device includes the first image sensor.

According to still another aspect of the present invention, a ranging device includes the second image sensor.

The imaging device or the ranging device may be an independent device or may be an internal block included in one device.

DESCRIPTION OF EMBODIMENTS

Hereinafter, modes for carrying out the present technology (hereinafter referred to as embodiments) will be described.

Configuration of Imaging Device

Figure 1:
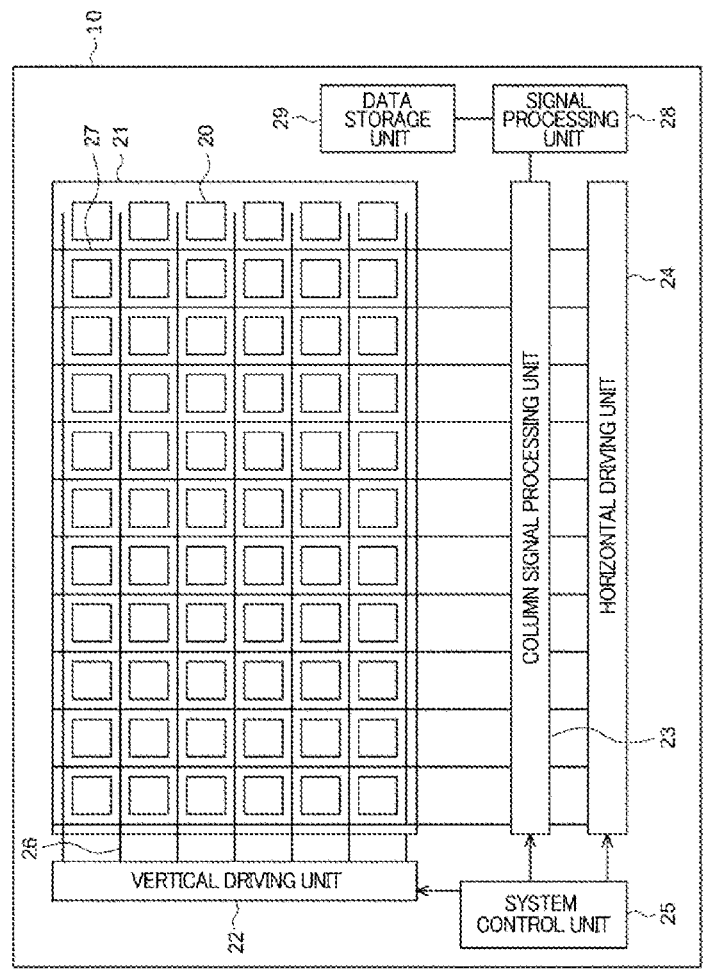
FIG. 1 is a diagram illustrating a configuration of an imaging device according to an embodiment to which the present technology is applied.

FIG. 1 is a block diagram illustrating an exemplary functional configuration of an imaging device 10 according to an embodiment of the present technology.

The imaging device 10 is, for example, a rear surface irradiation type image sensor of a so-called global shutter scheme, such as a complementary metal oxide semiconductor (CMOS) image sensor. The imaging device 10 captures an image by receiving light from a subject, performing photoelectric conversion, and generating an image signal.

The global shutter scheme is a scheme of basically performing global exposure by starting exposure of all the pixels simultaneously and ending the exposure of all the pixels simultaneously. Here, all the pixels are all the pixels of a portion appearing in an image and dummy pixels or the like are excluded. When a time difference or a distortion of an image is sufficiently small to the extent that there is no problem, a scheme of moving a region subjected to global exposure while performing the global exposure in units of a plurality of rows (for example, tens of rows) rather than simultaneously in all the pixels is also included in the global shutter scheme. A scheme of performing global exposure on pixels of a predetermined region rather than all the pixels of a portion appearing in an image is also included in the global shutter scheme.

A rear surface irradiation type image sensor is an image sensor configured such that a photoelectric conversion unit such as a photodiode that receives light from a subject and converts the light into an electrical signal is provided between a light reception surface on which the light is incident from the subject and a wiring layer in which a wiring such as a transistor driving each pixel is provided.

The imaging device 10 includes, for example, a pixel array unit 21, a vertical driving unit 22, a column signal processing unit 23, a data storage unit 29, a horizontal driving unit 24, a system control unit 25, and a signal processing unit 28.

In the imaging device 10, the pixel array unit 21 is formed on a semiconductor substrate 11 (to be described below). Peripheral circuits such as the vertical driving unit 22, the column signal processing unit 23, the data storage unit 29, the horizontal driving unit 24, the system control unit 25, and the signal processing unit 28 are formed on, for example, the same semiconductor substrate 11 as the pixel array unit 21.

The pixel array unit 21 includes a plurality of pixels 20 including photoelectric conversion units (to be described below) that generate and accumulate charges in accordance with an amount of light incident from the subject. The pixels 20 are arrayed in the horizontal direction (the row direction) and the vertical direction (the column direction), as illustrated in FIG. 1. In the pixel array unit 21, a pixel driving line 26 is wired in the row direction for each pixel row formed by the pixels 20 arrayed in a line in the row direction and a vertical signal line (VSL) 28 is wired in the column direction for each pixel column formed by the pixels 20 arrayed in a line in the column direction.

The vertical driving unit 22 is configured with a shift register or an address decoder. The vertical driving unit 22 simultaneously drives all the plurality of pixels 20 in the pixel array unit 21 or drives the pixels 20 in units of pixel rows by supplying signals or the like to the plurality of pixels 20 through the plurality of pixel driving lines 26.

The vertical driving unit 22 includes, for example, two scanning systems, a reading scanning system and a sweeping scanning system. The reading scanning system selectively scans unit pixels of the pixel array unit 21 in sequence to read signals from the unit pixels in units of rows. The sweeping scanning system performs sweeping scanning on read rows in which the reading scanning is performed by the readings scanning system earlier than the reading scanning by a time of a shutter speed.

Through the sweeping scanning by the sweeping scanning system, unnecessary charges are swept from photoelectric conversion units 51 (to be described below) of the unit pixels in the read rows. This is called resetting. A so-called electronic shutter operation is performed by casing the sweeping scanning system to sweep unnecessary charges, that is, resetting. Here, the electronic shutter operation is an operation of discarding photoelectric charges of the photoelectric conversion unit 51 and newly starting exposure, that is, newly starting accumulation of the photoelectric charges.

A signal read through a reading operation by the reading scanning system corresponds to an amount of light incident after an immediately previous reading operation or an electronic shutter operation. A period from a reading timing of the immediately previous reading operation or a sweeping timing of the electronic shutter operation to a reading timing of a present reading operation is an accumulation time of photoelectric charges in the unit pixels, that is, an exposure time.

A signal output from each unit pixel of a pixel row selectively scanned by the vertical driving unit 22 is supplied to the column signal processing unit 23 through each vertical signal line 27. The column signal processing unit 23 performs predetermined signal processing on the signal output through a VSL 27 from each unit pixel of the selected row for each pixel column of the pixel array unit 21 and temporarily retains a pixel signal subjected to the signal processing.

Specifically, the column signal processing unit 23 is configured with, for example, a shift register or an address decoder and generates a digital pixel signal by performing noise removal processing, correlated double sampling processing, analog/digital (A/D) conversion A/D conversion processing on an analog pixel signal, and the like. The column signal processing unit 23 supplies the generated pixel signal to the signal processing unit 28.

The horizontal driving unit 24 is configured with a shift register, an address decoder or the like and selects the unit circuits corresponding to a pixel column of the column signal processing unit 23 in sequence. Through the selective scanning of the horizontal driving unit 24, the pixel signals subjected to the signal processing on each unit circuit in the column signal processing unit 23 are output in sequence to the signal processing unit 28.

The system control unit 25 is configured with a timing generator or the like that generates various timing signals. The system control unit 25 performs driving control on the vertical driving unit 22, the column signal processing unit 23, and the horizontal driving unit 24 based on a timing signal generated by the timing generator.

The signal processing unit 28 performs signal processing such as arithmetic processing on the pixel signal supplied from the column signal processing unit 23 while temporarily storing data in the data storage unit 29 as necessary, and outputs an image signal formed from each pixel signal.

The data storage unit 29 temporarily store data necessary for the signal processing during the signal processing of the signal processing unit 28.

Exemplary Circuit Configuration of Pixel

Figure 2:
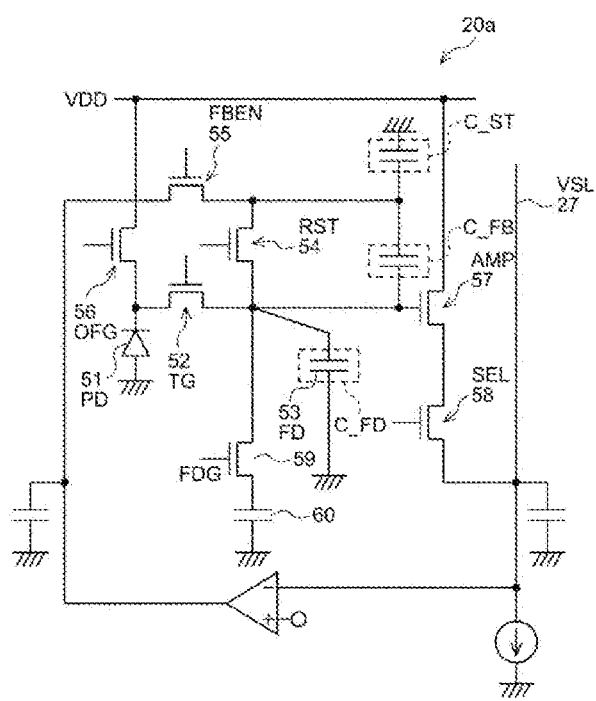
FIG. 2 is a diagram illustrating an exemplary circuit configuration of a pixel.

Next, an exemplary circuit configuration of the pixel 20 provided in the pixel array unit 21 in FIG. 1 will be described with reference to FIG. 2. FIG. 2 is a diagram illustrating an exemplary circuit configuration of any one pixel 20 among the plurality of pixels 20 provided in the pixel array unit 21. The pixel 20 illustrated in FIG. 2 is referred to as the pixel 20 in the first embodiment and is referred to as a pixel 20a for distinguishment from pixels of other embodiments.

In the example illustrated in FIG. 2, the pixel 20a implements an FD type global shutter. In the example of FIG. 2, the pixel 20a in the pixel array unit 21 includes, for example, a photoelectric conversion unit (PD) 51, a charge transfer unit (TG) 52, a floating diffusion (FD) 53 serving as a charge retention unit and a charge voltage conversion unit, a reset transistor (RST) 54, a feedback enable transistor (FBEN) 55, a discharge transistor (OFG) 56, an amplification transistor (AMP) 57, a select transistor (SEL) 58, a conversion efficiency switching transistor (FDG) 59, and an additional capacitance unit 60.

In this example, the TG 52, the FD 53, the RST 54, the FBEN 55, the OFG 56, the AMP 57, and the SEL 58 are all N-type MOS transistors. A gate electrode of each of the TG 52, the FD 53, the RST 54, the FBEN 55, the OFG 56, the AMP 57, and the SEL 58 is supplied with a driving signal. Each driving signal is a pulse signal in which a high level state is an active state, that is, an ON state and a low level state is an inactive state, that is, an OFF state. Hereinafter, setting a driving signal to the active state is also referred to turning a driving signal on and setting a driving signal to the inactive state is also referred to as turning the driving signal off.

The PD 51 is, for example, a photoelectric conversion element configured with a PN junction photodiode and functions as a photoelectric conversion unit that receives a light from a subject, generates charges corresponding to the amount of received light through photoelectric conversion, and accumulates the charges.

The TG 52 is connected between the PD 51 and the FD 53 and functions as a transfer unit that transfers the charges accumulated in the PD 51 to the FD 53 in accordance with a driving signal applied to the gate electrode of the TG 52.

The FD 53 functions as a charge retention unit that temporarily retains the charges accumulated in the PD 51 to implement the global shutter function. The FD 53 is also floating diffusion region that converts the charges transferred from the PD 51 through the TG 52 into an electrical signal (for example, a voltage signal) and outputs the electrical signal. The RST 54 is connected to the FD 53 and the VSL 28 is connected to the FD 53 through the AMP 57 and the SEL 58.

Further, the additional capacitance unit 60 which is a floating diffusion region (FD) that converts charges into an electric signal, for example, a voltage signal, is also connected to the FD 53 through the FDG 59. The additional capacitance unit 60 is a floating diffusion region (FD), but is assumed to be expressed using a capacitor circuits sign since an operation is performed with the same capacitance as that of the FD 53.

The FDG 59 is turned on or off in accordance with a driving signal FDG to switch a connection state to one of states in which the FD 53 and the additional capacitance unit 60 are electrically connected and electrically separated. The FDG 59 functions as an additional control unit that controls addition of the additional capacitance unit 60.

A gate electrode configuring the FDG 59 is supplied with a driving signal FDG. When the driving signal FDG is turned on, a potential immediately below the FDG 59 becomes deep, and thus the FD 53 and the additional capacitance unit 60 are electrically connected.

Conversely, when the driving signal FDG is turned off, the potential immediately below the FDG 59 becomes shallow, and thus the FD 53 and the additional capacitance unit 60 are electrically separated. Accordingly, the driving signal FDG is turned on or off to add capacitance to the FD 53 and change sensitivity of the pixel. Specifically, when ΔQ is a change amount of the accumulated charges, ΔV is a change in a voltage at that time, and C is a capacitance value, a relation of $\Delta V = \Delta Q/C$ is established.

Now, when CFD is a capacitance value of the FD 53 and CFD2 is a capacitance value of the additional capacitance unit 60, the capacitance value C in a region of the pixel in which reading of a signal level is performed is CFD+CFD2 in the state in which the driving signal FDG is turned on. Conversely, when the driving signal FDG is turned off, the capacitance value C is changed to CFD. Therefore, sensitivity (a change amount of a voltage: FD conversion efficiency) of a voltage with respect to the change amount of the charges is raised.

In this way, in the pixel 20a, sensitivity of the pixel is appropriately changed by turning the driving signal FDG on or off. For example, when the driving signal FDG is turned on, the additional capacitance unit 60 is electrically connected to the FD 53. Therefore, some of the charges transferred from the PD 61 to the FD 53 are accumulated not only in the FD 53 but also in the additional capacitance unit 60.

The RST 54 includes a drain connected to the FBEN 55 and a source connected to the FD 53. The RST 54 functions as a reset unit that initializes, that is, resets, the FD 53 in accordance with a driving signal applied to the gate electrode. As illustrated in FIG. 2, the drain of the RST 54 forms a parasitic capacitance C_ST with the grounding and a parasitic capacitance C_FB with the gate electrode of the AMP 57.

The FBEN 55 functions as a reset voltage control unit that performs controlling a reset voltage to be applied to the RST 54.

The OFG 56 includes a drain connected to a power source VDD and a source connected to the PD 51. A cathode of the PD 51 is connected to the source of the OFG 56 and the source of the TG 52 in common. The OFG 56 initializes, that is, resets, the PD 51 in accordance with a driving signal applied to the gate electrode. The resetting of the PD 51 means depleting the PD 51.

The AMP 57 includes a gate electrode connected to the FD 53 and a drain connected to the power source VDD and serves an input unit of a source follower circuit that reads charges obtained through photoelectric conversion of the PD 51. That is, the AMP 57 of which the source is connected to the VSL 28 through the SEL 58 configures the source follower circuit along with a constant current source connected to one end of the VSL 28.

The SEL 58 is connected between the source of the AMP 57 and the VSL 28 to supply a select signal to the gate electrode of the SEL 58. When the select signal is turned on, the SEL 58 enters a conductive state and the pixel 20a where the SEL 58 is provided enters a selection state. When the pixel 20a enters the selection state, a pixel signal output from the AMP 57 is read through the VSL 28 by the column signal processing unit 23.

In the pixel array unit 21, the plurality of pixel driving lines 26 are each wired, for example, for each pixel row. Each driving signal is supplied from the vertical driving unit 22 to the selected pixel 20a through the plurality of pixel driving lines 26.

The pixel circuit illustrated in FIG. 2 is an example of a pixel circuit which can be used in the pixel array unit 21 and a pixel circuit that has a different configuration can also be used.

Exemplary Planar Configuration of Pixel

Figure 3:
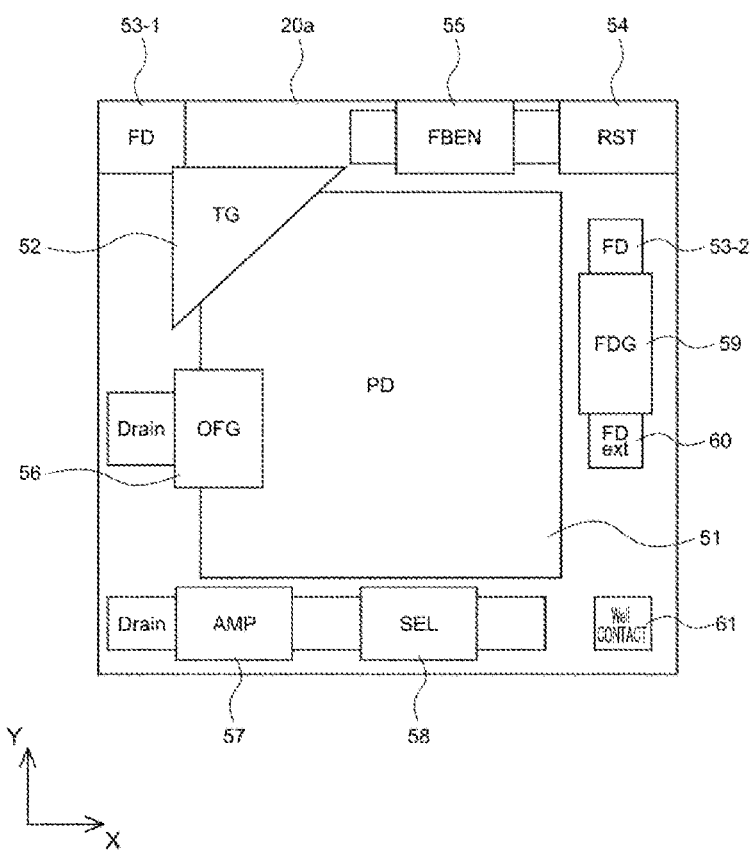
FIG. 3 is a diagram illustrating an exemplary planar configuration of a pixel.

FIG. 3 is a plan view illustrating a configuration of the pixel 20a according to the first embodiment. In description of FIG. 3 and the subsequent drawings, the left and right directions in the drawings are referred to as the X axis direction and the upward and downward directions in the drawings are referred to as the Y axis direction. In FIG. 3, the X direction corresponds to the row direction (the horizontal direction) of FIG. 2 and the Y direction corresponds to the column direction (the vertical direction) of FIG. 2 in the following description.

As illustrated in FIG. 3, the PD 51 is provided in a region of a central portion of the rectangular pixel 20*a*. On the top left side of the PD 51 in the drawing, the TG 52 is provided. The TG 52 is a gate portion of the transfer transistor 52.

An FD53-1 is provided on the top side of the TG 52, The FD 53 is formed from two regions of an FD 53-1 and an FD53-2. The FD 53-1 and the FD 53-2 are connected in a wiring layer (not illustrated) of a lower layer and are configured to function as one FD 53. The FD 53-1 and the FD 53-2 formed inside the same pixel 20*a* can also be connected. As will be described with reference to FIG. 4, the FD 53-1 and the FD 53-2 formed in another pixel 20*a* can also be connected.

The two regions of the FD 53-1 and the FD 53-2 are regions formed in a substrate (for example, a silicon substrate) in which the PD 51 is formed. In the following description, a region is assumed to be a region in the substrate in which the PD 51 is formed unless particularly mentioned.

The FD 53 is configured from the FD 53-1 and the FD 53-2 formed in different regions in the substrate. In other words, the FD 53 is formed by connecting a plurality of regions distributed and formed in the substrate by wirings. In the following description, the different regions are assumed to be a plurality of regions in the substrate or regions distributed and formed in the substrate.

The FD 53-2 is formed at a position coming into contact with the FDG 59. In FIG. 3, the FDG 59 is provided on the right side of the PD 51 in the drawing and the FD 53-2 is formed on the upper side of the FDG 59. The additional capacitance unit (FDext) 60 is formed on the lower side of the FDG 59 in the drawing. Since the FD 53 is formed in two regions of the FD 53-1 and FD 53-2, the capacitance of the FD 53 itself can be increased. By providing the FDG 59 and the additional capacitance unit 60, the capacitance of the FD 53 can be further increased.

The RST 54 is formed on the top right side of the PD 51 in the drawing. The FBEN 55 is formed on the left side of the RST 54 in the drawing. The AMP 55 (its gate) that amplifies a signal amount from the FD 53 is formed on the bottom lower side of the PD 51 in the drawing. The SEL 58 is formed on the right side of the AMP 55 in the drawing.

A well contact 61 is provided on the right side of the SEL 58 in the drawings and the bottom right side of the pixel 20*a* in the drawing. The OFG 56 is provided on the left side of the PD 51 in the drawing.

The layout illustrated in FIG. 3 and the subsequent drawings is exemplary and does not mean limiting the description. In the examples given in FIG. 3 and the subsequent drawings, the configuration in which the OFG 56 is provided will be described, but a configuration in which the OFG 56 is not provided can also be used.

Figure 4:
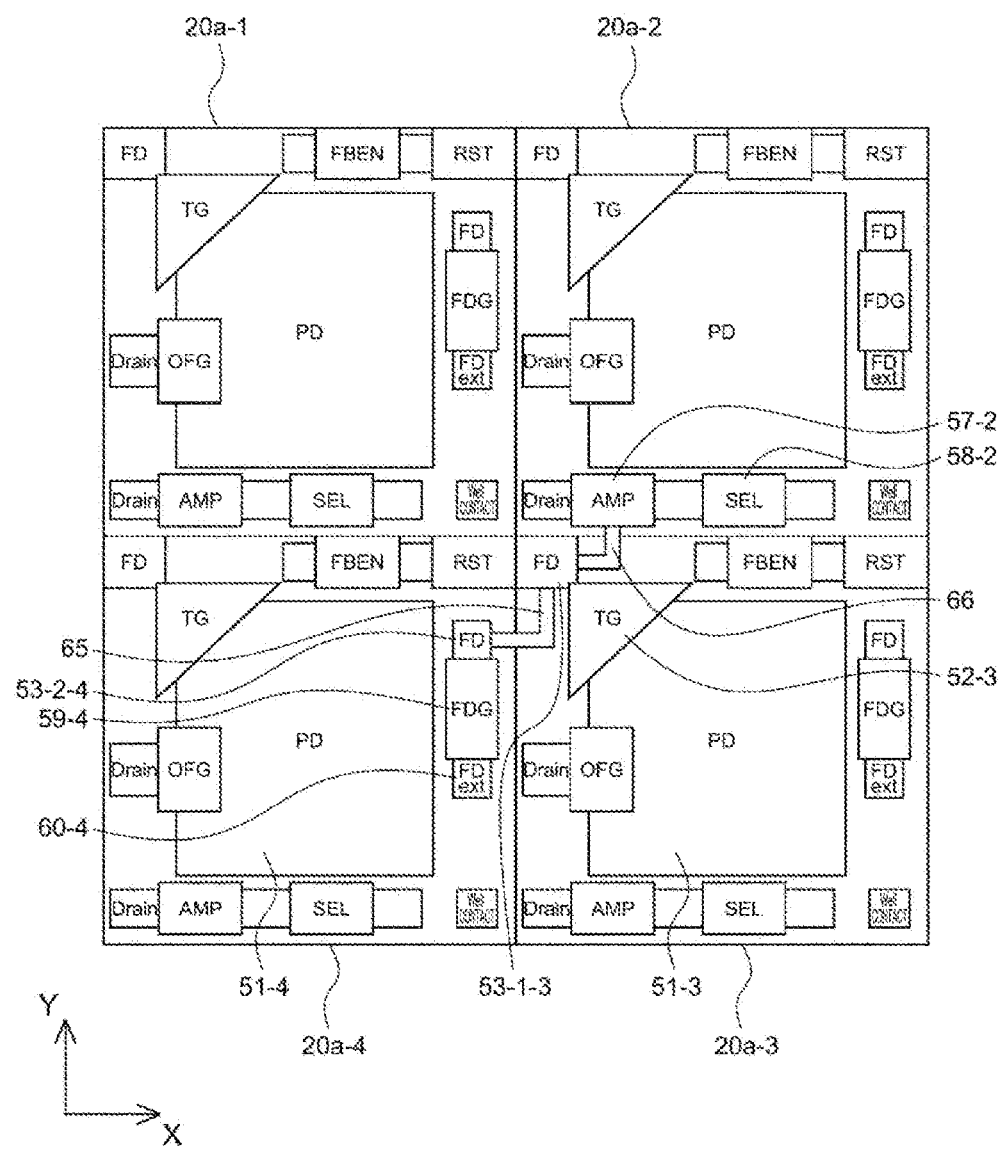
FIG. 4 is a diagram illustrating an exemplary planar configuration of a plurality of pixels.

The layout illustrated in FIG. 3 is a layout appropriate for a case in which the FD 53-1 and the FD 53-2 disposed in the adjacent pixels 20*a*, as illustrated in FIG. 4, are connected. In a case or the like in which the FD 53-1 and the FD 53-2 in the same pixel 20*a* are connected, another layout can be used as a more appropriate layout.

FIG. 4 is referred to FIG. 4 is a diagram illustrating four (2×2) pixels 20*a* disposed in the pixel array unit 21. A pixel in the top left of the drawing is referred to as a pixel 20*a*-1, a pixel in the top right of the drawing is referred to as a pixel 20*a*-2, a pixel in the bottom right of the drawing is referred to as a pixel 20*a*-3, and a pixel in the bottom left of the drawing is referred to as a pixel 20*a*-4. In FIG. 4, reference numerals are given to portions necessary in description and the reference numerals are appropriately omitted.

An FD 53-2-4 formed in the pixel 20*a*-4 and an FD 53-1-3 formed in the pixel 20*a*-3 are connected by a wiring 65. The wiring 65 is formed in a wiring layer (not illustrated) stacked on a layer in which the PD 51 is formed.

The pixels 20*a*-4 and 20*a*-3 are the pixels 20*a* adjacent in the horizontal direction. The FD 53-1 formed in one pixel 20*a* between the adjacent pixels 20*a* and the FD 53-2 formed in the other pixel 20*a* between the pixels 20*a* are connected to function as one FD 53.

The AMP 57 performing reading from the FD 53 configured from the FD 53-2-4 and the FD 53-1-3 is an AMP 57-2 formed in the pixel 20*a*-2. The FD 53-1-3 formed in the pixel 20*a*-3 and the AMP 57-2 of the pixel 20*a*-2 are connected by a wiring 66.

In this case, a signal from a PD 51-3 formed in the pixel 20*a*-3 is read by the TG 52-3 formed in the same pixel 20*a*-3 and is transferred to the FD 53-1-3 in the same pixel 20*a*-3. Since the FD 53-1-3 is connected to the FD 53-2-4 formed in the adjacent pixel 20*a*-4 by the wiring 65, a signal from the PD 51-3 is transferred to the FD 53 configured from the FD 53-1-3 and the FD 53-2-4.

When an FDG 59-4 connected to the FD 53-2-4 is turned on, the FD 53-2-4 and an additional capacitance 60-4 enter a connection state and the FD 53 is formed from the FD 53-1-3, the FD 53-2-4, and the additional capacitance 60-4.

Charges (signal) transferred to the FD 53 formed from the FD 53-2-4 and the FD 53-1-3 are read by the AMP 57-2 formed in the pixel 20*a*-2 disposed on the upper side of the pixel 20*a*-3 are amplified. The signal amplified by the AMP 57-2 is outputs to the VSL 27 (not illustrated in FIG. 4) through the SEL 58-2 formed in the pixel 20*a*-2 in which the AMP 57-2 is formed.

By distributing and providing the FD 53 in the FD 53-1 and the D 53-2, it is possible to form the capacitance of the FD 53 itself, in other words, the region used as the FD, as a large region. By distributing the FD 53 to the FD 53-1 and the FD 53-2, it is possible to add the degree of freedom of a position at which (a region where) the FD 53 is disposed. For example, as illustrated in FIG. 4, the FD 53-1 and the FD 53-2 disposed in the two adjacent pixels 20*a* can be configured to be connected.

Although the capacitance of the FD 53 is increased, the degree of freedom of the position at which (the region where) the FD 53 is disposed can be increased, and thus a region where the FBEN 55 is disposed can be guaranteed. By providing the FBEN 55, it is possible to reduce noise.

Thus, according to the embodiment, it is possible to increase the capacitance of the FD and reduce noise.

Case in which Pixel is Applied to Imaging Device that Performs Ranging

A case in which a pixel configured to have an FD with large capacitance and have the function (the FBEN 55) of reducing noise as in the foregoing pixel 20*a* is applied to an imaging device that performs ranging will be additionally described below. First, the imaging device that performs ranging will be additionally described.

The present technology can be applied to a light-receiving element included in a ranging system that performs ranging in conformity with, for example, an indirect TOF scheme, an imaging device that includes the light-receiving element, or the like.

For example, the ranging system can be applied to an in-vehicle system that is mounted in a vehicle and measures a distance to a target outside of the vehicle, a gesture recognition system that measures distance to a target such as a hand of a user and recognizes a gesture of the user based on a result of the measurement, or the like. In this case, a result of gesture recognition can be used for, for example, a manipulation or the like of a car navigation system.

Exemplary Configuration of Ranging Device

Figure 5:
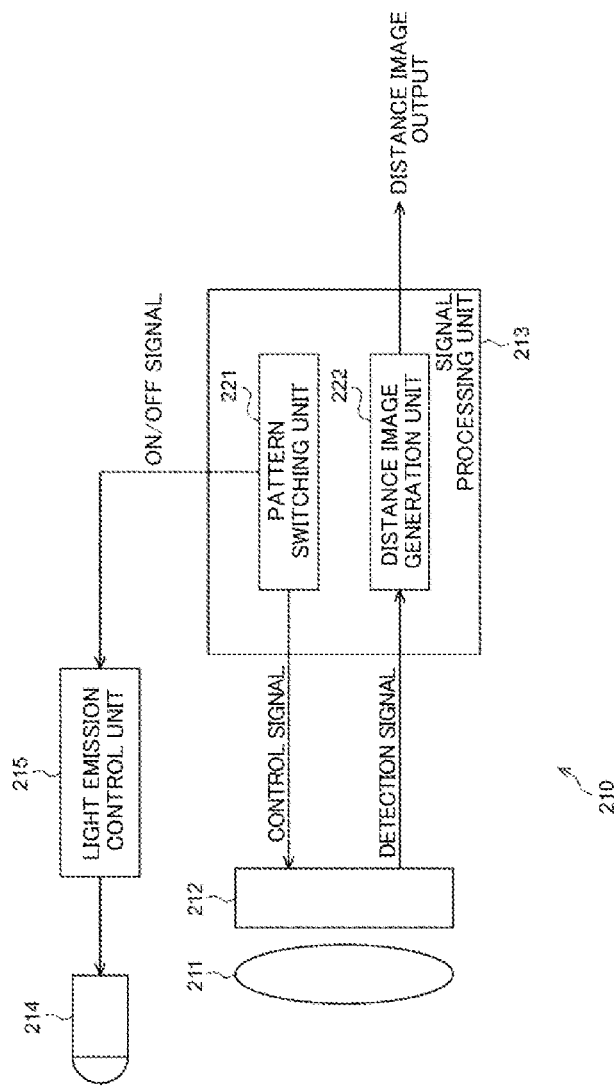
FIG. 5 is a diagram illustrating a configuration of a ranging device according to an embodiment.

FIG. 5 is a diagram illustrating an exemplary configuration of a ranging device according to an embodiment to which the present technology is applied.

A ranging device 210 includes a lens 211, a light-receiving unit 212, a signal processing unit 213, a light-emitting unit 214, and a light irradiation control unit 215. The signal processing unit 213 includes a pattern switching unit 221 and a distance image generation unit 222. The ranging device 210 in FIG. 5 irradiates an object with light, receives light (reflected light) obtained at the time of reflection of the light (the irradiation light) from the object, and measures a distance to the object.

A light-emitting system of the ranging device 210 is formed by the light-emitting unit 214 and the light irradiation control unit 215. In the light-emitting system, the light irradiation control unit 215 causes the light-emitting unit 214 to emit infrared light (IR) under the control of the signal processing unit 213. An IR band filter may be provided between the lens 211 and the light-receiving unit 212 and the light-emitting unit 214 may be configured to emit infrared light corresponding to a transmission wavelength band of an IR bandpass filter.

The light-emitting unit 214 may be disposed inside the casing of the ranging device 210 and may be disposed outside of the casing of the ranging device 210. The light irradiation control unit 215 causes the light-emitting unit 214 to emit light in a predetermined pattern. This pattern is set by the pattern switching unit 221 and is switched at a predetermined timing.

The pattern switching unit 221 can be provided to switch a light irradiation pattern so that the light irradiation pattern does not overlap, for example, a pattern of another ranging device 210. The pattern switching unit 221 may not be provided.

The signal processing unit 213 can function as, for example, a calculation unit that calculates a distance from the ranging device 210 to an object based on an image signal supplied from the light-receiving unit 212. When the calculated distance is output as an image, the distance image generation unit 222 of the signal processing unit 213 generates and outputs a distance image in which a distance to the object is expressed for each pixel.

Configuration of Image Sensor

Figure 6:
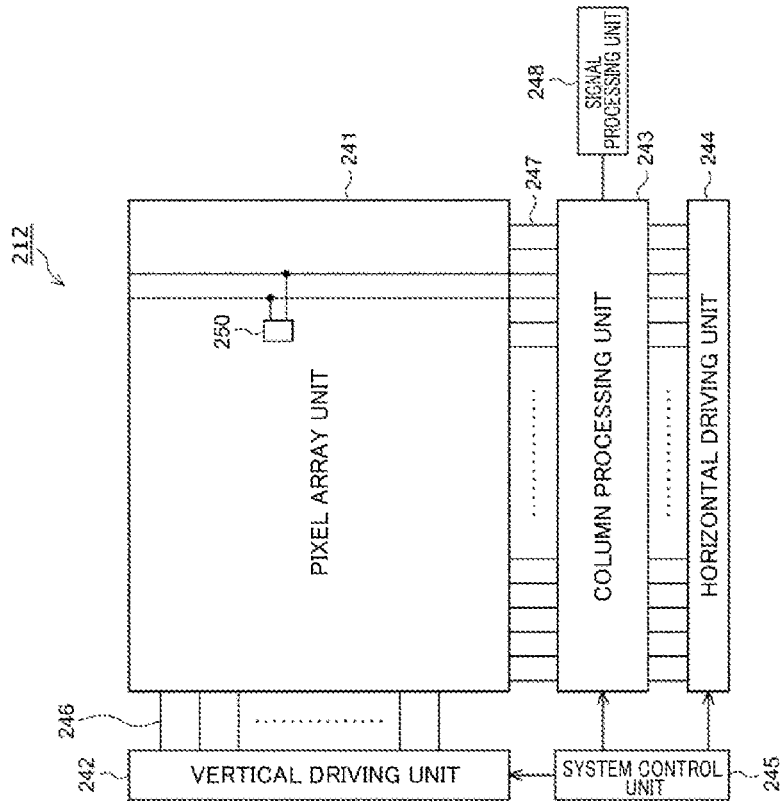
FIG. 6 is a diagram illustrating an exemplary configuration of a light reception unit.

FIG. 6 is a block diagram illustrating an exemplary configuration of the light-receiving unit 212. The light-receiving unit 212 can be set as a complementary metal oxide semiconductor (CMOS) image sensor.

The light-receiving unit 212 includes a pixel array unit 241, a vertical driving unit 242, a column processing unit 243, a horizontal driving unit 244, and a system control unit 245. The pixel array unit 241, the vertical driving unit 242, the column processing unit 243, the horizontal driving unit 244, and the system control unit 245 are provided on a semiconductor substrate (chip) (not illustrated).

In the pixel array unit 241, unit pixels (for example, pixels 250 in FIG. 7) including photoelectric conversion elements that generate photoelectric charges of a charge amount in accordance with an amount of incident light and accumulate the photoelectric charges therein are arrayed 2-dimensionally in a matrix form.

In the pixel array unit 241, a pixel driving line 246 is provided in the left and right directions of the drawing (an array direction of the pixels in a pixel row) for each row in the pixel array with the matrix form and a vertical signal line 247 is provided in the upward and downward directions of the drawing (an array direction of the pixels in a pixel column) for each column. One end of the pixel driving line 246 is connected to an output end of the vertical driving unit 242 corresponding to each row.

The vertical driving unit 242 is a pixel driving unit that is configured with a shift register, an address decoder, or the like and drives all the pixels of the pixel array unit 241 or the pixels simultaneously or in units of rows. A pixel signal output from each unit pixel in a pixel row selectively scanned by the vertical driving unit 242 is supplied to the column processing unit 243 through each vertical signal line 247. The column processing unit 243 performs predetermined signal processing on the pixel signal output from each unit pixel of a selected row through the vertical signal line 247 for each pixel column of the pixel array unit 241 and temporarily retains the pixel signal subjected to the signal processing.

Specifically, the column processing unit 243 performs at least noise removal processing, for example, correlated double sampling (CDS) processing, as the signal processing. Reset noise or fixed pattern noise specific to the pixels, such as a variance in a threshold value of the amplification transistor is removed through the correlated double sampling of the column processing unit 243. In addition to the noise removal processing, the column processing unit 243 can also be caused to have, for example, an analog-digital (AD) conversion function and output a signal level as a digital signal.

The horizontal driving unit 244 is configured with a shift register, an address decoder, or the like and selects the unit circuits corresponding to the pixel column of the column processing unit 243 in sequence. The pixel signals subjected to the signal processing by the column processing unit 243 is output in sequence to the signal processing unit 248 through the selective scanning of the horizontal driving unit 244.

The system control unit 245 is configured with a timing generator or the like generating various timing signals and performs driving control of the vertical driving unit 242, the column processing unit 243, the horizontal driving unit 244, and the like based on the various timing signals generated by the timing generator.

In the pixel array unit 241, the pixel driving line 246 is wired in the row direction for each pixel row and two vertical signal lines 247 are wired in the column direction for each pixel column in the pixel array of a matrix form. For example, the pixel driving line 246 transfers a driving signal for driving at the time of reading of a signal from the pixel. In FIG. 6, one wiring is indicated as the pixel driving line 246, but the present technology is not limited to one line.

One end of the pixel driving line 246 is connected to an output end of the vertical driving unit 242 corresponding to each row.

Structure of Unit Pixel

Next, a specific structure of the pixels 250 arrayed in a matrix form in the pixel array unit 241 will be described.

The pixel 250 includes a photodiode 261 (hereinafter referred to as a PD 261) which is a photoelectric conversion element, and charges generated in the PD 261 are distributed to taps 251A and 251B. Of the charges generated in the PD 261, the charges distributed to the tap 251A are read from the vertical signal line 247A and are output as a detection signal SIG1. The charges distributed to the tap 251B are read from the vertical signal line 247B and are output as a detection signal SIG2.

A basic configuration of the pixel 250 has a configuration of a two-pixel combination of two pixels 20a illustrated in FIG. 2. Each of the taps 251A and 251B has a configuration substantially similar to that of the pixel 20a.

The tap 251A includes a transfer transistor 252A, an FD 253A, a reset transistor 254A, a feedback enable transistor (FBEN) 255A, a discharge transistor (OFG) 256, an amplification transistor 257A, a select transistor 258A, a conversion efficiency switching transistor (FDG) 259A, and an additional capacitance unit 260A.

Similarly, the tap 251B includes a transfer transistor 252B, an FD 253B, a reset transistor 254B, an FBEN 255B, an amplification transistor 257B, a select transistor 258B, an FDG 259B, and an additional capacitance unit 260B.

Figure 7:
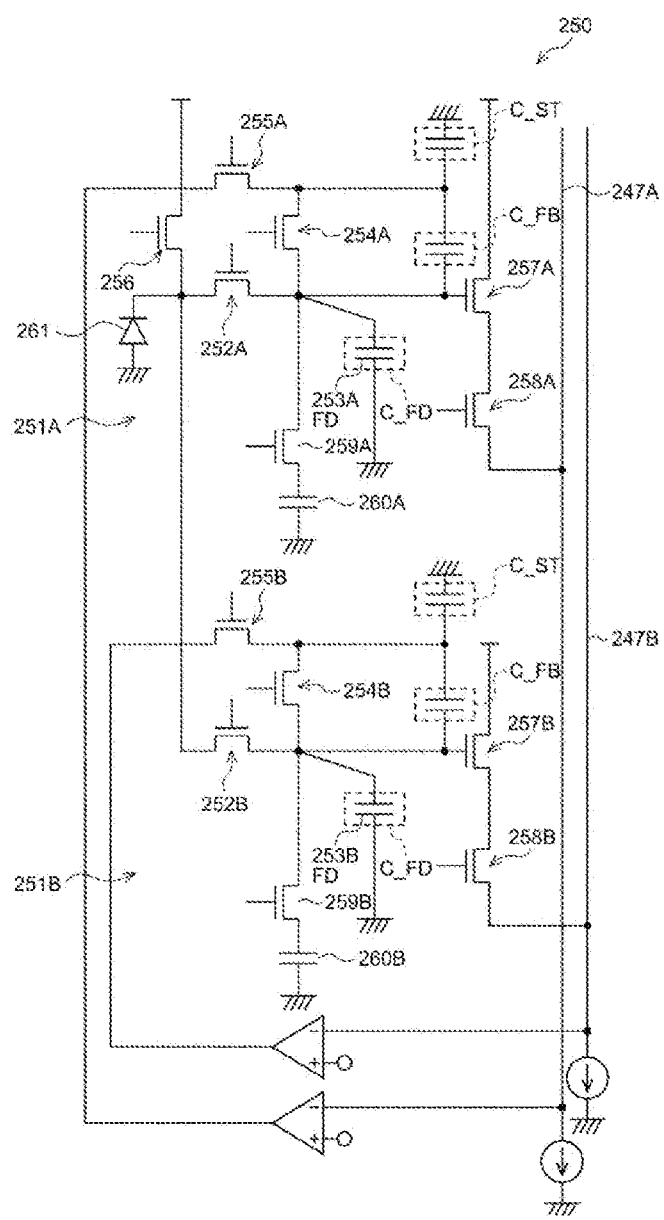
FIG. 7 is a diagram illustrating an exemplary circuit configuration of a pixel.

The reset transistor 254 may have a configuration in which the FD 253A and the FD 253B are individually provided, as illustrated in FIG. 7, or may have configuration in which the FD 253A and the FD 253B are shared.

As illustrated in FIG. 7, when the reset transistors 254A and 254B are provided in the FD 253A and the FD 253B, respectively, a reset timing of each of the FD 253A and the FD 253B can be individually controlled. Therefore, detailed control can be performed. When the reset transistor 254 shared between the FD 253A and the FD 253B is provided, reset timings of the FD 253A and the FD 253B can be set to be the same. Thus, control can be simplified and a circuit configuration can be simplified.

In the following description, a configuration in which the reset transistor 254 is provided in each of the FD 253A and the FD 253B will be described as an example.

The distribution of the charges in the pixel 250 will be described with reference to FIG. 8. Here, the distribution means reading of the charges accumulated in the pixel 250 (the PD 251) at a different timing and performing of the reading at each tap.

Figure 8:
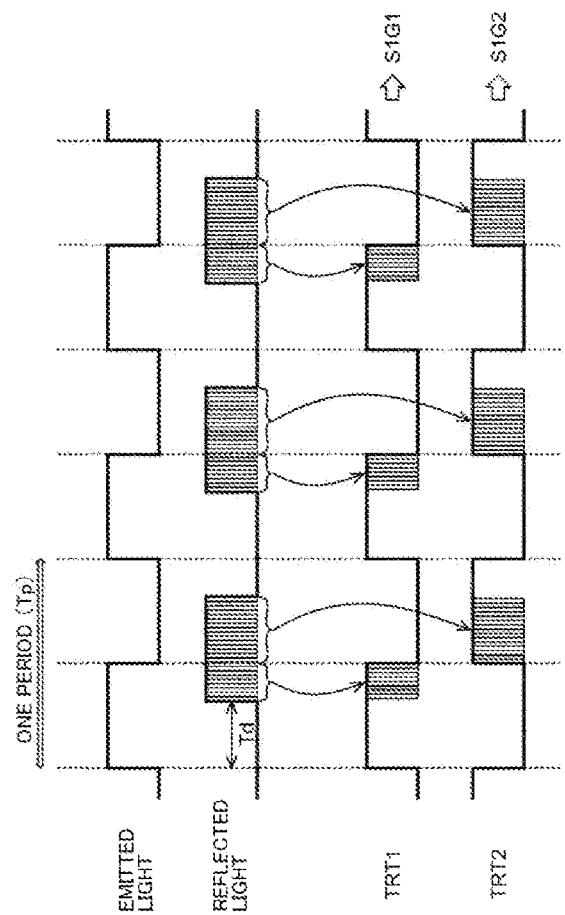
FIG. 8 is a diagram illustrating distribution of charges in the pixel.

As illustrated in FIG. 8, irradiation light modulated so that ON/OFF of the irradiation at an irradiation time T is repeated (one period=Tp) is output from the light-emitting unit 214 and is delayed by a delay time Td in accordance with a distance to an object. Reflected light is received in the PD 251. A transfer control signal TRT1 controls ON/OFF of the transfer transistor 252A and a transfer control signal TRT2 controls ON/OFF of the transfer transistor 252B. As illustrated, while the transfer control signal TRT1 has the same phase as the irradiation light, the transfer control signal TRT2 has a phase inverted from that of the transfer control signal TRT1.

Accordingly, the charges generated when the PD 251 receives the reflected light are transferred to the FD 253A while the transfer transistor 252A is turned on in accordance with the transfer control signal TRT1. The charges are transferred to the FD 253B while the transfer transistor 252B is turned on in accordance with the transfer control signal TRT2. Thus, for a predetermined period in which the irradiation of the irradiation light at the irradiation time T is periodically performed, the charges transferred through the transfer transistor 252A are accumulated sequentially in the FD 253A and the charges transferred through the transfer transistor 252B are accumulated sequentially in the FD 253B. The FD 253 functions as a charge accumulation unit that accumulates the charges generated in the PD 251 in this way.

When the select transistor 258A is turned on in accordance with a select signal SELm1 after end of the period in which the charges are accumulated, the charges accumulated in the FD 253A are read through the vertical signal line 247A and the detection signal SIG1 in accordance with the charge amount is output from the light-receiving unit 212. Similarly, when the select transistor 258B is turned on in accordance with a select signal SELm2, the charges accumulated in the FD 253B are read through the vertical signal line 247B and the detection signal SIG2 in accordance with the charge amount is output from the light-receiving unit 212.

The charges accumulated in the FD 253A and the charges accumulated in the FD 253B are discharged when the reset transistor 254 is turned on in accordance with the reset signal RST.

In this way, in the pixel 50, the charges generated from the reflected light received by the PD 251 can be distributed to the taps 251A and 251B in accordance with the delay time Td, and the detection signals SIG1 and SIG2 can be output. The delay time Td corresponds to a time in which light emitted from the light-emitting unit 214 flies to an object and light reflected from the object flies to the light-receiving unit 212, that is, corresponds to a distance to the object. Accordingly, the ranging device 210 can obtain a distance (a depth) to the object in accordance with the delay time Td based on the detection signals SIG1 and SIG2.

Ranging Method of Indirect TOF Scheme

As described above, calculation of a distance in accordance with an indirect TOF scheme in a two-tap scheme in which the charges accumulated in one PD 251 are read using two taps 251 will be described with reference to FIG. 9. A ranging method will be additionally described with reference to FIG. 9. In description made with reference to FIG. 9, a 2Tap-4Phase scheme which is a detection method using two taps and four phases will be described as an example.

One frame period in which a distance image is generated is divided into two signal detection periods, an A frame and a B frame. One frame period in which a distance image is generated is set to, for example, about 1/30 seconds. Accordingly, a period of the A frame and a period of the B frame are each set to about 1/60 seconds.

Irradiation light modulated so that ON/OFF of irradiation is repeated (one period=Tp) for the irradiation time Tp is output from the light-emitting unit 214 (FIG. 5). The irradiation time Tp can be set to, for example, about 210 ns. The light-receiving unit 212 receives the reflected light delayed by the delay time Td in accordance with the distance to the object.

In a 4Phase scheme, the light-receiving unit 212 receives the light in any of the taps 251A and 251B at four timings of the same phase (Phase0) as that of the irradiation light, a phase (Phase90) shifted by 90 degrees, a phase (Phase180)

shifted by 180 degrees, and a phase (Phase270) shifted by 270 degrees. Here, the light reception is assumed to include processing until the charges generated in the PD 251 are transferred to the FD 253 by turning on the transfer transistor 252.

Figure 9:
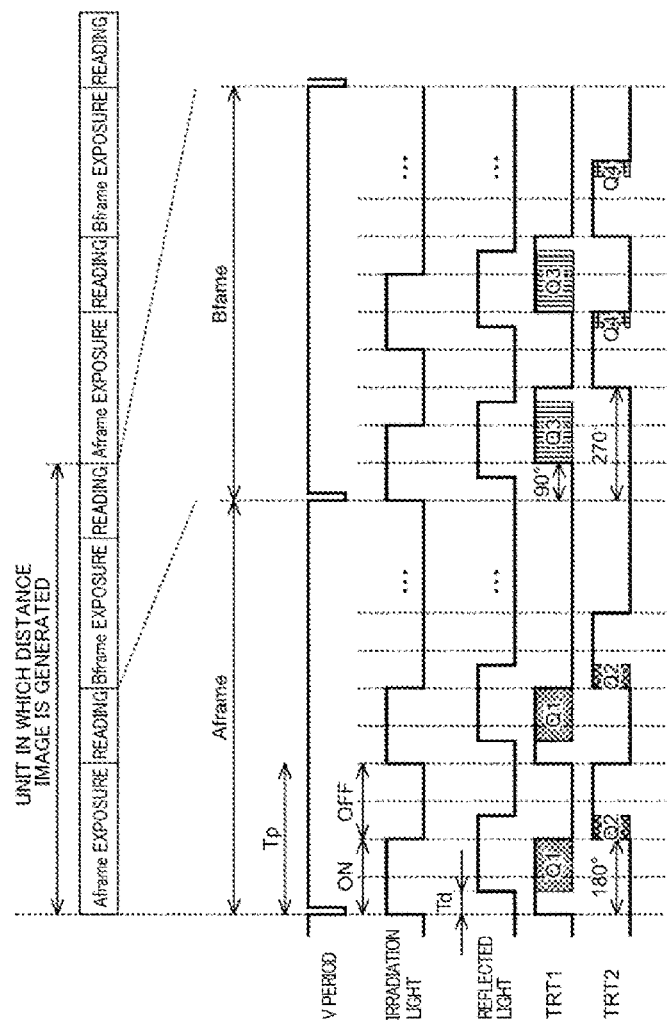
FIG. 9 is a diagram illustrating reading of signals.

In FIG. 9, in the A frame, the transfer control signal TRT1 is turned on at the timing of the same phase (Phase0) as that of the irradiation light and the tap 251A starts receiving the light. In the A frame, the transfer control signal TRT2 is turned on at the timing of the phase (Phase180) shifted by 180 degrees from that of the irradiation light and the tap 251B starts receiving the light.

In the B frame, the transfer control signal TRT1 is turned on at the timing of the phase (Phase90) shifted by 90 degrees from that of the irradiation light and the tap 251A starts receiving the light. In the B frame, the transfer control signal TRT2 is turned on at the timing of the phase (Phase270) shifted by 270 degrees from that of the irradiation light and the tap 251B starts receiving the light.

In this case, the taps 251A and 251B receive the light at the timing at which the phase is inverted by 180 degrees. When charges accumulated in the FD 253A of the tap 251A at the timing of Phase0 at the irradiation time Tp are charges Q1 for a period of the A frame, charges Q1' for an accumulation time of the irradiation time Tp within the period of the A frame are accumulated in the FD 253A for the period of the A frame. The charges Q1' accumulated in the FD 253A are read as a signal corresponding to the detection signal SIG1 from the FD 253A for a reading period. A signal value of the detection signal SIG1 corresponding to the charges Q1' is assumed to be a signal value I1.

When charges accumulated in the FD 253B of the tap 251B at the timing of Phase180 at the irradiation time Tp are charges Q2 for a period of the A frame, charges Q2' for an accumulation time of the irradiation time Tp within the period of the A frame are accumulated in the FD 253B for the period of the A frame. The charges Q2' accumulated in the FD 253B are read as a signal corresponding to the detection signal SIG2 from the FD 253B for a reading period. A signal value of the detection signal SIG2 corresponding to the charges Q2' is assumed to be a signal value I2.

When charges accumulated in the FD 253A of the tap 251A at the timing of Phase90 at the irradiation time Tp are charges Q3 for a period of the B frame, charges Q3' for an accumulation time of the irradiation time Tp within the period of the B frame are accumulated in the FD 253A for the period of the B frame. The charges Q3' accumulated in the FD 253A are read as a signal corresponding to the detection signal SIG1 from the FD 253A for a reading period. A signal value of the detection signal SIG1 corresponding to the charges Q3' is assumed to be a signal value I3.

When charges accumulated in the FD 253A of the tap 251B at the timing of Phase270 at the irradiation time Tp are charges Q4 for a period of the B frame, charges Q4' for an accumulation time of the irradiation time Tp within the period of the B frame are accumulated in the FD 253B for the period of the B frame. The charges Q4' accumulated in the FD 253B are read as a signal corresponding to the detection signal SIG2 from the FD 253B for a reading period. A signal value of the detection signal SIG2 corresponding to the charges Q4' is assumed to be a signal value I4.

A shift amount θ corresponding to the delay time Td can be detected at a distribution ratio of the signal values I1, I2, I3, and I4. That is, since the delay time Td is obtained based on the phase shift amount θ, a distance to a target is obtained in accordance with the delay time Td.

The phase shift amount θ is obtained with the following Expression (1) and a distance D to the target is calculated with the following Expression (2). In Expression (2), C denotes a velocity of light and Tp denotes a pulse width.

[Math. 1]

$$\theta = \arctan\left(\frac{I_1 - I_2}{I_3 - I_4}\right) \quad (1)$$

[Math. 2]

$$D = \frac{\theta}{2\pi} \times \left(\frac{T_p C}{2}\right) \quad (2)$$

In this way, it is possible to calculate a distance to a predetermined target. According to such a ranging scheme, it is possible to perform ranging in which an influence of ambient light is reduced. In the foregoing and following description, only reflected light of emitted pulse light is assumed to be received. However, actually, various kinds of ambient light are simultaneously received in addition to the emitted pulse light. Accordingly, the charges accumulated in the PD 251 depend on the emitted pulse light and the ambient light.

However, when the ambient light is considered to be regular with respect to a pulse period and is thus regular light, the ambient light are superimposed as offset light equivalent to the signal values I1, I2, I3, and I4. Accordingly, a component (an offset component) of the ambient light in calculation of Expression (1) is cancelled out, and thus has no influence on a ranging result.

Here, the case of a TOF type sensor of the 2Tap-4Phase scheme has been described as an example. The present technology can also be applied to a TOF type sensor of another scheme. For example, the TOF type sensor of the 4Tap-4Phase can also be applied.

Exemplary Planar Configuration of Pixel

Figure 10:
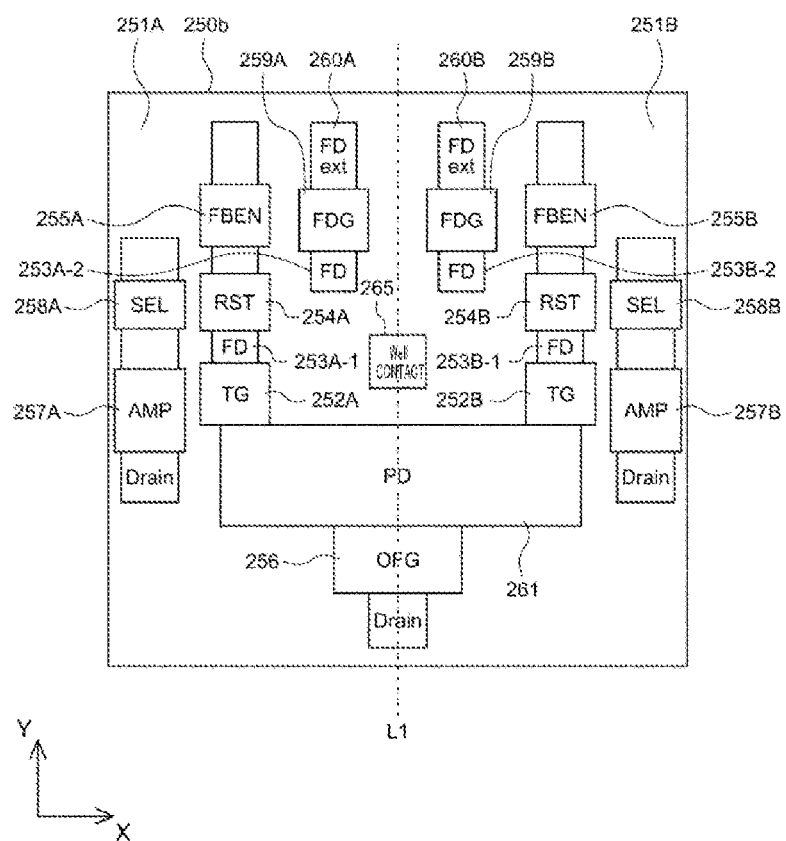
FIG. 10 is a diagram illustrating another exemplary planar configuration of a pixel according to a second embodiment.

An exemplary planar configuration of the pixel 250 corresponding to the exemplary circuit example illustrated in FIG. 7 is illustrated in FIG. 10. The pixel 250b illustrated in FIG. 10 will be described continuously as a pixel 250b in a second embodiment.

As illustrated in FIG. 10, a PD 261 is provided in a region near the central portion of the rectangular pixel 250a. A TG 252A and a TG 252B are provided on the upper side (upper side) of the PD 261 in the drawing. The TG 252A is a gate portion of the transfer transistor 252A and the TG 252B is a gate portion of the transfer transistor 252B.

The TG 252A and the TG 252B are provided to be adjacent to one side among four sides of the PD 261. In the example illustrated in FIG. 10, the TG 252A and the TG 252B are disposed side by side in the X axis direction of the upper side of the PD 261.

An FD 253A-1 is provided on the upper side of the TG 252A. The FD 253A-1 configures a part of the FD 253A included in the tap 251A. That is, in the pixel 250b, the FD 253 is configured from two regions as in the pixel 20a (see FIG. 3) in the first embodiment.

The FD 253A included in the tap 251A is configured from the FD 253A-1 and an FD 253A-2. The FD 253A-1 and the FD 253A-2 are formed in different regions. The FD 253A-1 is formed on the upper side of the TG 252A in the drawing and the FD 253A-2 is formed at a position away from the FD 253A-1 and a position on the upper side diagonally to the right of the FD 253A-1. As will be described, the FD 253A-1 and the FD 253A-2 are connected by a wiring in a wiring layer and are treated as one region.

An FDG 259A is formed on the upper side of the FD 253A-2 in the drawing. The additional capacitance unit 260A is formed on the upper side of the FDG 259A in the drawing. When the FDG 259A is turned on, three regions of the FD 253A-1, the FD 253A-2, and the additional capacitance unit 260A are in a connection state.

The amplification transistor 257A (its gate portion) included in the tap 251A is formed on the left side of the TG 252A in the drawing. The select transistor 258A (its gate portion) is formed on the upper side of the TG 252A in the drawing. Further, the FBEN 255A is provided in the tap 251A. The FBEN 255A is formed on the upper side of the reset transistor 254A in the drawing.

In this way, the FD 253A is distributed and formed in two regions of the FD 253A-1 and an FD 253A-2. The FD 253A-1 is connected to the RST 254A and the FBEN 255A is connected to the RST 254A. The FDG 259A is connected to the FD 253A-2. In this way, the FD 253A is divided and disposed in two regions of the FD 253A-1 and an FD 253A-2, the FBEN 255A is connected to one of the FD 253A-1 and an FD 253A-2 through the RST 254A, and the FDG 259A is connected to the other thereof.

Each unit forming the tap 251B is disposed on the right side of the tap 251A in the drawing. The tap 251B has a configuration similar to the tap 251A.

The TG 252B included in the tap 251B is formed on the upper right side of the PD 261 in the drawing. The FD 253B-1 is provided on the upper side of the TG 252B in the drawing. The FD 253B included in the tap 251B is configured from the FD 253B-1 and the FD 253B-2. The FD 253B-1 is formed on the upper side of the TG 252B in the drawing and the FD 253B-2 is formed at a position away from the FD 253B-1 and a position on the upper side diagonally to the left of the FD 253B-1. As will be described, the FD 253B-1 and the FD 253B-2 are connected by a wiring in a wiring layer and are treated as one region.

An FDG 259B is formed on the upper side of the FD 253B-2 in the drawing. The additional capacitance unit 260B is formed on the upper side of the FDG 259B in the drawing. When the FDG 259B is turned on, three regions of the FD 253B-1, the FD 253B-2, and the additional capacitance unit 260B are in a connection state.

The amplification transistor 257B (its gate portion) included in the tap 251B is formed on the right side of the TG 252B in the drawing. The select transistor 258B (its gate portion) is formed on the upper side of the TG 252B in the drawing. Further, the FBEN 255B is provided in the tap 251B. The FBEN 255B is formed on the upper side of the reset transistor 254B in the drawing.

A well contact 265 is provided on the upper side of the PD 261. A discharge transistor (OFG) 256 (its gate portion) is provided on the lower side of the PD 261. The discharge transistor 256 is an overflow gate for blooming prevention and is shared between the taps 251A and 251B. As illustrated in FIG. 10, one OFD 256 is formed in the pixel 250b.

The layout illustrated in FIG. 10 and the subsequent drawings is exemplary and does not mean limited description. In the examples given in FIG. 10 and the subsequent drawings, the configuration in which the discharge transistor 256 is provided has been described, but a configuration in which the discharge transistor 256 is not provided can also be used.

In the example illustrated in FIG. 10, each unit included in the tap 251A and each unit included in the tap 251B are linearly symmetric with respect to a central line L1 (a line L1 indicated by a dotted line in the drawing) of the pixel 250b.

That is, the TG 252A, the FD 253A-1, the FD 253A-2, the reset transistor 254A, the FBEN 255A, the amplification transistor 257A, the select transistor 258A, the FDG 259A, and the additional capacitance unit 260A included in the tap 251A are linearly symmetric to the TG 252B, the FD 253B-1, the FD 253B-2, the reset transistor 254B, the FBEN 255B, the amplification transistor 257B, the select transistor 258B, the FDG 259B, and the additional capacitance unit 260B included in the tap 251B, respectively.

In FIG. 10, wirings are not illustrated, but the FD 253A-1 and the amplification transistor 257A are connected and a signal amount from the FD 253A-1 is supplied to the amplification transistor 257A. The FD 253B-1 and the amplification transistor 257B are connected and a signal amount from the FD 253B-1 is supplied to the amplification transistor 257B.

As described above, in the linear symmetric configuration, a length of a wiring between the FD 253A-1 and the amplification transistor 257A can be substantially the same as a length of a wiring between the FD 253B-1 and the amplification transistor 257B. The other wirings have the same lengths by the wirings of the bilaterally symmetric targets.

Exemplary Cross-Sectional Configuration of Pixel

Figure 11:
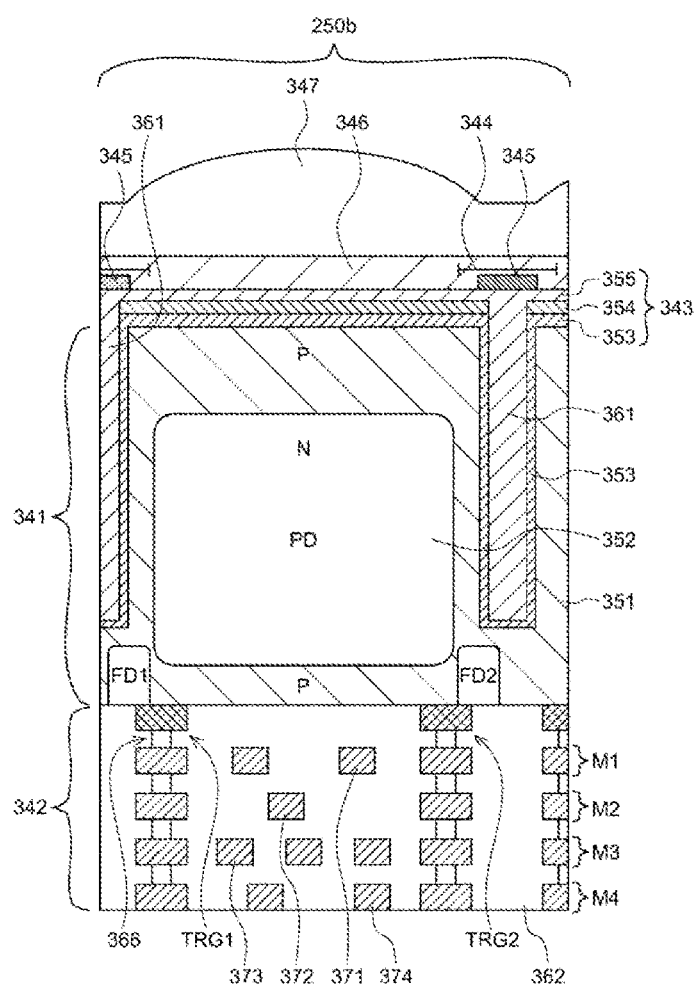
FIG. 11 is a diagram illustrating an exemplary cross-sectional configuration of the pixel.

FIG. 11 is a diagram illustrating an exemplary cross-sectional configuration of the pixel 250b including two taps 251 illustrated in FIGS. 7 and 10.

The pixel 250b includes a semiconductor substrate 341 and a multilayer wiring layer 342 formed on the surface side (he lower side in the drawing).

The semiconductor substrate 341 is formed of, for example, silicon (Si) and is formed with a thickness of, for example, about a few μm. In the semiconductor substrate 341, for example, an N-type (second conductive type) semiconductor region 352 is formed in unis of pixels in a P-type (first conductive type) semiconductor region 351, and the photodiode 261 is formed in units of pixels. The P-type semiconductor region 351 provided on the front and rear surfaces of the semiconductor substrate 341 serves as a hole or charge accumulation region for inhibiting a dark current.

In FIG. 11, the upper surface of the semiconductor substrate 341 which is an upper side is the rear surface of the semiconductor substrate 341 and is a light incident surface on which light is incident. An antireflection film 343 is formed on the upper surface of the semiconductor substrate 341 on the rear surface side.

The antireflection film 343 has a stacked structure in which a fixed charge film and an oxide film are stacked. An insulating thin film with a high dielectric constant (High-k) in conformity with, for example, an atomic layer deposition (ALD) method can be used. Specifically, a hafnium oxide ($HfO_2$), an aluminum oxide ($Al_2O_3$), a titanium oxide ($TiO_2$), a strontium titan oxide (STO), or the like can be used. In the example of FIG. 11, the antireflection film 343 is configured by stacking a hafnium oxide film 353, an aluminum oxide film 354, and a silicon oxide film 355.

In a boundary 344 of the pixel 250b which is the upper surface of the antireflection film 343 and is adjacent to the semiconductor substrate 341 (hereinafter also referred to as a pixel boundary 344), an inter-pixel light shielding film 345 that prevents incidence of incident light on an adjacent pixel is formed. A material of the inter-pixel light shielding film 345 may be a material that shields light. For example, a metal material such as tungsten (W), aluminum (Al), or copper (Cu) can be used.

On the upper surface of the antireflection film 343 and the upper surface of the inter-pixel light shielding film 345, for example, a flattened film 346 is formed of an insulating film such as a silicon oxide (SiO2), a silicon nitride (SiN), a silicon oxynitride (SiON) or an organic material such as a resin.

An on-chip lens 347 is formed in units of pixels on the upper surface of the flattened film 346. The on-chip lens 347 is formed of, for example, a resin material such as a styrene resin, an acrylic resin, a styrene-acrylic copolymer resin, or a siloxane resin. Light condensed by the on-chip lens 347 is efficiently incident on the PD 261.

In the pixel boundary 344 on the rear surface side of the semiconductor substrate 341, an inter-pixel separation unit 361 separating adjacent pixels from each other is formed from the rear surface side (the side of the on-chip lens 347) of the semiconductor substrate 341 until a predetermined depth in a substrate depth direction. An outer circumferential portion including the bottom surface and the sidewall of the inter-pixel separation unit 361 is covered with the hafnium oxide film 353 which is a part of the antireflection film 343. The inter-pixel separation unit 361 inhibits incident light from passing through the nearby pixels 250b to confine the incident light inside the self-pixels and inhibit leaking of incident light from the adjacent pixels 250b.

In the example of FIG. 11, a silicon oxide film 355 which is a material of the uppermost layer of the antireflection film 343 is buried in a trench (a groove) carved on the rear surface side, and thus the silicon oxide film 355 and the inter-pixel separation unit 361 are simultaneously formed. Therefore, the inter-pixel separation unit 361 and the silicon oxide film 355 which is a part of stacked films serving as the antireflection film 343 are formed of the same material, but may not be formed of the same material. A material with which the film is buried on the rear surface side serving as the inter-pixel separation unit 361 may be, for example, a metal material such as tungsten (W), aluminum (Al), titanium (Ti), or titanium nitride (TiN).

On the other hand, on the front surface side of the semiconductor substrate 341 on which the multilayer wiring layer 342 is formed, two transfer transistors TRG1 and TRG2 are formed with respect to one PD 261 formed in each pixel 250b. For example, the transfer transistor TRG1 corresponds to the TG 252A (see FIG. 10) and the transfer transistor TRG2 corresponds to the TG 252B (see FIG. 10).

On the front surface side of the semiconductor substrate 341, floating diffusion regions FD1 and FD2 serving as charge accumulation units that temporarily retain charges transferred from the PD 261 are formed from high-density N-type semiconductor regions (N-type diffusion regions). For example, the floating diffusion region FD1 corresponds to the FD 253A (the FD 253A-1 or the FD 253A-2 (see FIG. 10) included in the FD 253A) and the floating diffusion region FD2 corresponds to the FD 253B (the FD 253B-1 or the FD 253B-2 (see FIG. 10) included in the FD 253B).

The multilayer wiring layer 342 includes a plurality of wiring layers M and an inter-layer insulating film 362 therebetween. FIG. 11 illustrates an example in which four layers, wiring layers M1 to M4, are configured.

Wirings 371 to 374 are respectively formed in the plurality of wiring layers M of the multilayer wiring layer 342. The wirings 371 to 374 are formed of, for example, metal films such as copper (Cu), aluminum (Al), tungsten (W), titanium (Ti), or titanium nitride (TiN). Here, a wiring disposed in the wiring layer M1 is referred to as the wiring 371, a wiring disposed in the wiring layer M2 is referred to as the wiring 372, a wiring disposed in the wiring layer M3 is referred to as the wiring 373, and a wiring disposed in the wiring layer M4 is referred to as the wiring 374.

The wirings 371 to 374 disposed in the wiring layers M1 to M4 are connected in necessary portions through a via 366 formed in the vertical direction.

As described above, the pixel 250b has a rear surface irradiation type structure in which the semiconductor substrate 341 which is a semiconductor layer is disposed between the on-chip lens 347 and the multilayer wiring layer 342 and incident light is incident on the PD 261 from the rear surface side on which the on-chip lens 347 is formed.

The pixel 250b has a configuration in which two transfer transistors TRG1 and TRG2 are included for the PD 261 provided in each pixel and charges (electrons) generated through photoelectric conversion in the PD 261 can be distributed to the floating diffusion regions FD1 and FD2.

Wiring

As described above, for example, the FD 253A included in the tap 251A is formed in two regions of the FD 253A-1 and the FD 253A-2, and the two regions are connected by wirings. The wirings will be described with reference to FIGS. 12 and 13.

Figure 12:
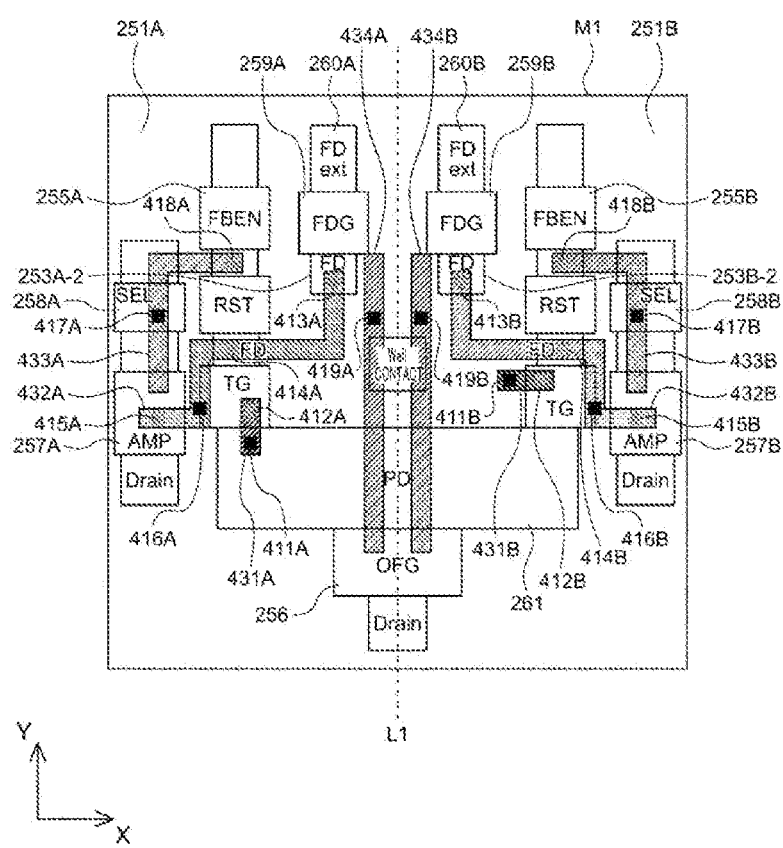
FIG. 12 is a diagram illustrating a layout example of wirings of the pixel.
Figure 13:
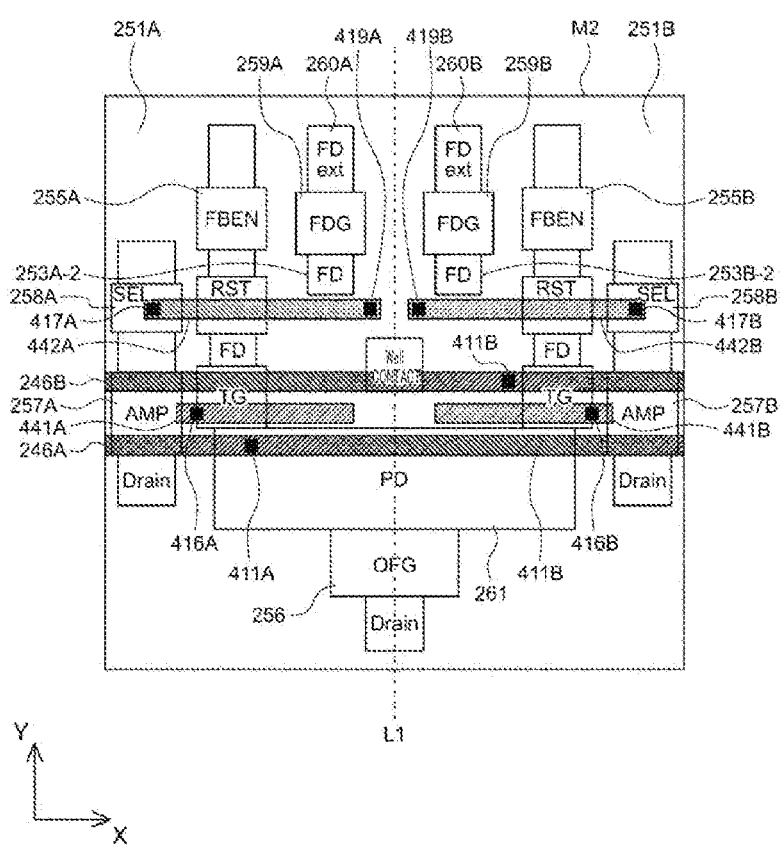
FIG. 13 is a diagram illustrating a layout example of wirings of the pixel.

The wirings are formed in the multilayer wiring layer 342 (see FIG. 11) stacked on the semiconductor substrate 341 in which the PD 261 is formed. FIG. 12 is a diagram illustrating the wiring of the wiring layer M1 added to the plan view of the pixel 250b illustrated in FIG. 10. FIG. 13 is a diagram illustrating the wiring of the wiring layer M2 added to the plan view of the pixel 250b illustrated in FIG. 10.

Referring to FIG. 12, the PD 261 and the TG 252A are connected by a wiring 431A formed in the wiring layer M1. On the lower side of the PD 261 in FIG. 12 which is one end of the wiring 431A, a via 411A connected to the wiring layer M2 is formed. On the lower side of the TG 252A in FIG. 12 which is the other end of the wiring 431A, a contact 412A connecting the TG 251A to the wiring 431A is formed.

In the foregoing description and the following description, connection includes physical connection and also includes connection in which charges or signals can be read despite non-physical connection.

Referring to FIG. 13, the via 411A is connected to the pixel driving line 246A formed in the wiring layer M2. Since the via 411A is connected to the wiring 431A (see FIG. 12) and the wiring 431 is connected to the TG 252A, the pixel driving line 246A is connected to the TG 251A. The pixel driving line 246A is a wiring through which a signal for driving the transfer transistor 252A is transferred.

Referring to FIG. 12, the FD 253A-2, the FD 253A-1, and the AMP 257A are connected by a wiring 432A. In the FD 253A-2, the FD 253A-1, and the AMP 257A, contacts 413A, 414A, and 415A are respectively formed. These contacts are connected to the wiring 432A.

The wiring 432A can also be used as a region that configures the FD 253A. By lengthening a wiring length of the wiring 432A, it is possible to increase capacitance of the FD 253A. Accordingly, as illustrated in FIG. 13, a wiring 441A configuring a part of the FD 253A is formed in the wiring layer M2. The wiring 441A is connected to the wiring 432A by the via 416A.

The via 416A is formed between the TG 252A and the AMP 257A in FIGS. 12 and 13. The wiring 432A is formed in the wiring layer M1 and the wiring 441A is formed in the wiring layer M2 to be connected to the via 416A.

The wiring 441A is formed to increase the capacitance of the FD 253A and is not a wiring for connection, as described above. Therefore, the wiring 441A can be omitted. Here, the example in which the wiring 441A is formed in the wiring layer M2 will be described. However, the wiring 441A may be formed in the wiring layer M3 or the M4 other than the wiring layer M2.

Referring to FIG. 12, the wiring 433A is formed in regions corresponding to the lower side of the SEL 258A and the AMP 257A. The wiring 433A is connected to the via 417A formed in the SEL 258A and the contact 418A formed between the RST 254A and the FBEN 255A (a region corresponding to the drain of the reset transistor 254A).

The wiring 433A is a portion corresponding to the parasitic capacitance C_ST in the circuit diagram illustrated in FIG. 7. By increasing the capacitance of the parasitic capacitance C_ST, it is possible to further reduce KTC noise. Accordingly, as a region corresponding to the parasitic capacitance C_ST, a wiring 434A is provided in the wiring layer M1, as illustrated in FIG. 12, and a wiring 442A is provided in the wiring layer M2, as illustrated in FIG. 13. The portion corresponding to the parasitic capacitance C_ST is configured from the wirings 433A, 434A, and 442A.

The wiring 433A formed in the wiring layer M1 is connected to the via 417A. The wiring 434A formed in the wiring layer M1 is connected to the via 419A. The wiring 442A formed in the wiring layer M2 is connected to the vias 417A and 419A. Accordingly, the wiring 433A, the via 417A, the wiring 442A, the via 419A, and the wiring 434A are formed in a connection state, and thus the parasitic capacitance C_ST is formed.

Referring to FIG. 12, the wiring 434A is formed as a wiring that extends from a region on the right side of the FD 253A-2 in the drawing to the OFD 256 through the lower side of the well contact 265 and the PD 261.

The wirings related to the tap 251A are formed to be linearly symmetric to the wirings related to the tap 251B. The wirings related to the tap 251B will be described with reference to FIGS. 12 and 13.

Referring to FIG. 12, the PD 261 and the TG 252B are connected by a wiring 431B formed in the wiring layer M1. On the lower side of the PD 261 in FIG. 12 which is one end of the wiring 431B, a via 411B connected to the wiring layer M2 is formed. On the lower side of the TG 252B in FIG. 12 which is the other end of the wiring 431B, a contact 412B connecting the TG 251B to the wiring 431B is formed.

Referring to FIG. 13, the via 411B is connected to the pixel driving line 246B formed in the wiring layer M2. Accordingly, the pixel driving line 246B is connected to the TG 251B. The pixel driving line 246B is a wiring through which a signal for driving the transfer transistor 252B is transferred.

Referring to FIG. 12, the FD 253B-1, the FD 253B-2, and the AMP 257B are connected by a wiring 432B. In the FD 253B-1, the FD 253B-2, and the AMP 257B, contacts 413B, 414B, and 415B are respectively formed. These contacts are connected to the wiring 432B.

As illustrated in FIG. 13, a wiring 441B configuring a part of the FD 253B is formed in the wiring layer M2. The wiring 441B is connected to the wiring 432B by the via 416B.

Referring to FIG. 12, the wiring 433B is formed in regions corresponding to the lower side of the SEL 258B and the AMP 257B. The wiring 433B is connected to the via 417B formed in the SEL 258B and the contact 418B formed between the RST 254B and the FBEN 255B (a region corresponding to the drain of the reset transistor 254B).

The wiring 433B formed in the wiring layer M1 is connected to the via 417B. The wiring 434B formed in the wiring layer M1 is connected to the via 419B. The wiring 442B formed in the wiring layer M2 is connected to the via 417B and the via 419B. Accordingly, the wiring 433B, the via 417B, the wiring 442B, the via 419B, and the wiring 434B are formed in a connection state, and thus the parasitic capacitance C_ST is formed.

Referring to FIG. 12, the wiring 434B is formed as a wiring that extends from a region on the right side of the FD 253B-2 in the drawing to the OFD 256 through the lower side of the well contact 265 and the PD 261.

In this way, the wirings related to the tap 251B are formed to be linearly symmetric to the wirings related to the tap 251A.

The transistors, the wirings, and the like included in the tap 251A included in the pixel 250b and the transistors, the wirings, and the like included in the tap 251B included in the pixel 250b are disposed to be linearly symmetric along the central line L1 (see FIG. 10) in the pixel 250b.

Accordingly, the length of the wiring contributing to noise cancellation, for example, the length of the wiring 433, the wiring 434, or the like corresponding to, for example, the parasitic capacitance C_ST, can be inhibited from varying. Accordingly, it is possible to inhibit difference in the performance related to noise reduction between the taps 251A and 251B, and thus it is possible to improve a ranging system.

Exemplary Configuration of Pixel in Third Embodiment

Figure 14:
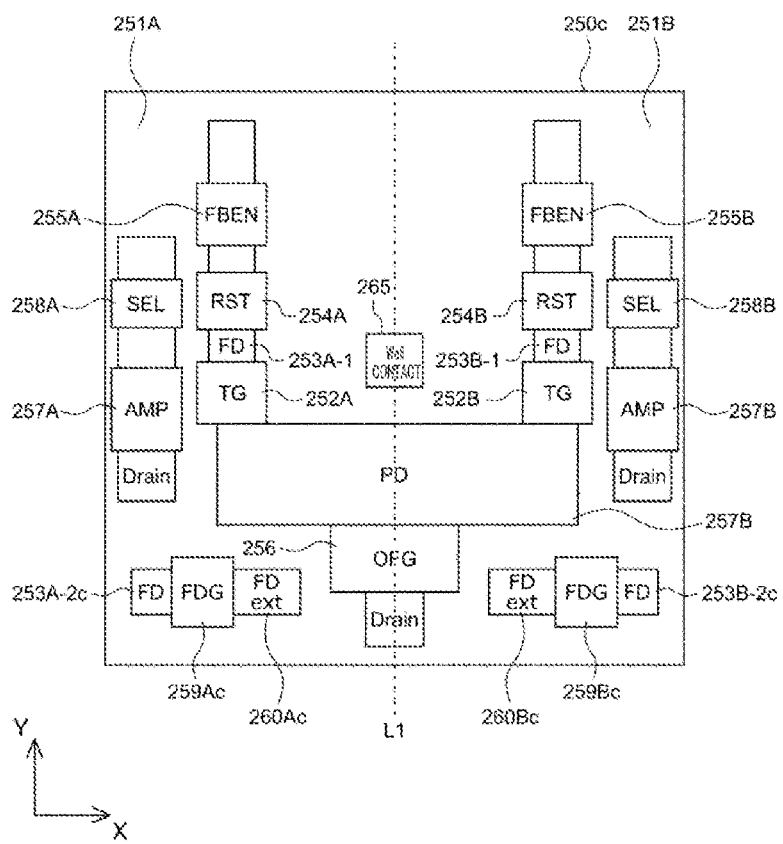
FIG. 14 is a diagram illustrating an exemplary planar configuration of a pixel according to a third embodiment.

A configuration of a pixel 250c according to a third embodiment will be described with reference to FIG. 14. FIG. 14 is a diagram illustrating an exemplary planar configuration of the pixel 250c according to the third embodiment.

An exemplary circuit configuration of the pixel 250c according to the third embodiment is the same as the exemplary circuit configuration of the pixel 250 illustrated in FIG. 7. An exemplary cross-sectional configuration of the pixel 250c according to the third embodiment can be the same as the exemplary cross-sectional configuration of the pixel 250b illustrated in FIG. 11. Here, description of the circuit configuration and the cross-sectional configuration will be omitted.

In the pixel 250c illustrated in FIG. 14, the same reference numerals are given to the same portions as those of the pixel 250b in the second embodiment illustrated in FIG. 10, and description thereof will be appropriately omitted. In comparison between the pixel 250c illustrated in FIG. 14 and the pixel 250b illustrated in FIG. 10, the pixel 250c differs in that an FDG 259Ac and an FDG 259Bc are provided on the lower side of the PD 261 in the drawing.

The FDG 259Ac and the FDG 259Bc are moved to the lower side of the PD 261, and thus an FD 253A-2c connected to the FDG 259Ac and an FD 253B-2c connected to the FDG 259Bc are also disposed on the lower side. Similarly, an additional capacitance unit 260Ac connected to the FDG 259Ac and an additional capacitance unit 260Bc connected to the FDG 259Bc are also disposed on the lower side.

The FD 253A-2c, the FDG 259Ac, and the additional capacitance unit 260Ac are disposed side by side in the drawing. The FD 253B-2c, the FDG 259Bc, and the additional capacitance unit 260Bc are disposed side by side in the drawing. The FD 253A-2c, the FDG 259Ac, and the additional capacitance unit 260Ac and the FD 253B-2c, the FDG 259Bc, and the additional capacitance unit 260Bc are disposed to be linearly symmetric with respect to the central line L1.

In the configuration of the pixel 250c illustrated in FIG. 14, each unit included in the tap 251A and each unit included in the tap 251B are disposed to be linearly symmetric as in the pixel 250b illustrated in FIG. 10.

Although not illustrated, in the pixel 250c illustrated in FIG. 14, the wirings included in the tap 251A and the wirings included in the tap 251B are disposed to be linearly symmetric as in the pixel 250b in the second embodiment.

Accordingly, the transistors, the wirings, and the like included in the tap 251A included in the pixel 250c and the transistors, the wirings, and the like included in the tap 251B included in the pixel 250c can be disposed to be linearly symmetric with respect to the central line L1 (see FIG. 14) in the pixel 250c. Accordingly, for example, it is possible to inhibit a variation in the wiring contributing to noise cancellation, for example, the wiring or the like corresponding to the parasitic capacitance C_ST.

Exemplary Configuration of Pixel in Fourth Embodiment

Figure 15:
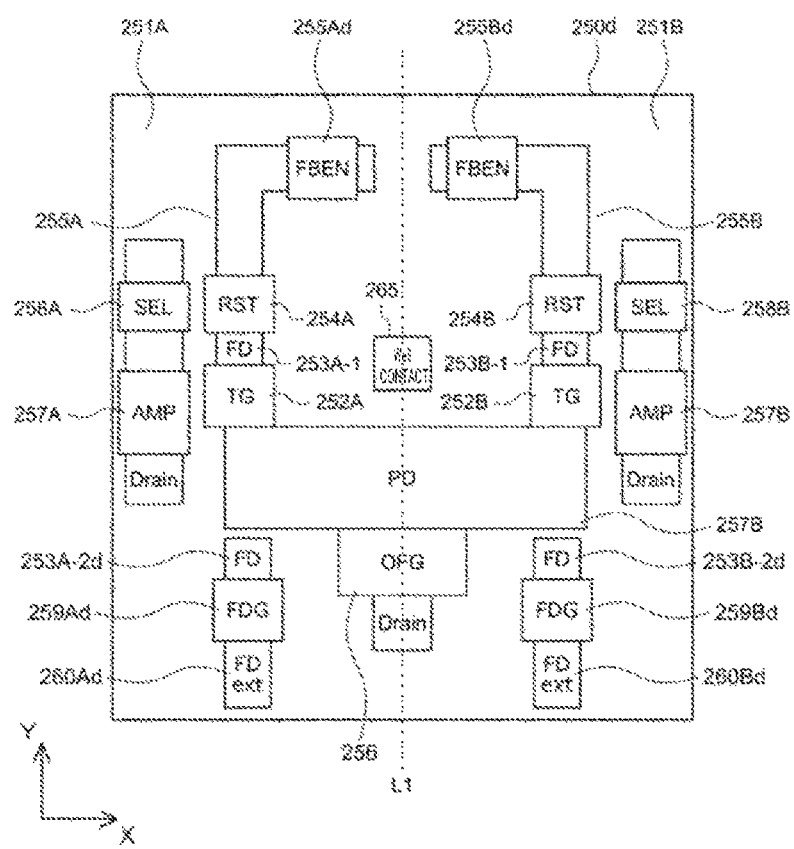
FIG. 15 is a diagram illustrating an exemplary planar configuration of a pixel according to a fourth embodiment.

A configuration of a pixel 250d according to a fourth embodiment will be described with reference to FIG. 15. FIG. 15 is a diagram illustrating an exemplary planar configuration of the pixel 250d according to the fourth embodiment.

An exemplary circuit configuration of the pixel 250d according to the fourth embodiment is the same as the exemplary circuit configuration of the pixel 250 illustrated in FIG. 7. An exemplary cross-sectional configuration of the pixel 250c according to the fourth embodiment can be the same as the exemplary cross-sectional configuration of the pixel 250b illustrated in FIG. 11. Here, description of the circuit configuration and the cross-sectional configuration will be omitted.

In the pixel 250d illustrated in FIG. 15, the same reference numerals are given to the same portions as those of the pixel 250b in the second embodiment illustrated in FIG. 10, and description thereof will be appropriately omitted. In comparison between the pixel 250d illustrated in FIG. 15 and the pixel 250b illustrated in FIG. 10, the pixel 250d differs in that an FDG 259Ad and an FDG 259Bd are provided on the lower side of the PD 261 in the drawing.

When the pixel 250d illustrated in FIG. 15 is compared to the pixel 250c illustrated in FIG. 14, the pixel 250d is the same in that the FDG 259Ad and the FDG 259Bd are provided on the lower side of the PD 261 in the drawing. However, the pixel 250d differs in that an FD 253A-2d, an FDG 259Ad, and an additional capacitance unit 260Ad are disposed in the vertical direction in the drawing and an FD 253B-2d, an FDG 259Bd, and an additional capacitance unit 260Bd are disposed in the vertical direction in the drawing.

Even when the FD 253A-2d, the FDG 259Ad, and the additional capacitance unit 260Ad are disposed in the vertical direction and the FD 253B-2d, the FDG 259Bd, and the additional capacitance unit 260Bd are disposed in the vertical direction, these units are disposed to be linearly symmetric with respect to the central line L1.

In the pixel 250d illustrated in FIG. 15, the position of the FBEN 255 is disposed at a position different from the pixels 250b and 250c. In the pixel 250d, the FDG 259 and the like are disposed on the lower side of the PD 261, and thus the FBEN 255 and the like can be disposed in regions where the FDG 259 and the like are disposed.

FIG. 15 illustrates a case in which the FBEN 255A and the FBEN 255B are disposed on the upper side in the drawing and the FBEN 255A and the FBEN 255B are formed in the horizontal direction. When the position of the FBEN 255Ac is disposed in the middle side and the upper side of the pixel 250d, the position of the RST 254A is shifted on the upper side so that a region between the RST 254A and the TG 252A, that is, a region corresponding to the FD 253A-1, may be widely formed.

In the configuration of the pixel 250d illustrated in FIG. 15, each unit included in the tap 251A and each unit included in the tap 251B are disposed to be linearly symmetric as in the pixel 250b illustrated in FIG. 10.

Although not illustrated, in the pixel 250d illustrated in FIG. 15, the wirings included in the tap 251A and the wirings included in the tap 251B are disposed to be linearly symmetric as in the pixel 250b in the second embodiment.

Accordingly, the transistors, the wirings, and the like included in the tap 251A included in the pixel 250d and the transistors, the wirings, and the like included in the tap 251B included in the pixel 250d can be disposed to be linearly symmetric with respect to the central line L1 (see FIG. 15) in the pixel 250d. Accordingly, for example, it is possible to inhibit a variation in the wiring contributing to noise cancellation, for example, the wiring or the like corresponding to a parasitic capacitance D_ST.

Here, the examples in which the disposition, the sizes, and the like of the transistors in the second to fourth embodiments are changed have been given. However, the disposition and the sizes are exemplary. The present technology can be applied despite disposition and sizes other than the disposition and the sizes given in the examples.

As described above, the pixel to which the present technology is applied can be treated as one FD by distributing and disposing a region serving as a floating diffusion region (FD) in two regions and connecting the two regions. The FD is distributed and disposed in two regions, and thus the degree of disposition can be increased. By distributing and disposing the FD in two regions, it is also possible to form the FD as a region larger than when the FD is provided in one region.

In the above-described embodiment, the case in which the FD 253A is formed in two regions, for example, the FD 253A-1 and the FD 253A-2 in the pixel 250b illustrated in FIG. 10, has been described as an example. However, the FD may be divided and provided in two or more regions.

As described above, the pixel to which the present technology is applied is configured so that the capacitance of the FD can be further increased by providing the additional capacitance unit and the conversion efficiency switching transistor (FDG) switching the capacitance of the FD. By providing a wiring forming a part of the FD even in the stacked wiring layers, it is possible to further increase the capacitance of the FD. From this fact, the pixel to which the present technology is applied can be formed as a pixel in which the capacitance of the FD is increased.

As described above, the pixel to which the present technology is applied has the configuration in which the feedback enable transistor (FBEN) can be provided and the parasitic capacitance C_ST or a parasitic capacitance C_FB can be guaranteed with a wiring. Therefore, it is possible to reduce noise such as KTC noise.

As described above, when the present technology is applied to the pixel with the 2-tap configuration, the transistors or the wirings in the taps are disposed to be linearly symmetric in the pixel. Therefore, it is possible to remove a variation in the length of the wiring. When there is a variation in the length of the wiring, a difference occurs in the capacitance of the wiring, and thus there is a possibility of a problem that noise cannot be appropriately inhibited occurring. However, by applying the present technology, it is possible to reduce the possibility of such a problem occurring.

Fifth Embodiment

In the following description, disposition of the TG 252, the FD 253, the OFD 256, and the PD 261 will be described. Since the other units can be applied to any of the second to fourth embodiments, description thereof will be omitted.

Figure 16:
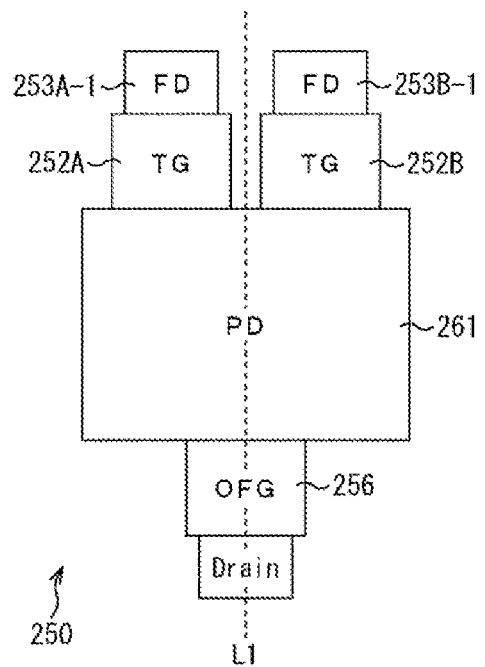
FIG. 16 is a diagram illustrating an exemplary planar configuration of the pixel.

FIG. 16 is a diagram illustrating a disposition example of the TG 252, the FD 253, the OFD 256, and the PD 261 in the pixel 250 according to the second to fourth embodiments. The TG 252A and the TG 252B are provided to be adjacent to one side among four sides of the PD 261. In the example illustrated in FIG. 16, the TG 252A and the TG 252B are disposed side by side in parallel in the X axis direction of the upper side of the PD 261.

The FD 253A-1 is provided on the upper side of the TG 252A and the FD 253B-1 is provided on the upper side of the TG 252B. The OFG 256 is disposed on the opposite side to the side on which the TG 252 of the PD 261 is disposed.

In the example illustrated in FIG. 16, the TG 252A and the FD 253A-1, and the TG 252B and the FD 253B-1 are also disposed to be linearly symmetric with reference to the central line L1 of the pixel 250. When the OFG 256 is disposed on the central line L1 and the OFG 256 is provisionally divided into the right and left sides of the central line L1, the left and right regions are disposed to be linearly symmetric.

In the second to fourth embodiments, as illustrated in FIG. 16, the TG 252, the FD 253, and the OFG 256 are disposed to be linearly symmetric. The disposition and the number of TGs 252, FDs 253, and OFGs 256 may be position and the number thereof other than in the example illustrated in FIG. 16 or may be disposition examples or numbers to be described below.

Figure 17:
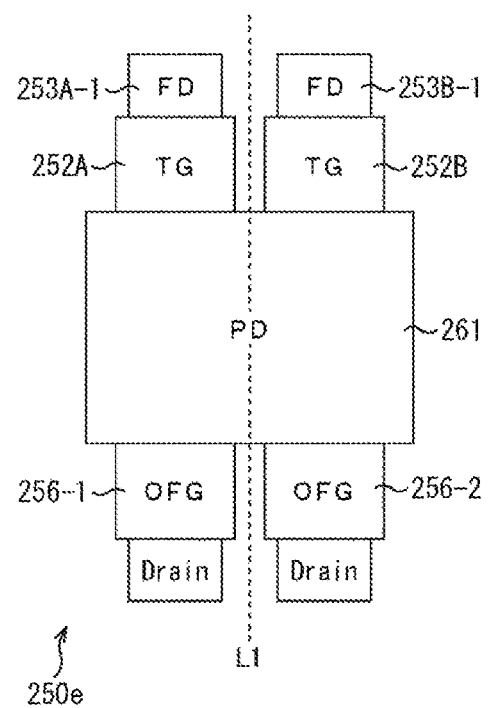
FIG. 17 is a diagram illustrating an exemplary planar configuration of a pixel according to a fifth embodiment.

FIG. 17 is a diagram illustrating an exemplary configuration of a pixel 250e according to a fifth embodiment. In comparison between the pixel 250e illustrated in FIG. 17 and the pixel 250 illustrated in FIG. 16, the pixel 250e illustrated in FIG. 17 differs from the pixel 250 illustrated in FIG. 16 in that two OFDs 256 are provided.

In the pixel 250e illustrated in FIG. 17, the OFD 256-1 and the OFD 256-2 are disposed side by side in the X axis direction of the lower side of the PD 261. The OFD 256-1 and the OFD 256-2 are disposed to be linearly symmetric with respect to the central line L1 of the pixel 250.

In this way, by providing the plurality of OFDs 256, it is possible to improve a discharging capability. As illustrated in FIG. 17, the OFDs 256 are configured to be linearly symmetric with reference to the central line L1 as in the TG 252. Thus, it is possible to further improve symmetry in the pixel 250e and it is possible to improve optical symmetry.

Sixth Embodiment

Figure 18:
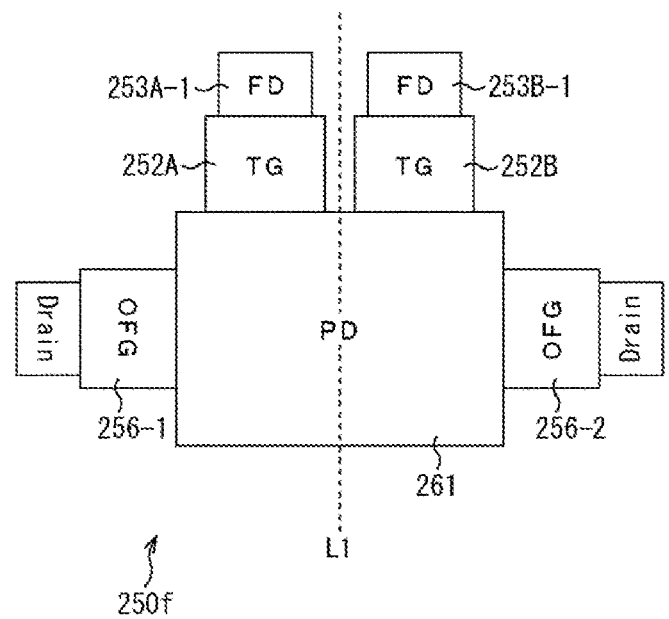
FIG. 18 is a diagram illustrating an exemplary planar configuration of a pixel according to a sixth embodiment.

FIG. 18 is a diagram illustrating an exemplary planar configuration of a pixel 250f according to a sixth embodiment.

In comparison between the pixel 250f illustrated in FIG. 18 and the pixel 250e illustrated in FIG. 17, the pixel 250f illustrated in FIG. 18 is the same in that the two OFDs 256 are provided, but differs in positions at which the OFDs 256 are disposed.

In the pixel 250f illustrated in FIG. 18, the OFD 256-1 is disposed in the left side of the PD 261 and the OFD 256-2 is disposed in the right side of the PD 261. In the pixel 250f, the OFD 256-1 and the OFD 256-2 are disposed on the opposite sides. The OFD 256-1 and the OFD 256-2 are disposed to be linearly symmetric with reference to the central line L1 of the pixel 250f.

In the pixel 250f, the TG 252 and the OFG 256 are not disposed on the opposite sides. The OFG 256 is disposed at a position close to the TG 252. Specifically, the TG 252 and the OFG 256 are disposed at positions at which the TG 252 and the OFG 256 form a right angle. In this way, the TG 252 and the OFG 256 are disposed at positions which are not opposite, and thus charge transfer directions are not opposite. It is possible to implement a configuration in which a difference occurring between a transmission speed at which the charges are transmitted to the TG 252 and a transfer speed at which the charges are transmitted to the OFG 256 is prevented.

Seventh Embodiment

Figure 19:
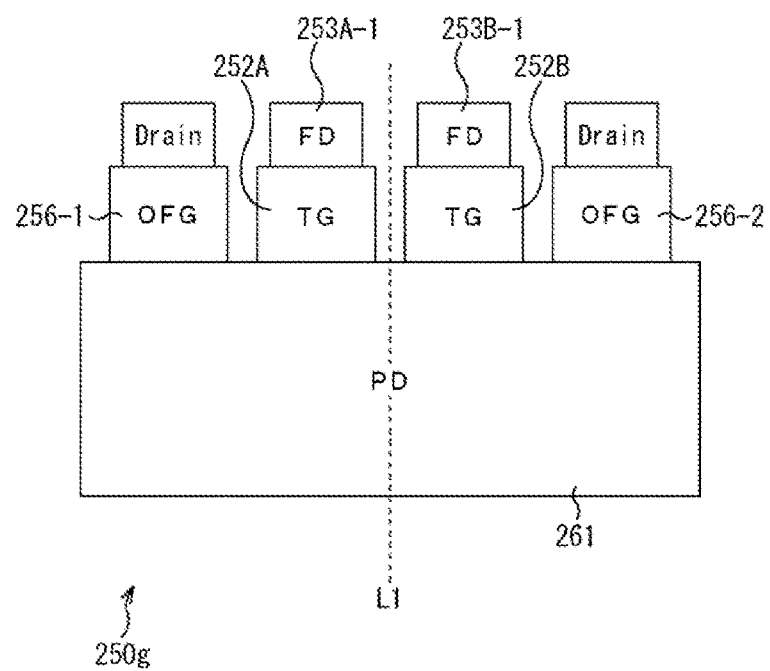
FIG. 19 is a diagram illustrating an exemplary planar configuration of a pixel according to a seventh embodiment.

FIG. 19 is a diagram illustrating an exemplary planar configuration of a pixel 250g according to a seventh embodiment.

In comparison between the pixel 250g illustrated in FIG. 19 and the pixel 250e illustrated in FIG. 17, the pixel 250f illustrated in FIG. 18 is the same in that the two OFDs 256 are provided, but differs in positions at which the OFDs 256 are disposed.

In the pixel 250f illustrated in FIG. 18, the TG 252A, the TG 252B, the OFD 256-1, and the OFD 256-2 are disposed on the upper side of the PD 261. In the pixel 250f, the TG 252A, the FD 253A-1, and the OFG 256-1, and the TG 252B, the FD 253B-1, and the OFG 256-2 are disposed to be linearly symmetric with reference to the central line L1 of the pixel 250g.

In the pixel 250g, the TG 252 and the OFG 256 are disposed in a predetermined one side of the PD 261 and charge transfer directions can be aligned in a direction in which the one side is located. By aligning the charge transfer directions in one direction, for example, it is easy to design a potential gradient as gradient oriented in the direction. A difference occurring between a transmission speed at which the charges are transmitted to the TG 252 and a transfer speed at which the charges are transmitted to the OFG 256 is prevented. Thus, it is possible to improve a charge transfer capability of the TG 252 and it is possible to improve a charge discharge capability of the OFG 256.

Eighth Embodiment

Figure 20:
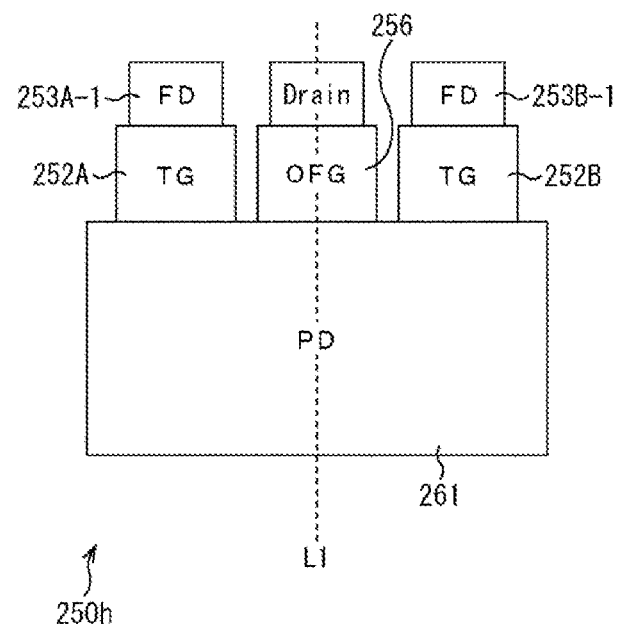
FIG. 20 is a diagram illustrating an exemplary planar configuration of a pixel according to an eighth embodiment.

FIG. 20 is a diagram illustrating an exemplary planar configuration of a pixel 250h according to an eighth embodiment.

In comparison between the pixel 250h illustrated in FIG. 20 and the pixel 250g illustrated in FIG. 19, the pixel 250h is the same in that the TGs 253 and the OFG 256 are disposed in one side of the PD 261, but differs in that the number of OFGs 256 is one.

In the pixel 250h, the TG 252A, the OFG 256, and the TG 252B are disposed in order in the X axis direction of the upper side of the PD 261. The OFG 256 is located on the central line L1 of the pixel 250h, and the TG 252A and the TG 252B are disposed on both sides of the OFG 256.

In the pixel 250g, the TGs 252 and the OFG 256 are disposed in one side. Therefore, as in the pixel 250g (see FIG. 19), it is possible to improve a charge transfer capability of the TG 252 and it is possible to improve a charge discharge capability of the OFG 256.

Ninth Embodiment

Figure 21:
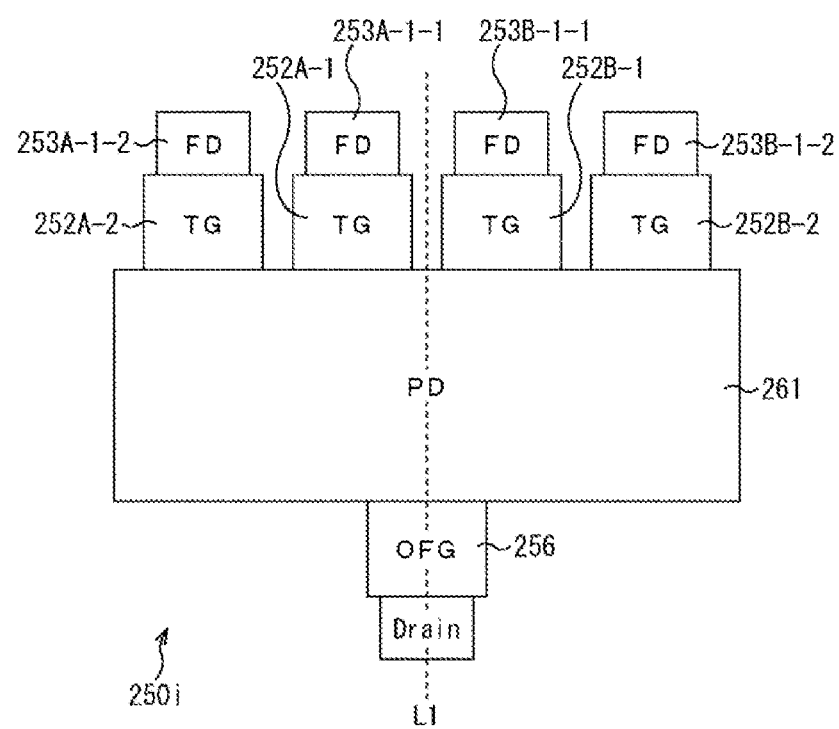
FIG. 21 is a diagram illustrating an exemplary planar configuration of a pixel according to a ninth embodiment.

FIG. 21 is a diagram illustrating an exemplary planar configuration of a pixel 250i according to a ninth embodiment.

The pixel 250 according to the first to eighth embodiments is a pixel that has the 2-tap configuration and the configuration in which two TGs 252 are provided has been described as an example. However, a pixel can have a 4-tap configuration. When the pixel has the 4-tap configuration, as illustrated in FIG. 21, four TGs 252 are provided. In the pixel 250i illustrated in FIG. 21, a TG 252A-2, a TG 252A-1, a TG 252B-1, and a TG 252B-2 are disposed in order from the left in the X axis direction of the upper side of the PD 261.

An FD 253A-1-2 is provided in the TG 252A-2, an FD 253A-1-1 is provided in the TG 252A-1, an FD 253B-1-1 is provided in the TG 252B-1, and an FD 253B-1-2 is provided in the TG 252B-2. One OFG 256 is provided in the middle of the lower side of the PD 261. A configuration in which two OFGs 256 are provided as in the pixel 250e (see FIG. 17) according to the fifth embodiment or a configuration in which four OFGs 256 are provided to match the number of TGs 252 can also be used.

In this way, by disposing four TGs 256, in other words, using the 4-tap configuration, it is possible to obtain four pieces of phase information at a time. For example, it is possible to reduce the number of frames necessary to acquire a ranging image, and it is possible to inhibit a motion blur.

Shape of Gate in Plain View

Figure 22:
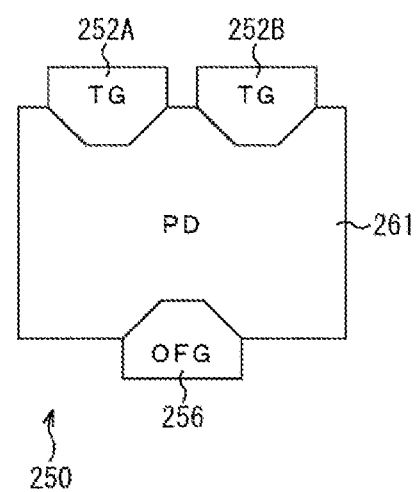
FIG. 22 is a diagram illustrating a shape of a gate.

FIG. 22 is a diagram illustrating a shape of a gate in a plan view.

In the first to ninth embodiments, the TG 252 or the OFG 256 in which the shape of the gate is rectangular has been described. However, a shape other than a rectangle may be used. FIG. 22 illustrates an example of a configuration in which the shape of the gate is a gate that has a shape other than a rectangle in the configuration of the pixel 250 illustrated in FIG. 16.

In FIG. 22, the TG 252A, the TG 252B, and the OFG 256 are each hexagonal. In other words, corners of the rectangular gate are cut off in the shape. In this way, by cutting off the corners in the shape of the gate, it is possible to reduce gate capacitance and it is possible to improve a transfer capability.

The TG 252A, the TG 252B, and the OFG 256 illustrated in FIG. 22 are disposed at positions straddling over the PD 261. In this way, a part of the gate in a plan view can be configured to be formed on the PD 261.

Figure 23:
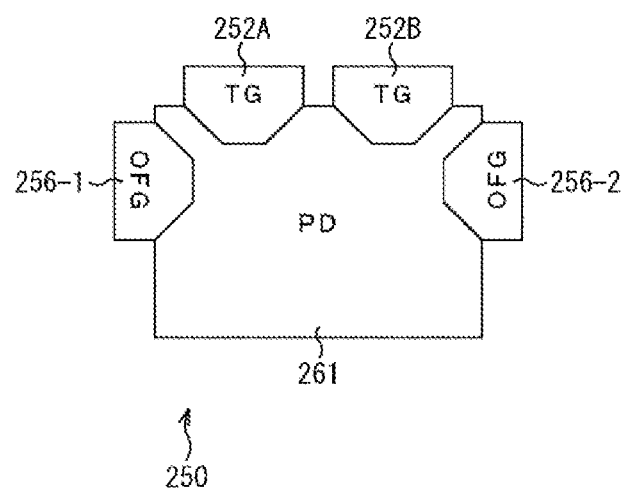
FIG. 23 is a diagram illustrating the shape of the gate.

FIG. 23 illustrates an example of a configuration in which the shape of the gate is a gate that has a shape other than a rectangle in the configuration of the pixel 250f illustrated in FIG. 18. As illustrated in FIG. 23, the shape of the gate can be set as a shape in which corners are cut off, and thus portions in which the corners are cut off can be close to each other. As illustrated in FIG. 23, orthogonal gates of the TG 252A and the OFG 256-1, and the TG 252B and the OFG 256-2 can be close to each other, and thus the degree of freedom of a layout of the TG 252 or the OFG 256 or layouts of other gates can be increased.

By closely disposing the TG 252 and the OFG 256, as described with reference to pixel 250f in FIG. 18, the charge transfer directions can be aligned in one direction. It is possible to improve a charge transfer capability of the TG 252 and it is possible to improve a charge discharge capability of the OFG 256.

Shape of Gate in Cross-Sectional View

Next, a shape of the gate in the cross-sectional view will be additionally described.

Figure 24:
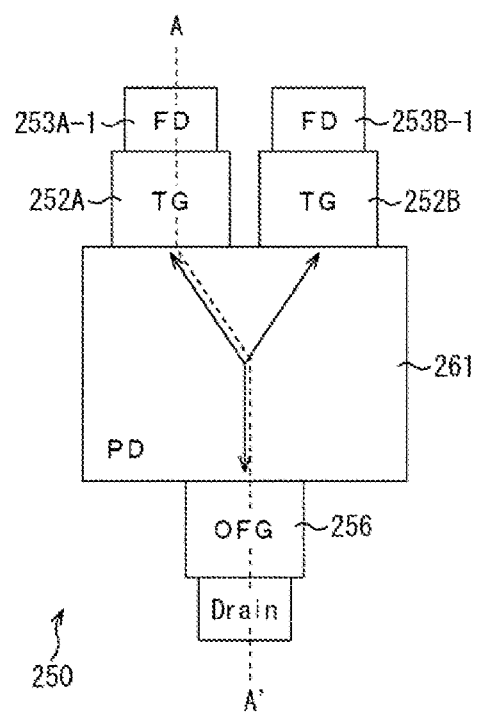
FIG. 24 is a diagram illustrating a transfer direction of charges.
Figure 25:
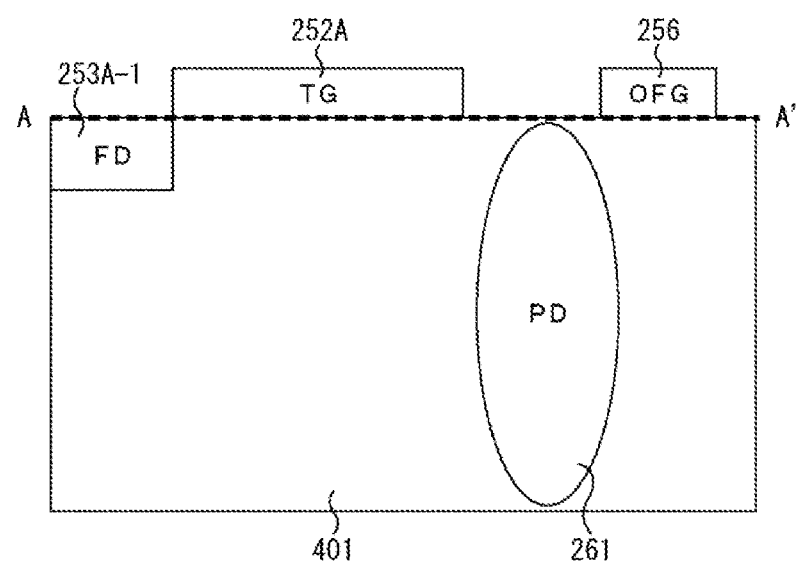
FIG. 25 is a diagram illustrating an exemplary cross-sectional configuration of the pixel.

FIG. 24 is a diagram illustrating the pixel 250 illustrated in FIG. 16 in a plan view again. FIG. 25 is a diagram illustrating a cross-sectional configuration taken along the line A-A' in the plan view of the pixel 250 illustrated in FIG. 24.

As illustrated in FIG. 25, the PD 261 is provided in a Pwell region 401 formed from a silicon (Si) substrate. The PD 261 has a structure in which, for example, an N-type impurity layer (a charge accumulation layer) is formed and a high-density P-type impurity layer which is a depletion prevention layer (a pinning layer) is formed above the N-type impurity layer.

On the left side of the PD 261 in the drawing, the FD 253A-1 that accumulates charges generated in the PD 61 is provided. In FIG. 25, the TG 252A is provided between the PD 261 and the FD 253A-1. On the right side in the drawing, on the other hand, the OFD 256 is provided.

Referring to FIG. 24, the charges generated in the PD 261 are distributed to the TG 252A included in the tap 251A and the TG 252B included in the tap 251B at a timing at which the TG 252A or the TG 252B is turned on or off. The charges can also be discharged by the OFG 256 for discharging. That is, the charges generated in the PD 261 are distributed in one of three different directions at a timing at which the gate is turned on or off.

For example, when all the charges located between the TG 252A and the TG 252B do not enter the TG 252A and enter the opposite TG 252B at the time of turning on the TG 252A, there is a possibility of a contrast between active and inactive tap (Cmod) deteriorating or a depth non uniformity (DNU) occurring.

The TG 252 may be a vertical gate transistor. By using the vertical gate transistor, it is possible to increase potential modulation in the Pwell region 401 formed from a silicon (Si) substrate, and thus it is possible to improve the charge distribution capability to the TG 252A and the TG 252B.

With the configuration in which the OFD 256 is added, a reset capability of the PD 261 can be added. Thus, it is possible to inhibit the charges remaining due to transfer failure or the like in the PD 261 from being detected as a signal component through the TG 252A or the TG 252B. From this, it is possible to improve charge separation efficiency and it is possible to improve ranging accuracy.

Hereinafter, a case in which the TG 252 and the OFG 256 are vertical gate transistors will be additionally described. In the following embodiments, combinations of the first to ninth embodiments can be applied.

Tenth Embodiment

Figure 26:
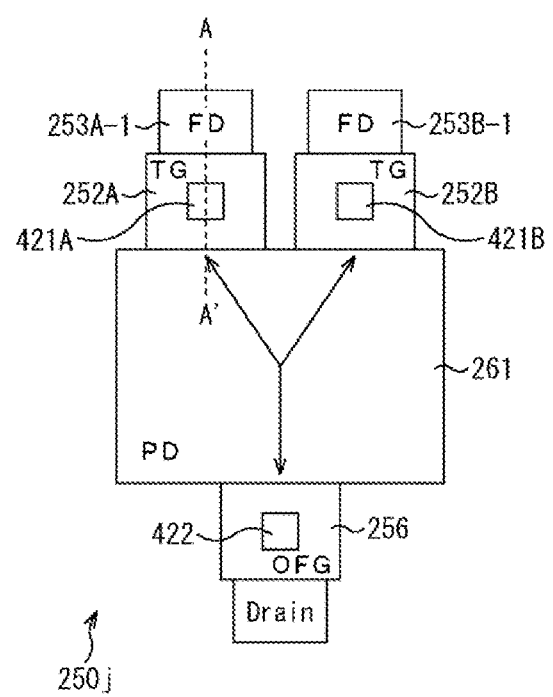
FIG. 26 is a diagram illustrating an exemplary planar configuration of a pixel according to a tenth embodiment.
Figure 27:
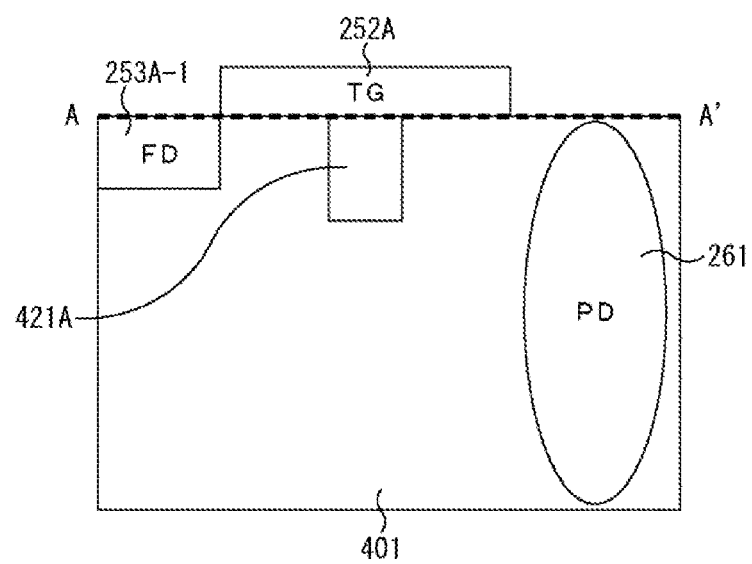
FIG. 27 is a diagram illustrating an exemplary cross-sectional configuration of the pixel according to the tenth embodiment.

FIG. 26 is a plan view illustrating an exemplary configuration of a pixel 250*j* according to a tenth embodiment. FIG. 27 is a cross-sectional view illustrating a cross-sectional configuration taken along the line A-A' in the plan view of the pixel 250*j* in FIG. 26.

The pixel 250*j* illustrated in FIG. 26 includes a vertical gate unit 421A in the TG 252A, includes a vertical gate unit 421B in the TG 252B, and includes a vertical gate unit 422 in the OFG 256.

Referring to the cross-sectional view of FIG. 27, the TG 252A includes the vertical gate unit 421A. The vertical gate unit 421A is a portion formed as a transfer gate in which a vertical transistor trench is opened and charges are read from the PD 261. The TG 252A is a transfer gate electrode in which a planar gate electrode and a vertical gate electrode are integrated. The vertical gate electrode is referred to as the vertical gate unit 421A herein.

Although not illustrated in FIG. 27, the TG 252B includes a planar gate electrode and the vertical gate unit 421B as in the TG 252A. Similarly, the OFG 256 includes a planar gate electrode and the vertical gate unit 422 as in the TG 252A.

In this way, by forming the TG 253 as a vertical transistor that includes the vertical gate unit 421, it is possible to efficiently read the charges from a deep portion of the PD 261. It is possible to transfer the charges generated through photoelectric conversion in the PD 261 distributed at a high speed at a potential gradient by the vertical gate unit 422.

By changing an application voltage to be applied to the gate, it is also possible to control the degree of potential modulation in a bulk easily. This is more efficient than in a case in which impurities are doped and a potential is modulated, and can be easily performed.

For example, when the TG 253 is formed by using modulation of the vertical gate unit 421, alignment deviation of a mask pattern may occur and the planar gate electrodes may be formed in a deviated state. However, the vertical gate unit 421 can become robust without being influenced.

With the configuration in which the OFG 256 is provided, a charge discharge function can be added. Thus, by including the vertical gate unit 422 even in the OFG 256, it is possible to further inhibit the charges remaining in the PD 261 due to a transfer failure than in a case in which the charges are detected as signal component through the TG 252A and the TG 252B. Thus, it is possible to improve the Cmod and it is possible to improve the ranging accuracy.

The configuration of the gate including the vertical gate unit can also be applied to gates of other transistors.

Eleventh Embodiment

Figure 28:
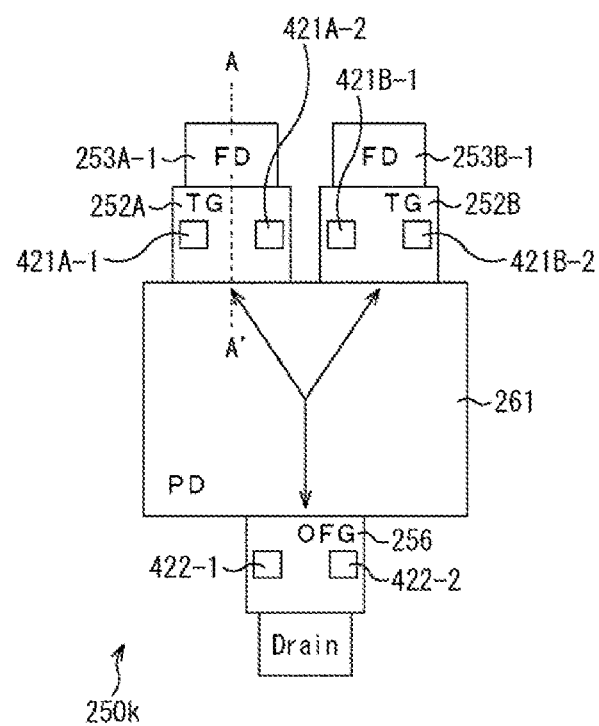
FIG. 28 is a diagram illustrating an exemplary planar configuration of a pixel according to an eleventh embodiment.

FIG. 28 is a plan view illustrating an exemplary configuration of a pixel 250*k* according to an eleventh embodiment. The plurality of vertical gate units may be provided per gate.

FIG. 28 is a diagram illustrating an exemplary configuration of a pixel 250*k* including two vertical gate units per gate. In the TG 252A of the pixel 250*k*, the vertical gate unit 421A-1 and the vertical gate unit 421A-2 are disposed side by side in the left and right directions (the X axis direction) in the drawing. In the TG 252B of the pixel 250*k*, the vertical gate unit 421B-1 and the vertical gate unit 421B-2 are disposed side by side in the left and right directions in the drawing. In the OFG 256 of the pixel 250*k*, the vertical gate unit 422-1 and the vertical gate unit 422-2 are disposed side by side in the left and right directions in the drawing.

In this way, two vertical gate units 421 may be included in one TG 252. The two vertical gate units 421 disposed side by side in the TG 252 may be in the foregoing X axis direction or the Y axis direction (the upward and downward directions in the drawing). The other gates can include two vertical gate units as in the TG 252.

Figure 29:
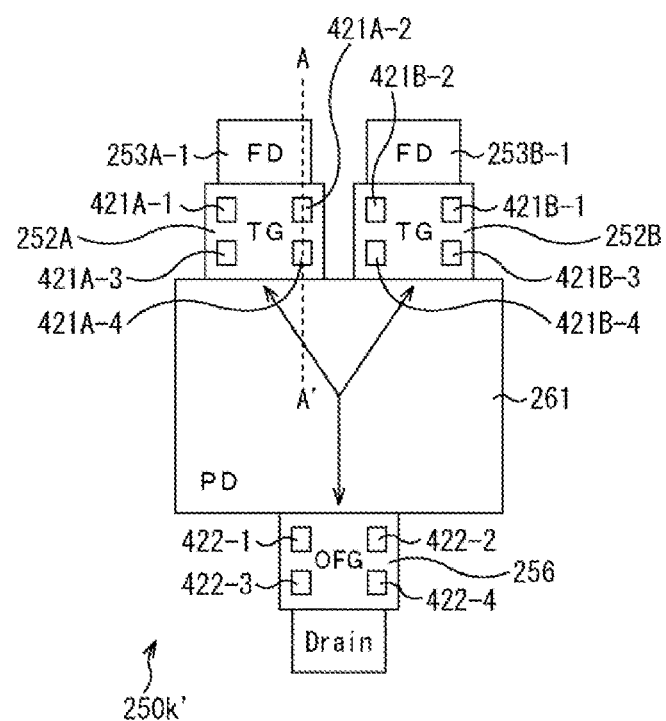
FIG. 29 is a diagram illustrating another exemplary planar configuration of a pixel according to an eleventh embodiment.

As illustrated in FIG. 29, an exemplary configuration of a pixel 250*k'* in which four vertical gate units 421 are included in one TG 252 is illustrated. In the TG 252A of the pixel 250*k*, vertical gate units 421A-1 to 421A-4 are disposed in four corners of the TG 252A. In the TG 252B of the pixel 250*k*, vertical gate units 421B-1 to 421B-4 are disposed in four corners of the TG 252B. In the OFG 256 of the pixel 250*k*, vertical gate units 422-1 to 422-4 are disposed in four corners of the OFG 256.

In this way, four vertical gate units 421 may be included in one TG 252. In the other gates, four vertical gate units can be included as in the TG 252.

Although not illustrated, a plurality of vertical gate units other than two or four vertical gate units can also be included in one gate. When a plurality of vertical gate units are provided in one gate, the disposition of the vertical gate units may be disposition other than the side-by-side disposition in which the vertical gate units are disposed in, for example, four corners of the gate in the foregoing predetermined direction in accordance with the shape of the gate.

By increasing the number of vertical gate units, it is possible to improve advantages of potential modulation.

Figure 30:
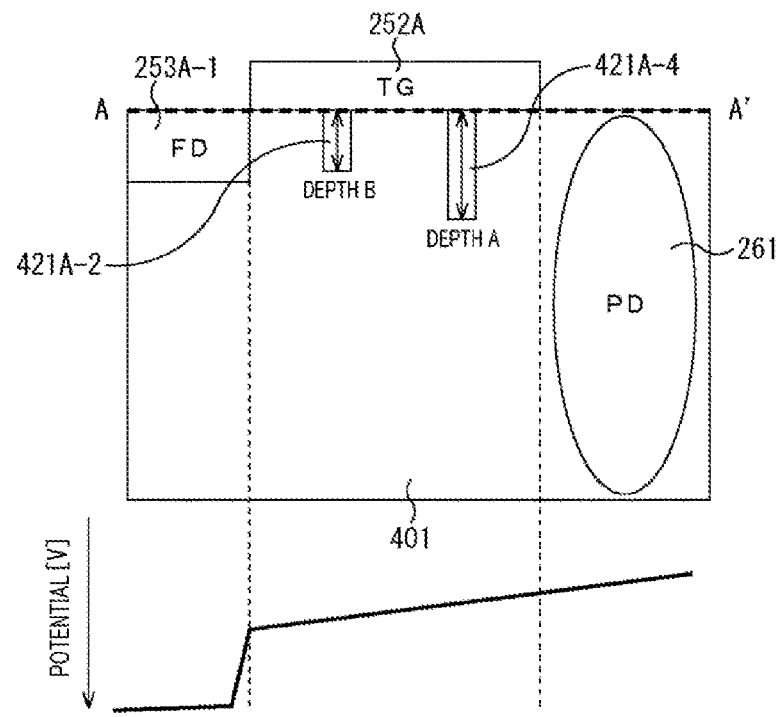
FIG. 30 is a diagram illustrating an exemplary cross-sectional configuration of the pixel according to the eleventh embodiment.

FIG. 30 is a cross-sectional view illustrating a cross-sectional configuration taken along the line A-A' in the plan view of the pixel 250*k'* in FIG. 29. In FIG. 30, of the four vertical gate units 421A-1 to 421A-4 provided in the TG 252A, the vertical gate units 421A-2 and 421A-4 disposed on a straight line (the line A-A') connecting the FD 253A-1 to the PD 261 are illustrated.

The vertical gate units 421 may be formed at the same depth without depending on positions at which the vertical gate units are disposed or may be formed at different depths depending on positions at which the vertical gate units are disposed. When the depths are changed depending on the positions at which the vertical gate units are disposed, as illustrated in FIG. 30, a depth A of the vertical gate unit 421A-4 disposed at a position closest to the PD 261 can be deeper than a depth B of the vertical gate unit 421A-2 disposed at a position more distant from the PD 261.

Figure 31:
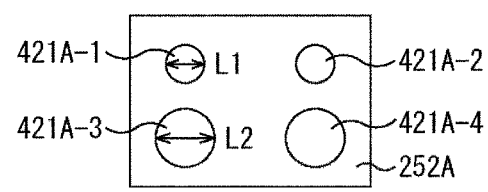
FIG. 31 is a diagram illustrating the size of a diameter when a vertical gate is formed.

In this way, by providing the plurality of vertical gate units 421 and changing the depths depending on the positions at which the vertical gate units are disposed, it is possible to obtain a potential gradient illustrated in the lower drawing of FIG. 30 (it is possible to adjust the depths so that the potential gradient can be obtained). As illustrated in FIG. 31, it is possible to produce a potential gradient in which a potential in the Pwell region 401 is lowered over the FD 253A-1 from the PD 261 by adjusting the depths of the vertical gate units 421A-2 and 421A-4.

When the vertical gate units 421 of which the depths are different are formed, as illustrated in FIG. 31, the vertical gate units 421 can be formed with different diameters at the time of the formation. As illustrated in FIG. 30, when the vertical gate units 421A-3 (421A-4) are formed to be deeper than the vertical gate unit 421A-1 (421A-2), as illustrated in FIG. 31, a diameter L2 of a trench at the time of formation of the vertical gate unit 421A-3 is set to be greater than a diameter L1 of a trench at the time of formation of the vertical gate unit 421A-1.

By setting the diameter L2 of the trench at the time of formation of the vertical gate unit 421A-3>the diameter L1 of the trench at the time of formation of the vertical gate unit 421A-1, it is possible to change an amount of carving in the same processing, performing the carving until the position at which the diameter is larger, and forming the vertical gate units 421 at the different depths.

In this way, by forming the plurality of vertical gate units 421 and causing the depths of the vertical gate units 421 to be different, it is possible to form a desired potential gradient and it is possible to improve charge transfer efficiency.

Twelfth Embodiment

Figure 32:
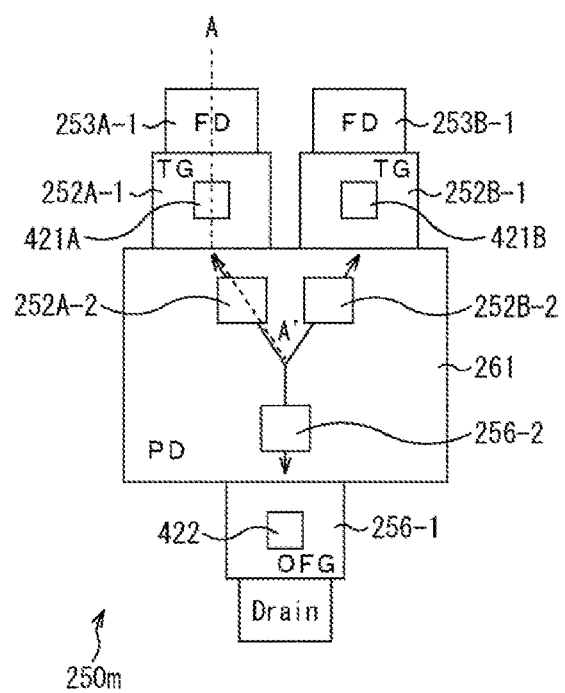
FIG. 32 is a diagram illustrating an exemplary planar configuration of a pixel according to the eleventh embodiment.
Figure 33:
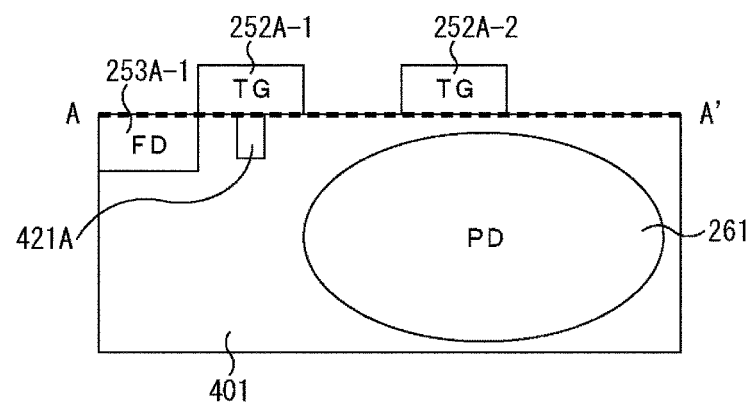
FIG. 33 is a diagram illustrating an exemplary cross-sectional configuration of the pixel according to the eleventh embodiment.

FIG. 32 is a plan view illustrating an exemplary configuration of a pixel 250m according to a twelfth embodiment. FIG. 33 is a cross-sectional view illustrating a cross-sectional configuration taken along the line A-A' in the plan view of the pixel 250m in FIG. 32.

The pixel 250m illustrated in FIG. 32 has a configuration in which the TG 252A-2, the TG 252B-2, and an OFG 256-2 are added to the pixel 250j illustrated in FIG. 26.

The pixel 250m illustrated in FIGS. 32 and 33 includes the TG 252A-1 and the TG 252B-1 on one side of the PD 261 and includes the TG 252A-2 and the TG 252B-2 on the PD 261. The TG 252A-1 and the TG 252A-2 are gates of the transfer transistors included in the tap 251A, and the TG 252B-1 and the TG 252B-2 are gates of transfer transistors included in the tap 251B.

As illustrated in FIG. 33, the TG 252A-1 is disposed between the PD 261 and the FD 253A-1, and the TG 252A-2 is disposed on the PD 261. The TG 252A-2 is disposed at a position superposing the PD 261 in a plan view. The TG 252B-1 and the TG 252B-2 are disposed with a similar positional relation to the TG 252A-1 and the TG 252A-2.

In this way, by providing the TG 252A-2 in a path in which the charges of the PD 261 and the TG 252A-1 are transferred, it is possible to slope a potential gradient to the vicinity of the middle of the pixel 250m and it is possible to improve the charge transfer capability. By configuring the TGs 252B similarly, it is possible to improve the charge transfer capability. By improving the charge transfer capability in both the TG 252A and the TG 252B, it is possible to also improve a charge distribution capability.

By configuring the other gates, for example, the OFG 256, similarly to the TG 252, it is possible to improve the charge discharging capability.

Here, the example in which the TG 252 is configured from the TG 252-1 and the TG 252-2 has been described, but the number of TGs 252-2 disposed on the PD 261 may be plural other than one.

When the TG 252A is configured with two gates of the TG 252A-1 and the TG 252B-2, driving in which the TG 252A-1 and the TG 252B-2 are simultaneously turned on by simultaneously applying a driving voltage may be performed. When the driving in which the TG 252A-1 and the TG 252B-2 are simultaneously turned on is performed, the same voltage may be applied or different voltages may be applied to the TG 252A-1 and the TG 252B-2.

When different voltages are applied, for example, the voltage applied to the TG 25252A-1 may be controlled such that the voltage is greater than a voltage applied to the TG 252A-2.

Driving in which a driving voltage is applied to the TG 252A-1 and the TG 252B-2 at different timings so that ON timings are shifted may be performed. For example, the TG 252A-2 may be driven and the TG 252B-1 may subsequently be driven while the driving state of the TG 252A-2 is maintained. After the TG 252A-2 is driven and the TG 252A-2 is turned off, the TG 252B-1 may be driven.

Figure 34:
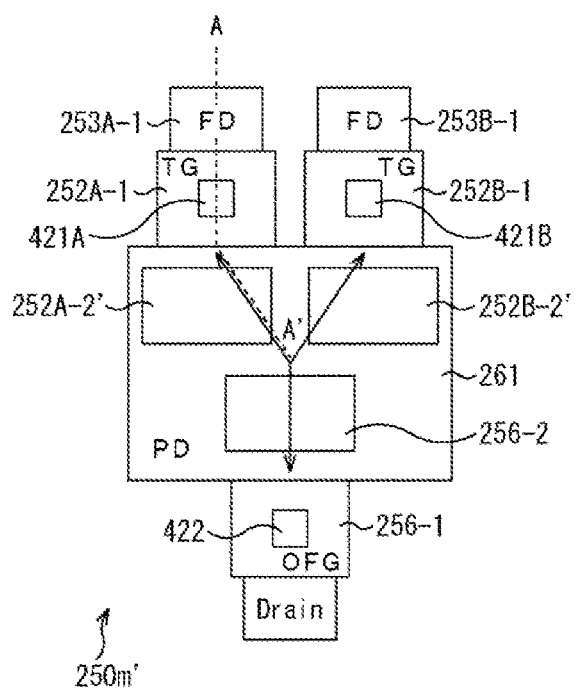
FIG. 34 is a diagram illustrating another exemplary planar configuration of a pixel according to the eleventh embodiment.

The TG 252A-2 or the TG 252B-2 may be formed to be larger than the sizes illustrated in FIGS. 32 and 33. FIGS. 33 and 34 illustrates an exemplary configuration of the pixel 250m when the TG 252A-2 or the TG 252B-2 is set to be large.

Figure 35:
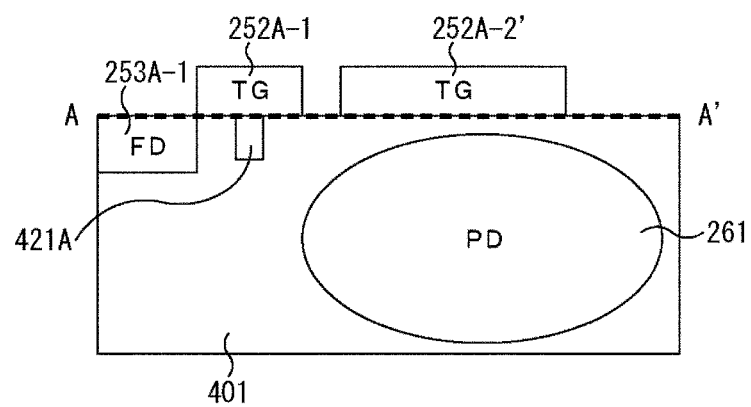
FIG. 35 is a diagram illustrating another exemplary cross-sectional configuration of the pixel according to the eleventh embodiment.

FIG. 34 is a plan view illustrating another exemplary configuration of a pixel 250m (referred to as a pixel 250m') according to the twelfth embodiment. FIG. 35 is a cross-sectional view illustrating a cross-sectional configuration taken along the line A-A' in the plan view of the pixel 250m' in FIG. 34.

Referring to FIG. 34, a TG 252A-2', a TG 252B-2', an OFG 256-2' disposed on the PD 261 are each formed with sizes in which the area of the PD 261 is divided into three in a plan view. Referring to FIG. 35, the TG 252A-2' is formed on the PD 261 to be larger than the TG 252A-1.

In this way, the size of the TG 252-2' may be substantially the same as the size of the TG 252-1 as in the example illustrated in FIGS. 32 and 33 or may be larger than that of the TG 252-1 as in the example illustrated in FIGS. 34 and 35.

Thirteenth Embodiment

Figure 36:
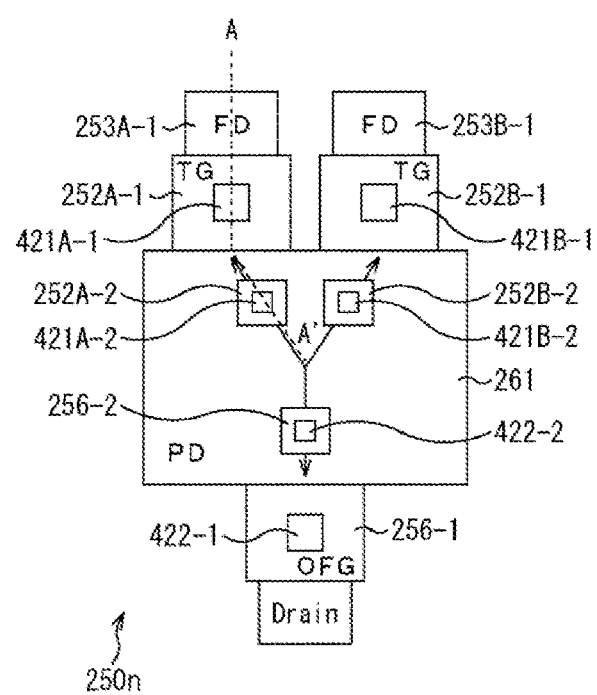
FIG. 36 is a diagram illustrating an exemplary planar configuration of a pixel according to a twelfth embodiment.
Figure 37A:
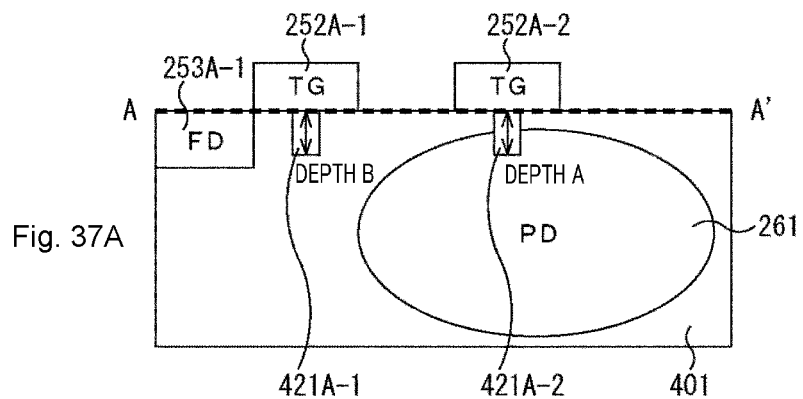
FIGS. 37A and 37B are diagrams illustrating an exemplary cross-sectional configuration of the pixel according to the twelfth embodiment.
Figure 37B:
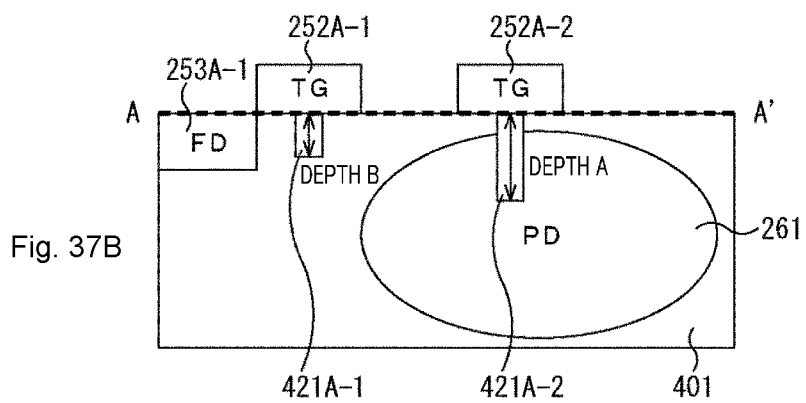

FIG. 36 is a plan view illustrating an exemplary configuration of a pixel 250n according to a thirteenth embodiment. FIGS. 37A and 37B are cross-sectional views illustrating a cross-sectional configuration taken along the line A-A' in the plan view of the pixel 250n in FIG. 36.

The pixel 250n illustrated in FIG. 36 differs in that each of the TG 252A-2, the TG 252B-2, and the OFG 256-2 of the pixel 250m illustrated in FIG. 32 is configured as a vertical gate transistor, and the other configuration is similar.

The vertical gate unit 421A-2 is provided in the TG 252A-2, the vertical gate unit 421B-2 is provided in the TG 252B-2, and the vertical gate unit 422-2 is provided in the OFG 256-2.

When both the TG 252-1 and the TG 252-2 are the vertical gate units 421, the depths may be the same, as illustrated in FIG. 37A, and the depths may be different, as illustrated in FIG. 37B.

In the example illustrated in FIG. 37A, the depth B of the vertical gate unit 421A-1 of the TG 252A-1 may be the same as the depth A of the vertical gate unit 421A-2 of the TG 252A-2.

In the example illustrated in FIG. 37B, the depth B of the vertical gate 421A-1 of the TG 252A-1 may be different from the depth A of the vertical gate unit 421A-2 of the TG 252A-2. FIG. 37B illustrates a case in which the depth B of the vertical gate unit 421A-1 is shallower than the depth A of the vertical gate unit 421A-2. However, the depth B of the vertical gate unit 421A-1 may be deeper than the depth A of the vertical gate unit 421A-2.

In this way, by forming the TG 252-2 formed on the PD 261 as the vertical gate transfer including the vertical gate unit 421, it is possible to form a desired potential gradient and improve the charge transfer efficiency.

Fourteenth Embodiment

Figure 38:
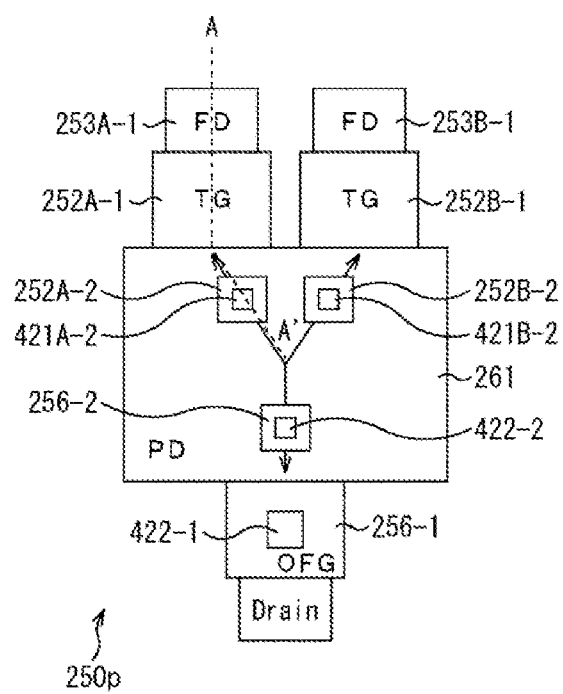
Figure 39:
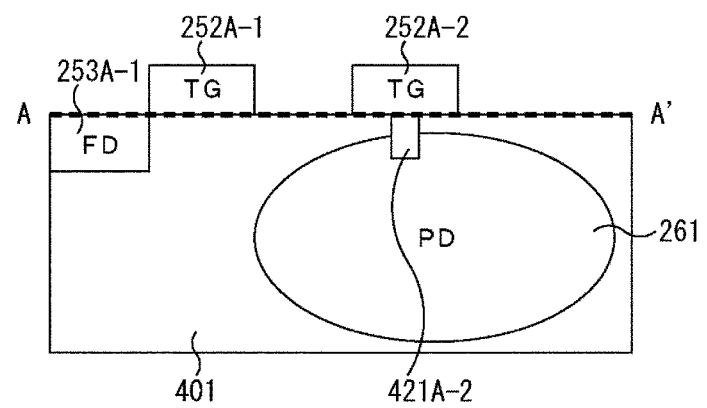

FIG. 38 is a plan view illustrating an exemplary configuration of the pixel 250p according to a fourteenth embodiment. FIG. 39 is a cross-sectional view illustrating a cross-sectional configuration taken along the line A-A' in the plan view of the pixel 250p in FIG. 38.

The pixel 250p illustrated in FIGS. 38 and 39 is different in that each of the TG 252A-1, the TG 252B-1, and the OFG 256-1 of the pixel 250n illustrated in FIG. 36 is not the vertical gate, in other words, a horizontal gate, and the other configuration is the same.

In the pixel 250p illustrated in FIG. 38, the TG 252A-1 is a horizontal gate which does not include the vertical gate unit. Similarly, the TG 252B-1 is a horizontal gate which does not include the vertical gate. The OFG 256-1 is a horizontal gate which does not include the vertical gate unit.

In this way, for example, one of the TG 252A-1 and the TG 252A-2 included in the tap 251A may be configured as the vertical gate and the other may be configured as the horizontal gate.

By configuring the TG 252A-2 as the vertical gate, as illustrated in FIG. 39, it is possible to form the gate at a position close to the PD 261 in a depth direction and it is possible to improve the transfer capability. Accordingly, in the pixel 250p, it is also possible to improve the charge transfer efficiency.

One of the foregoing first to ninth embodiment and one of the tenth to fourteenth embodiments may be combined. That is, in the pixel 250 according to one of the first to ninth embodiments, the gates included in the pixel 250 can be set as the vertical gates.

Application to Electronic Device

The present technology is not limited to application to an image sensor. That is, the present technology can be applied to a general electronic device in which an image sensor is used in an image capturing unit (a photoelectric conversion unit), such as an imaging device such as a digital still camera or a video camera, a portable terminal device that has an imaging function, or a copy machine in which an image sensor is used in an image reading unit. The image sensor may be formed as a one-chip or may be formed as a module in which an imaging unit and a signal processing unit or an optical system are collectively packaged and which has an imaging function.

Figure 40:
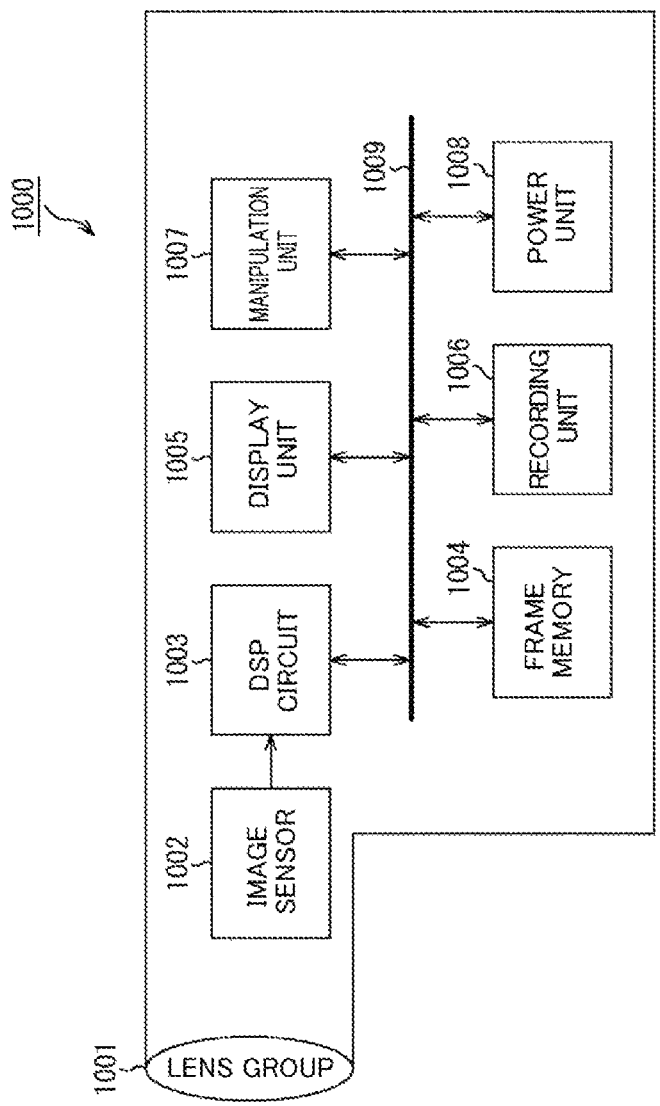

FIG. 40 is a block diagram illustrating an exemplary configuration of an imaging device which is an electronic device to which the present technology is applied.

An image sensor 1000 in FIG. 40 includes an optical unit 1001 formed of a lens group, an image sensor (an imaging device) 1002 in which the configuration of the imaging device 10 in FIG. 1, and a digital signal processor (DSP) circuit 1003 which is a camera signal processing circuit. The image sensor 1000 includes a frame memory 1004, a display unit 1005, a recording unit 1006, a manipulation unit 1007, a power unit 1008. The DSP circuit 1003, the frame memory 1004, the display unit 1005, the recording unit 1006, the manipulation unit 1007, and the power unit 1008 are connected to each other through a bus line 1009.

The optical unit 1001 captures incident light (image light) from a subject and forms an image on an imaging surface of the image sensor 1002. The image sensor 1002 converts an amount of incident light formed on the imaging surface by the optical unit 1001 into an electrical signal in units of pixels and outputs the electrical signal as a pixel signal. The imaging device 1 in FIG. 1 can be used as the image sensor 1002.

The display unit 1005 is configured as, for example, a thin display such as a liquid crystal display (LCD) or an organic electro luminescence (EL) display and displays a moving image or a still image captured by the image sensor 1002. The recording unit 1006 records the moving image or the still image captured by the image sensor 1002 on a recording medium such as a hard disk or a semiconductor memory.

The manipulation unit 1007 gives manipulation instructions of various functions of the image sensor 1000 when a user performs a manipulation. The power unit 1008 appropriately supplies various types of power serving as operation power sources of the DSP circuit 1003, the frame memory 1004, the display unit 1005, the recording unit 1006, and the manipulation unit 1007 to supply targets.

Application to Endoscope Surgery System

The technology according to the present disclosure can be applied (the present technology) to various products. For example, the technology according to the present disclosure may be applied to an endoscope surgery system.

Figure 41:
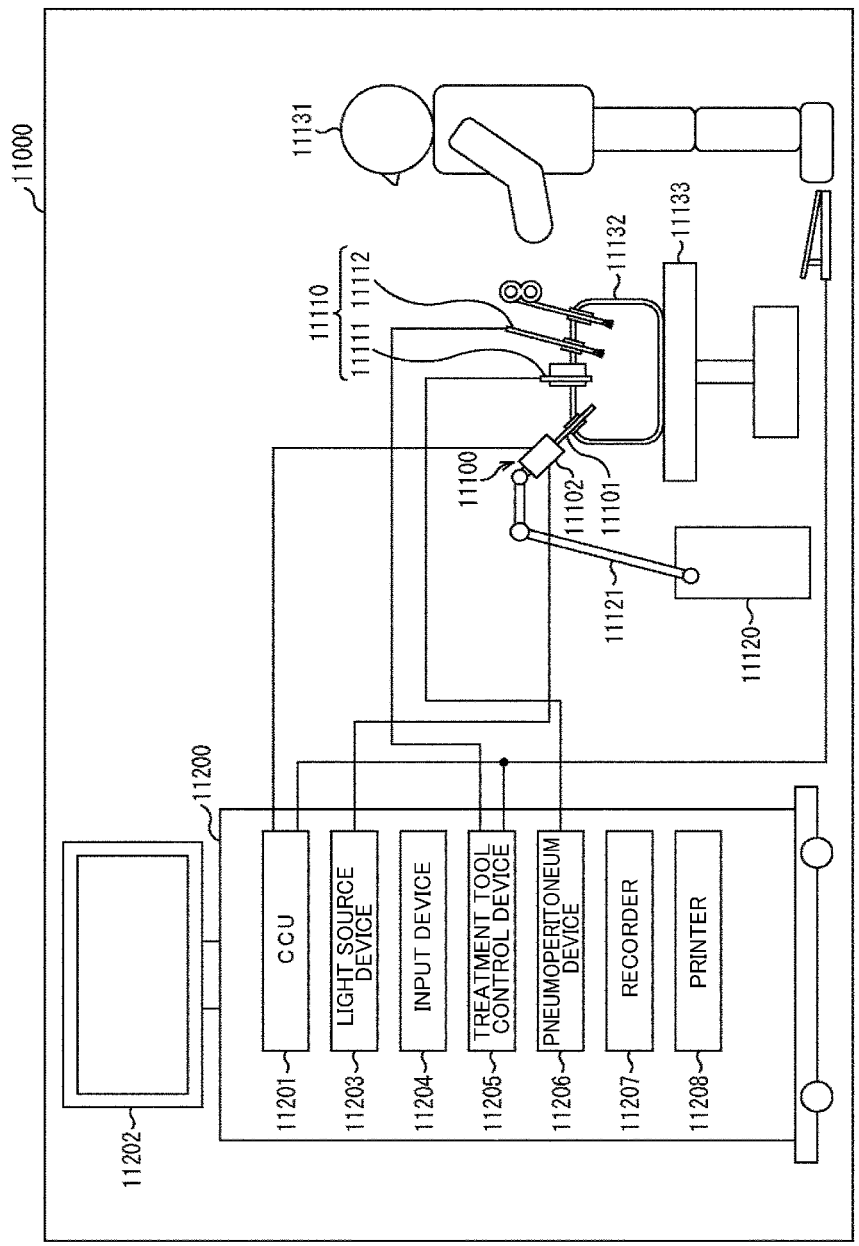

FIG. 41 is a diagram illustrating an example of a schematic configuration of an endoscope surgery system to which the technology according to the present disclosure is applied (the present technology).

FIG. 41 illustrates an aspect in which an operator (a physician) 11131 is performing an operation on a patient 11132 on a patient bed 11133 using an endoscope surgery system 11000. As illustrated, the endoscope surgery system 11000 includes an endoscope 11100, other surgery tools 11110 such as a pneumoperitoneum tube 11111 or an energy treatment tool 11112, a support arm device 11120 supporting the endoscope 11100, and a cart 11200 on which various devices for an endoscopic operation are mounted.

The endoscope 11100 includes a body tube 11101 of which a region with a predetermined length is inserted from a distal end into a body cavity of the patient 11132 and a camera head 11102 connected to a base end of the body tube 11101. In the illustrated example, the endoscope 11100 configured as a so-called hard mirror having a hard body tube 11101 is illustrated, but the endoscope 11100 may be configured as a so-called soft mirror having a soft body tube.

At the distal end of the body tube 11101, an opening into which an objective lens is inserted is provided. A light source device 11203 is connected to the endoscope 11100, light generated by the light source device 11203 is guided to the distal end of the body tube by a light guide extended to the inside of the body tube 11101, and the light is radiated to an observation target in the cavity of the patient 11132 through the objective lens. The endoscope 11100 may be a direct-viewing mirror, an oblique-viewing mirror, or a side-viewing mirror.

An optical system and an imaging element are provided inside the camera head 11102 and light (observation light) reflected from the observation target is condensed on the imaging element by the optical system. The observation light is photoelectrically converted by the imaging element and an electric signal corresponding to the observation light, that is, an image signal corresponding to an observation image, is generated. The image signal is transmitted as raw data to a camera control unit (CCU) 11201.

The CCU 11201 is configured by a central processing unit (CPU), a graphics processing unit (GPU), or the like and generally controls operations of the endoscope 11100 and the display device 11202. Further, the CCU 11201 receives an image signal from the camera head 11102 and performs, for example, various kinds of image processing such as a developing process (demosaic processing) on the image signal to display an image based on the image signal.

The display device 11202 displays the image based on the image signal subjected to the image processing in the CCU 11201 under the control of the CCU 11201.

The light source device 11203 is configured by, for example, a light source such as a light emitting diode (LED) and supplies the endoscope 11100 with irradiation light at the time of imaging of an operation part or the like.

An input device 11204 is an input interface to the endoscope surgery system 11000. A user can input various kinds of information or instructions to the endoscope surgery system 11000 through the input device 11204. For example, the user inputs an instruction or the like to change imaging conditions (a kind of irradiation light, a magnification, a focal distance, and the like) for the endoscope 11100.

A treatment tool control device 11205 controls driving of the energy treatment tool 11112 for tissue cautery or incision, blood vessel sealing, or the like. A pneumoperitoneum device 11206 sends a gas into the cavity via the pneumoperitoneum tube 11111 to inflate the cavity of the patient 11132 in order to guarantee a visual field for the endoscope 11100 and guarantee a working space of the operator. A recorder 11207 is a device capable of recording various kinds of information regarding surgery. A printer 11208 is a device capable of printing various kinds of information regarding surgery in various forms of text, images, graphs, or the like.

The light source device 11203 that supplies the endoscope 11100 with irradiation light at the time of imaging of an operation part can be configured by, for example, an LED, a laser light source, or a white light source configured in combination thereof. When the white light source is configured in combination of an RGB laser light source, an output intensity and an output timing of each color (each wavelength) can be controlled with high accuracy. Therefore, the light source device 11203 can adjust white balance of a captured image. In this case, by irradiating an observation target with laser light from the RGB laser light source chronologically and controlling driving of the imaging element of the camera head 11102 in synchronization with the irradiation timing, it is also possible to capture images corresponding to RGB chronologically. According to this method, it is possible to obtain a color image even when color filters are not provided in the imaging element.

The driving of the light source device 11203 may be controlled such that the intensity of light to be output is changed at each predetermined time. By controlling the driving of the imaging element of the camera head 11102 in synchronization with a change timing of the intensity of the light, acquiring images chronologically, and combining the images, it is possible to generate an image with a high dynamic range in which there is no so-called black spots and white spots.

The light source device 11203 may be configured to be able to supply light with a predetermined wavelength band corresponding to special light observation. In the special light observation, for example, so-called narrow band observation (narrow band imaging) is performed for imaging a predetermined tissue such as a blood vessel of a mucous membrane surface with high contract by radiating light with a narrower band than the irradiation light (that is, white light) at the time of normal observation using wavelength dependency of light absorption in a body tissue. Alternatively, in the special light observation, fluorescence observation may be performed for obtaining an image by fluorescence occurring by radiating exciting light. In the fluorescence observation, for example, a body tissue can be irradiated with exciting light and fluorescence from the body tissue can be observed (self-fluorescence observation), or a reagent such as indocyanine green (ICG) can be locally injected into a body tissue and the body tissue can be irradiated with exciting light corresponding to the fluorescence wavelength of the reagent to obtain a fluorescent image. The light source device 11203 can be configured to be able to supply exciting light and/or narrow-band light corresponding to the special light observation.

Figure 42:
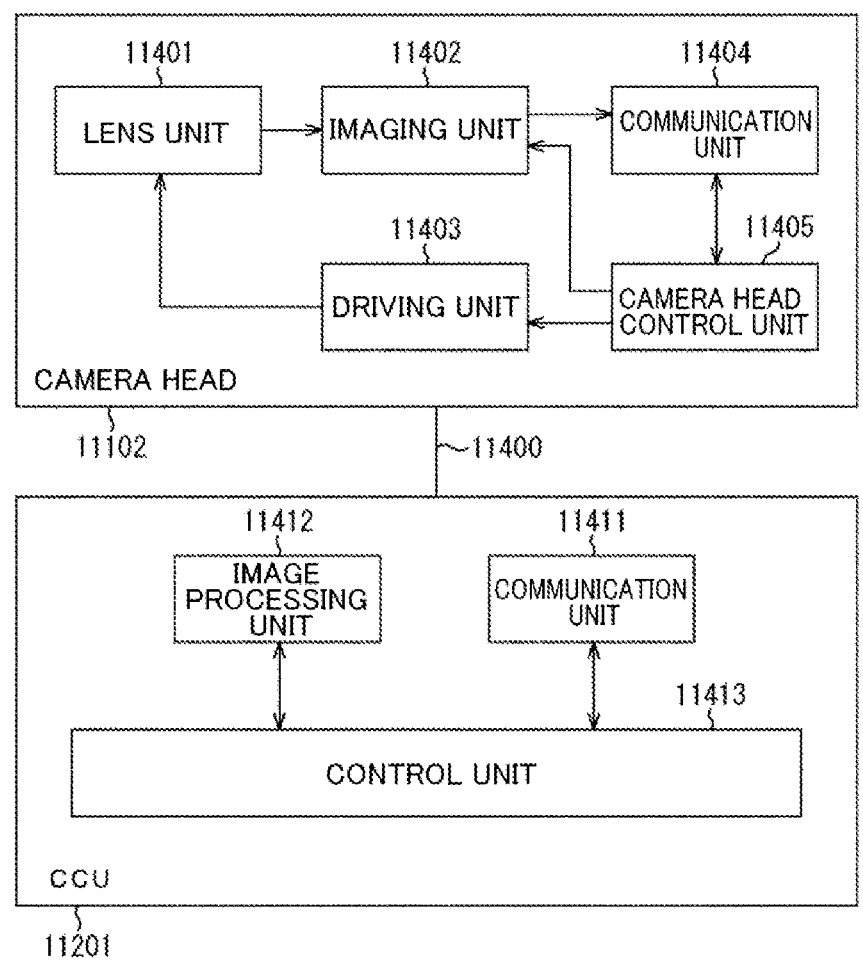

FIG. 42 is a block diagram illustrating examples of functional configurations of the camera head 11102 and the CCU 11201 illustrated in FIG. 41.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to be able to communicate with each other via a transmission cable 11400.

The lens unit 11401 is an optical system provided in a connection unit with the body tube 11101. Observation light received from the distal end of the body tube 11101 is guided to the camera head 11102 and is incident on the lens unit 11401. The lens unit 11401 is configured to a plurality of lenses including a zoom lens and a focus lens in combination.

The number of imaging elements that configure the imaging unit 11402 may be singular (so-called single-plate) or may be multiple (so-called multiple-plate). When the imaging unit 11402 is configured as a multiple-plate, for example, an image signal corresponding to each of RGB may be generated by each imaging element and a color image may be able to be generated by combining the image signals. Alternatively, the imaging unit 11402 may include a pair of imaging elements to acquire right eye and left eye image signals corresponding to 3-dimensional (3D) display. By performing the 3D display, the operator 11131 can ascertain the depth of a body tissue in an operation part more accurately. When the imaging unit 11402 is configured as a multiple-plate, a plurality of systems of the lens unit 11401 may be provided to correspond to each imaging element.

The imaging unit 11402 may not necessarily be provided in the camera head 11102. For example, the imaging unit 11402 may be provided immediately after the objective lens inside the body tube 11101.

The driving unit 11403 is configured by an actuator and the zoom lens and the focus lens of the lens unit 11401 are moved by a predetermined distance along an optical axis under the control of the camera head control unit 11405. In this way, it is possible to appropriately adjust the magnification and focus of a captured image by the imaging unit 11402.

The communication unit 11404 is configured by a communication device that transmits and receives various kinds of information to and from the CCU 11201. The communication unit 11404 transmits an image signal obtained from the imaging unit 11402 to the CCU 11201 as raw data via the transmission cable 11400.

The communication unit 11404 receives a control signal for controlling driving of the camera head 11102 from the CCU 11201 and supplies the control signal to the camera head control unit 11405. The control signal includes, for example, information regarding imaging conditions such as information indicating designation of a frame rate of a captured image, information indicating designation of an exposure value at the time of imaging, and/or information indicating designation of the magnification and focus of the captured image.

Imaging conditions such as the foregoing frame rate, exposure value, magnification, and focus may be designated appropriately by the user or may be set automatically by the control unit 11413 of the CCU 11201 based on the acquired image signal. In the latter case, a so-called auto exposure (AE) function, auto focus (AF) function, and auto white balance (AWB) function are mounted on the endoscope 11100.

The camera head control unit 11405 controls driving of the camera head 11102 based on a control signal received from the CCU 11201 via the communication unit 11404.

The communication unit 11411 is configured by a communication device that transmits and receives various kinds of information to and from the camera head 11102. The communication unit 11411 receives an image signal transmitted via the transmission cable 11400 from the camera head 11102.

The communication unit 11411 transmits a control signal for controlling driving of the camera head 11102 to the camera head 11102. The image signal or the control signal can be transmitted through electric communication, optical communication, or the like.

The image processing unit 11412 applies various kinds of image processing to the image signal which is the raw data transmitted from the camera head 11102.

The control unit 11413 performs various kinds of control on display of a captured image obtained through imaging of an operation part or the like or imaging of an operation part or the like by the endoscope 11100. For example, the control unit 11413 generates a control signal for controlling driving of the camera head 11102.

The control unit 11413 causes the display device 11202 to display the captured image in which the operation part or the like is shown based on the image signal subjected to the image processing in the image processing unit 11412. At this time, the control unit 11413 may recognize various objects in the captured image using various image recognition technologies. For example, the control unit 11413 can recognize a surgery tool such as forceps, a specific biological part, bleeding, or mist or the like at the time of use of the energy treatment tool 11112 by detecting the shape, color, or the like of the edge of an object included in the captured image. The control unit 11413 may superimpose various kinds of surgery support information on the image of the operation part for display using the recognition result when the display device 11202 is caused to display the captured image. By superimposing and displaying the surgery support information and presenting the surgery support information to the operator 11131, it is possible to reduce a burden on the operator 11131 or allow the operator 11131 to perform an operation reliably.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, the transmission cable 11400 is used for wired communication, but communication between the camera head 11102 and the CCU 11201 may be performed wirelessly.

Application to Mobile Object

The technology (the present technology) of the present disclosure can be applied to various products. For example, the technology of the present disclosure may be implemented as a device mounted in any type of mobile object such as an automobile, an electric automobile, a hybrid electric automobile, a motorbike, a bicycle, a personal mobility, an airplane, a drone, a ship, and a robot.

Figure 43:
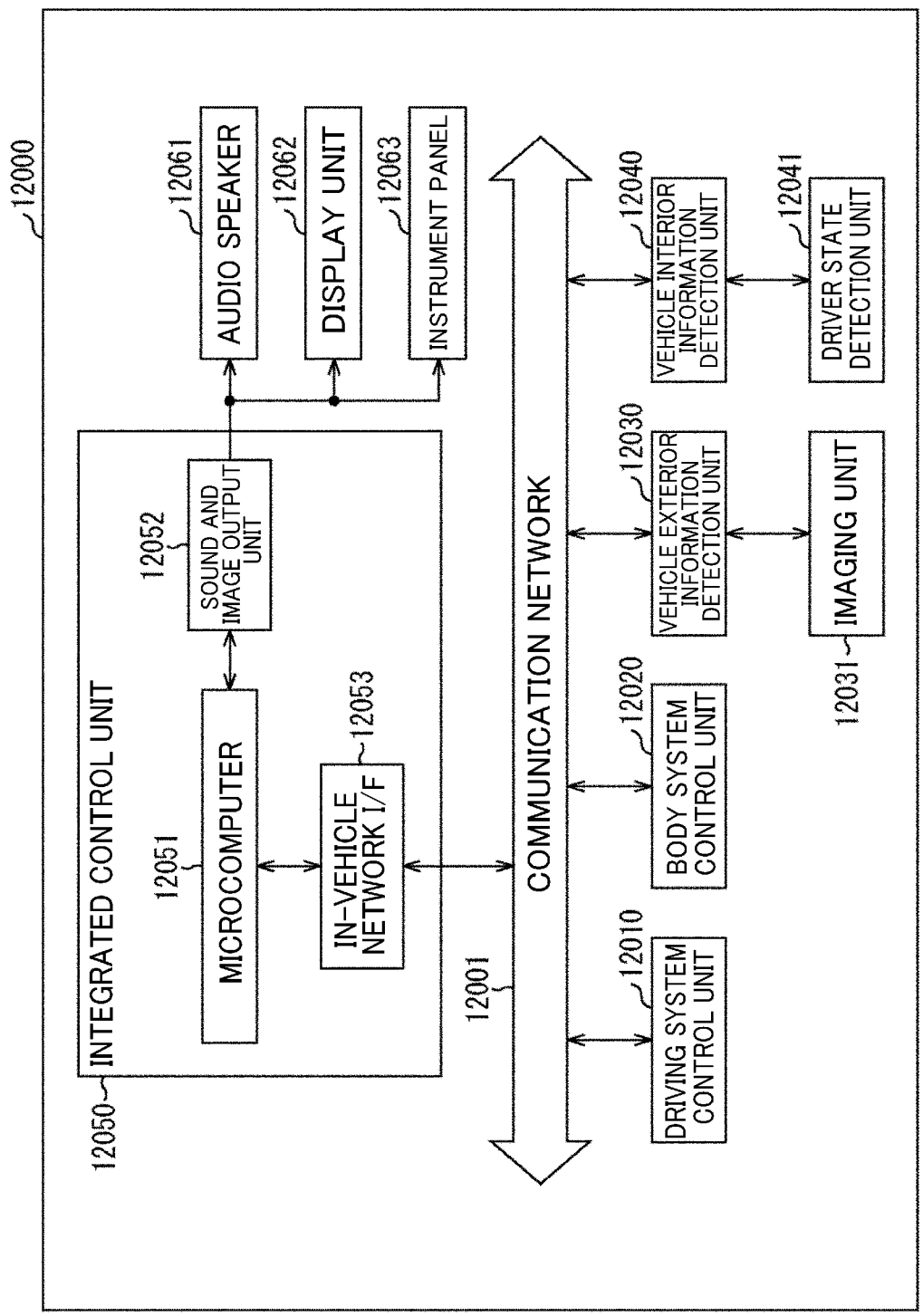

FIG. 43 is a block diagram illustrating an exemplary overall configuration of a vehicle control system which is an example of a mobile object control system to which the technology of the present disclosure is applied.

A vehicle control system 12000 includes a plurality of electronic control units connected via a communication network 12001. In an example illustrated in FIG. 43, the vehicle control system 12000 includes a driving system control unit 12010, a body system control unit 12020, a vehicle exterior information detection unit 12030, a vehicle interior information detection unit 12040, and an integrated control unit 12050. A microcomputer 12051, a sound and image output unit 12052, and an in-vehicle network interface (I/F) 12053 are illustrated as a functional configuration of the integrated control unit 12050.

The driving system control unit 12010 controls an operation of a device related to a driving system of a vehicle in accordance with various programs. For example, the driving system control unit 12010 functions as a control device such as a driving force generation device generating a driving force of a vehicle, such as an internal combustion engine or a driving motor, a driving force transmission mechanism transmitting a driving force to wheels, a steering mechanism adjusting a rudder angle of a vehicle, and a braking device generating a braking force of a vehicle.

The body system control unit 12020 controls operations of various devices equipped in a vehicle in accordance with various programs. For example, the body system control unit 12020 functions as a keyless entry system, a smart key system, a power window device, or a control device of various lamps such as a head lamp, a back lamp, a brake lamp, a blinker, or a fog lamp. In this case, radio waves transmitted from a portable device substituting for a key or signals from various switches can be input to the body system control unit 12020. The body system control unit 12020 receives an input of such radio waves or signals and controls a door locking device, a power window device, lamps, and the like of a vehicle.

The vehicle exterior information detection unit 12030 detects external information of a vehicle in which the vehicle control system 12000 is mounted. For example, the imaging unit 12031 is connected to the vehicle exterior information detection unit 12030. The vehicle exterior information detection unit 12030 causes the imaging unit 12031 to capture images outside of the vehicle and receives captured images. The vehicle exterior information detection unit 12030 may perform a distance detection process or an object detection process for people, vehicles, obstacles, signs, and characters on roads based on the received images.

The imaging unit 12031 is an optical sensor that receives light and outputs an electric signal in accordance with an amount of received light. The imaging unit 12031 can output the electric signal as an image or can also output the electric signal as ranging information. The light received by the imaging unit 12031 may be visible light or invisible light such as infrared light.

The vehicle interior information detection unit 12040 detects vehicle interior information. For example, a driver state detection unit 12041 detecting a state of a driver is connected to the vehicle interior information detection unit 12040. The driver state detection unit 12041 includes, for example, a camera that images a driver. The vehicle interior information detection unit 12040 may calculate the degree of fatigue or the degree of concentration of the driver or may determine whether the drive is drowsing based on detected information input from the driver state detection unit 12041.

The microcomputer 12051 can calculate a control target value of the driving force generation device, the steering mechanism, or the braking device based on vehicle interior or exterior information acquired by the vehicle exterior information detection unit 12030 or the vehicle interior information detection unit 12040 and can output a control instruction to the driving system control unit 12010. For example, the microcomputer 12051 can perform cooperated control in order to implement functions of an advanced driver assistance system (ADAS) including collision avoidance or collision absorption of a vehicle, following travel based on an inter-vehicle distance, a vehicle speed keeping travel, a vehicle collision warning, or a vehicle lane deviation warning.

The microcomputer 12051 can perform cooperated control in order to perform automated driving or the like in which a vehicle autonomously travels without a manipulation of a driver by controlling the driving force generation device, the steering mechanism, the braking device, or the like based on surrounding information of the vehicle acquired by the vehicle exterior information detection unit 12030 or the vehicle interior information detection unit 12040.

The microcomputer 12051 can output a control instruction to the body system control unit 12030 based on vehicle exterior information acquired by the vehicle exterior information detection unit 12030. For example, the microcomputer 12051 can control a head lamp in accordance with a position of a front vehicle or an oncoming vehicle detected by the vehicle exterior information detection unit 12030 and can perform cooperated control in order to achieve antiglare such as switching of a high beam to a low beam.

The sound and image output unit 12052 transmits an output signal of at least one of a sound and an image to an output device capable of notifying an occupant of a vehicle or the outside of the vehicle of information visually or auditorily. In the example of FIG. 43, an audio speaker 12061, a display unit 12062, and an instrument panel 12063 are exemplified as output devices. The display unit 12062 may include, for example, at least one of an onboard display and a head-up display.

Figure 44:
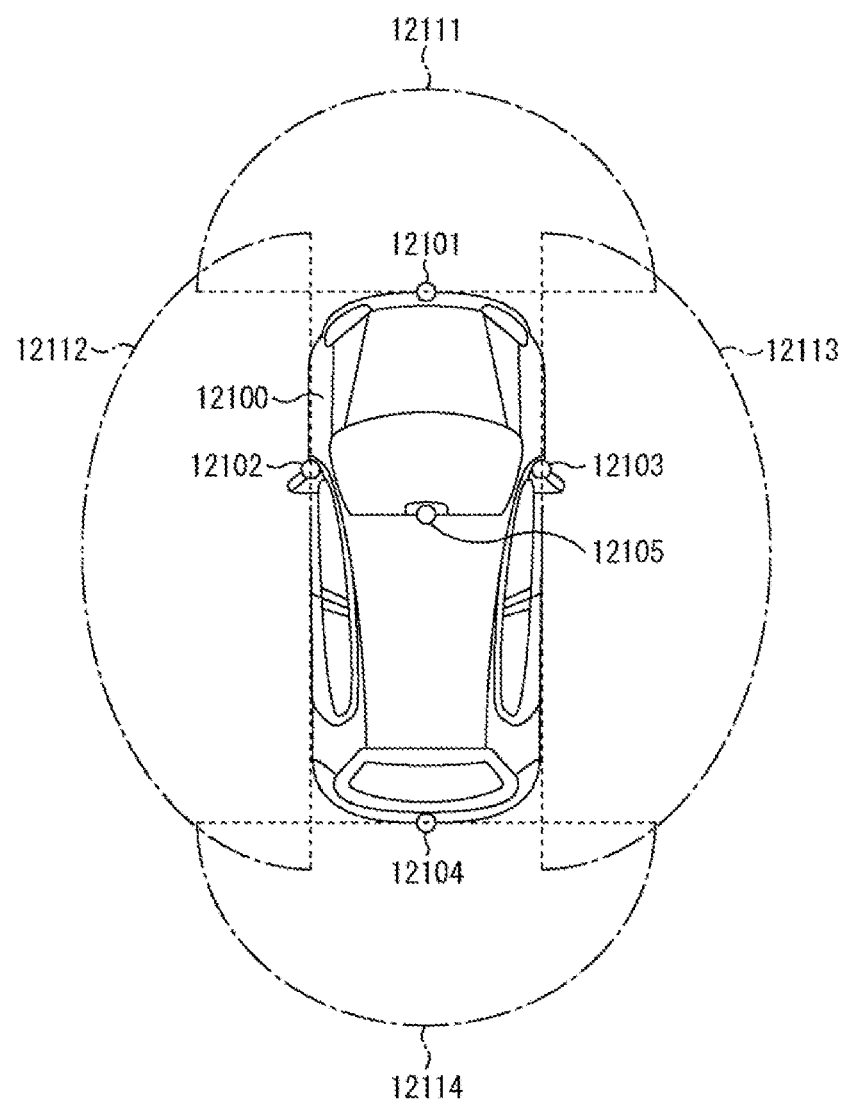

FIG. 44 is a diagram illustrating examples of positions at which the imaging units 12031 are installed.

In FIG. 44, imaging units 12101, 12102, 12103, 12104, and 12105 are included as the imaging unit 12031.

The imaging units 12101, 12102, 12103, 12104, and 12105 are provided at, for example, positions of a front nose, side mirrors, a rear bumper, a back door, an upper portion of a vehicle interior front windshield, and the like of a vehicle 12100.

The imaging unit 12101 provided on a front nose and the imaging unit 12105 provided in an upper portion of the vehicle interior front windshield mainly acquire images in front of the vehicle 12100. The imaging units 12102 and 12103 provided on the side mirrors mainly acquire images on the lateral side of the vehicle 12100. The imaging unit 12104 provided on the rear bumper or the back door mainly acquires images in the rear of the vehicle 12100. The imaging unit 12105 provided on the upper portion of the vehicle interior front windshield is used to mainly detect front vehicles, pedestrians, obstacles, traffic signals, traffic signs, lanes, or the like.

In FIG. 44, examples of imaging ranges of the imaging units 12101 to 12104 are illustrated. An imaging range 12111 is an imaging range of the imaging unit 12101 provided on the front noise, imaging ranges 12112 and 12113 are imaging ranges of the imaging units 12102 and 12103 provided in the side mirrors, and an imaging range 12114 is an imaging range of the imaging unit 12104 provided in the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function of acquiring distance information. For example, at least one of the imaging units 12101 to 12104 may be a stereo camera formed by a plurality of image sensors or may be an image sensor that has phase difference detection pixels.

For example, the microcomputer 12051 can extract a 3-dimensional object traveling at a predetermined speed (for example, 0 or more km/h) in substantially the same direction as the vehicle 12100 particularly in a 3-dimensional object closest to a travel road of the vehicle 12100 as a front vehicle by obtaining a distance to each 3-dimensional object in the imaging ranges 12111 to 12114 and a change (a relative speed to the vehicle 12100) in the distance over time based on distance information obtained from the imaging units 12101 to 12104. Further, the microcomputer 12051 can set an inter-vehicle distance which should be guaranteed in advance in front of a front vehicle and can perform automated brake control (also including following stop control) or automated acceleration control (also including following start control). In this way, it is possible to perform cooperated control in order to perform automated driving or the like in which a vehicle autonomously travels irrespective of a manipulation of a driver.

For example, the microcomputer 12051 can classify and extract 3-dimensional data regarding 3-dimensional objects into other 3-dimensional objects such as a two-wheeled vehicle, a normal vehicle, a large vehicle, a pedestrian, and an electric pole based on distance information obtained from the imaging units 12101 to 12104 and can use the other 3-dimensional objects to perform automated avoidance of obstacles. For example, the microcomputer 12051 identifies surrounding obstacles of the vehicle 12100 as obstacles which can be viewed by the driver of the vehicle 12100 and obstacles which are difficult to view. The microcomputer 12051 determines a collision risk indicating the degree of danger of collision with each obstacle. In a situation in which there is a collision possibility of the collision risk equal to or greater than a set value, a warning is output to a driver via the audio speaker 12061 or the display unit 12062, or forced deceleration or avoidance steering is performed through the driving system control unit 12010. Thus, it is possible to perform driving support for collision avoidance.

At least one of the imaging units 12101 to 12104 may be an infrared camera that detects infrared light. For example, the microcomputer 12051 can recognize pedestrians by determining whether the pedestrians are in images captured by the imaging units 12101 to 12104. The recognition of the pedestrians is performed, for example, in a procedure of extracting feature points in the images captured by the imaging units 12101 to 12104 serving as infrared cameras and a procedure of determining whether there are pedestrians by performing pattern matching processing on the series of feature points indicating the contours of objects. When the microcomputer 12051 determines that pedestrians are in the images captured by the imaging units 12101 to 12104 and recognize the pedestrians, the sound and image output unit 12052 controls the display unit 12062 such that rectangular contour lines for emphasis are superimposed and displayed on the recognized pedestrians. The sound and image output unit 12052 may control the display unit 12062 such that icons or the like indicating pedestrians are displayed at desired positions.

The present technology can be applied to a scheme of performing amplitude modulation on light transmitting through an object, such as a continuous-wave scheme among indirect ToF schemes. The structure of the photodiode 261 can be applied to a ranging sensor that has a structure in which charges are distributed to two charge accumulation units, such as a ranging sensor with a current assisted photonic demodulator (CAPD) structure or a ranging sensor with a gate scheme of alternately applying pulses of charges of a photodiode to two gates.

In the above-described embodiment, the case in which the pixel 250 has the 2-tap structure in which the charges generated by the photodiode 261 are distributed to two taps, the taps 251A and 251B has been described. However, the present technology can also be applied to a pixel structure with the other number of taps such as a 1-tap structure or a 4-tap structure.

Embodiments of the present technology are not limited to the above-described embodiments and can be modified in various forms within the scope of the present technology without departing from the gist of the present technology.

The plurality of present technologies described in the present specification can be implemented individually alone unless contradiction occurs. Of course, any of the plurality of present technologies can be implemented in combination. For example, some or all of the present technologies described in one embodiment can also be implemented in combination with some or all of the present technologies described in other embodiments. Some or all of the above-described present technologies can be implemented in combination with other technologies which have not been described above.

For example, the configuration described as one device (or a processing unit) may be divided to be configured as a plurality of devices (or processing units). Conversely, the plurality of foregoing devices (or processing units) may be collectively combined to be configured as one device (or processing unit). The above-described other configurations may be added to the configuration of each device (or each processing unit). Further, when configurations or operations of an entire system are substantially the same, a part of the configuration of a certain device (or processing unit) may be included in the configuration of another device (or another processing unit).

Further, in the present specification, a system means a collection of a plurality of constituent elements (devices, modules (components), or the like) and whether all the constituent elements are contained in the same casing does not matter. Accordingly, a plurality of devices accommodated in separate casings and connected via a network and one device in which a plurality of modules are accommodated in one casing are all systems.

The advantageous effects described in the present specification are merely exemplary and are not limited, and other advantageous effects of the advantageous effects described in the present specification may be achieved.

The present technology can be configured as follows.

(1)

An image sensor including:
a photoelectric conversion unit configured to perform photoelectric conversion;
a charge accumulation unit configured to accumulate charges obtained by the photoelectric conversion unit;
a transfer unit configured to transfer the charges from the photoelectric conversion unit to the charge accumulation unit;
a reset unit configured to reset the charge accumulation unit;
a reset voltage control unit configured to control a voltage to be applied to the reset unit; and
an additional control unit configured to control addition of capacitance to the charge accumulation unit,
wherein the charge accumulation unit includes a plurality of regions.

(2)

The image sensor according to (1), wherein, of the plurality of regions included in the charge accumulation unit, one region is connected to the transfer unit and another region is connected to the additional control unit.

(3)

The image sensor according to (1) or (2), wherein the plurality of regions included in the charge accumulation unit are provided in a substrate in which the photoelectric conversion unit is provided, and wherein wirings connecting the plurality of regions are provided in a wiring layer stacked on the substrate.

(4)

The image sensor according to any one of (1) to (3), wherein the plurality of regions are two regions, one of the regions is provided in a first pixel, and the other region is provided in a second pixel adjacent to the first pixel.

(5)

An image sensor including:
a photoelectric conversion unit configured to perform photoelectric conversion;
a plurality of charge accumulation units configured to accumulate charges obtained by the photoelectric conversion unit;
a plurality of transfer units configured to transfer the charges from the photoelectric conversion unit to each of the plurality of charge accumulation units;
a plurality of reset units configured to reset each of the plurality of charge accumulation units;
a plurality of reset voltage control units configured to control voltages to be applied to each of the plurality of reset units; and
a plurality of additional control units configured to control addition of capacitance to each of the plurality of charge accumulation units,
wherein the charge accumulation unit of each of the plurality of charge accumulation units includes a plurality of regions.

(6)

The image sensor according to (5), wherein, of the plurality of regions included in the charge accumulation unit, one region is connected to the transfer unit and another region is connected to the additional control unit.

(7)

The image sensor according to (5) or (6), wherein the plurality of regions included in the charge accumulation unit are provided in a substrate in which the photoelectric conversion unit is provided, and wherein wirings connecting the plurality of regions are provided in a wiring layer stacked on the substrate.

(8)

The image sensor according to (7), wherein wirings forming some of the charge accumulation units are provided in a layer different from a layer in which the wirings connecting the plurality of regions are provided.

(9)

The image sensor according to (8), wherein, in the wiring layer, a wiring that is connected to the reset voltage control unit and functions as a parasitic capacitance is provided.

(10)

The image sensor according to any one of (5) to (9), wherein the plurality of charge accumulation units, the plurality of transfer units, the plurality of reset units, the plurality of reset voltage control units, and the plurality of additional control units are linearly symmetric.

(11)

The image sensor according to (10), further including:
a discharge unit configured to discharge charges obtained by the photoelectric conversion unit,
wherein the discharge unit is linearly symmetric.

(12)

The image sensor according to (11), wherein the discharge unit is disposed at a position at which the discharge unit forms a right angle with the transfer unit.

(13)

The image sensor according to (11), wherein the discharge unit and the transfer unit are disposed side by side on one side of the photoelectric conversion unit.

(14)

The image sensor according to any one of (5) to (13), wherein the transfer unit includes a vertical gate.

(15)

The image sensor according to (14), wherein the transfer unit includes a plurality of the vertical gates, and
wherein depths of the vertical gates are different.

(16)

The image sensor according to any one of (5) to (15), wherein the transfer unit includes first and second gates, and
wherein the first gate is disposed between the photoelectric conversion unit and the charge accumulation unit and the second gate is disposed at a position superimposed on the photoelectric conversion unit.

(17)

The image sensor according to (16), wherein at least one of the first and second gates is a vertical gate.

(18)

The image sensor according to (17), wherein the first and second gates are simultaneously driven.

(19)

An imaging device including:
an image sensor; and
a processing unit configured to process a signal from the image sensor,
wherein the image sensor includes a photoelectric conversion unit configured to perform photoelectric conversion,
a charge accumulation unit configured to accumulate charges obtained by the photoelectric conversion unit,
a transfer unit configured to transfer the charges from the photoelectric conversion unit to the charge accumulation unit,
a reset unit configured to reset the charge accumulation unit,
a reset voltage control unit configured to control a voltage to be applied to the reset unit, and
an additional control unit configured to control addition of capacitance to the charge accumulation unit,
wherein the charge accumulation unit includes a plurality of regions.

(20)

A ranging device including:
a light-emitting unit configured to emit irradiation light; and
a light-receiving element configured to receive reflected light when light from the light-emitting unit is reflected from an object,
wherein the light-receiving element includes
a photoelectric conversion unit configured to perform photoelectric conversion,
a plurality of charge accumulation units configured to accumulate charges obtained by the photoelectric conversion unit,
a plurality of transfer units configured to transfer the charges from the photoelectric conversion unit to the plurality of charge accumulation units,
a plurality of reset units configured to reset the plurality of charge accumulation units,
a plurality of reset voltage control units configured to control voltages to be applied to the plurality of reset units, and
a plurality of additional control units configured to control addition of capacitance to the plurality of charge accumulation units,
wherein the charge accumulation unit of each of the plurality of charge accumulation units includes a plurality of regions.

REFERENCE SINGS LIST

10 Imaging device
11 Semiconductor substrate
20 Pixel
21 Pixel array unit
22 Vertical driving unit
23 Column signal processing unit
24 Horizontal driving unit
25 System control unit
26 Pixel driving line
27 Vertical signal line
28 Signal processing unit
29 Data storage unit
50 Pixel
51 Photoelectric conversion units
52 Transfer transistor
60 Additional capacitance unit
61 Well contact
62 Inter-layer insulating film
65, 66 Wiring
210 Ranging device
211 Lens
212 Light-receiving unit
213 Signal processing unit
214 Light-emitting unit
215 Light irradiation control unit
221 Pattern switching unit
222 Distance image generation unit
241 Pixel array unit
242 Vertical driving unit
243 Column processing unit
244 Horizontal driving unit
245 System control unit
246 Pixel driving line 247 Vertical signal line
248 Signal processing unit
250 Pixel
251 Tap
252 Transfer transistor
254 Reset transistor
256 Discharge transistor
257 Amplification transistor
258 Select transistor
260 Additional capacitance unit
261 Photodiode
265 Well contact
341 Semiconductor substrate
342 Multilayer wiring layer
343 Antireflection film
345 Inter-pixel light shielding film
346 Flattened film
347 On-chip lens
351 Semiconductor region
352 Semiconductor region
353 Hafnium oxide film
354 Aluminum oxide film
355 Silicon oxide film
361 Inter-pixel separation unit
366 Via
371 to 374 Wiring
411 Via
412 to 415 Contact
416, 417 Via
418 Contact
419 Via
431 to 434 Wiring
441, 442 Wiring

The invention claimed is:

1. An image sensor, comprising:
a substrate that includes a photodiode configured to perform photoelectric conversion;
a floating diffusion configured to accumulate charges from the photodiode;
a transfer transistor configured to transfer the charges from the photodiode to the floating diffusion;
a reset transistor configured to reset the floating diffusion;
a reset voltage control transistor configured to control a voltage applied to the reset transistor;
an additional control transistor configured to control addition of capacitance to the floating diffusion, wherein the floating diffusion includes a plurality of regions in the substrate; and
a multilayer wiring layer on the substrate, wherein
the multilayer wiring layer includes:
first wirings that connect the plurality of regions, and
second wirings that are a part of the floating diffusion, and
the first wirings and the second wirings are in different layers of the multilayer wiring layer.

2. The image sensor according to claim 1, wherein the plurality of regions includes a first region connected to the transfer transistor and a second region connected to the additional control transistor.

3. The image sensor according to claim 1, wherein the plurality of regions includes a first region in a first pixel, and a second region in a second pixel adjacent to the first pixel.

4. An image sensor, comprising:
a substrate that includes a photodiode configured to perform photoelectric conversion;
a plurality of floating diffusions configured to accumulate charges from the photodiode;
a plurality of transfer transistors configured to transfer the charges from the photodiode to each of the plurality of floating diffusions;
a plurality of reset transistors configured to reset each of the plurality of floating diffusions;
a plurality of reset voltage control transistors configured to control voltages applied to each of the plurality of reset transistors;
a plurality of additional control transistors configured to control addition of capacitance to each of the plurality of floating diffusions, wherein each floating diffusion of the plurality of floating diffusions includes a plurality of regions in the substrate; and
a multilayer wiring layer on the substrate, wherein
the multilayer wiring layer includes:
first wirings that connect the plurality of regions, and
second wirings that are a part of the plurality of floating diffusions, and
the first wirings and the second wirings are in different layers of the multilayer wiring layer.

5. The image sensor according to claim 4, wherein the plurality of regions includes a first region connected to a respective transfer transistor of the plurality of transfer transistors and a second region connected to a respective additional control transistor of the plurality of additional control transistors.

6. The image sensor according to claim 4, wherein
the multilayer wiring layer includes a third wiring that is connected to a respective reset voltage control transistor of the plurality of reset voltage control transistors, and
the third wiring is configured to function as a parasitic capacitance.

7. The image sensor according to claim 4, wherein the plurality of floating diffusions, the plurality of transfer transistors, the plurality of reset transistors, the plurality of reset voltage control transistors, and the plurality of additional control transistors are linearly symmetric.

8. The image sensor according to claim 7, further comprising a discharge transistor configured to discharge the charges obtained by the photodiode, wherein the discharge transistor is linearly symmetric.

9. The image sensor according to claim 8, wherein the discharge transistor is at a position at which the discharge transistor forms a right angle with a respective transfer transistor of the plurality of transfer transistors.

10. The image sensor according to claim 8, wherein the discharge transistor and a respective transfer transistor of the plurality of transfer transistors are disposed side by side on one side of the photodiode.

11. The image sensor according to claim 4, wherein a transfer transistor of the plurality of transfer transistors includes a vertical gate.

12. The image sensor according to claim 11, wherein
the transfer transistor includes a plurality of vertical gates including the vertical gate, and
a depth of a first vertical gate of the plurality of vertical gates is different from a depth of a second vertical gate of the plurality of vertical gates.

13. The image sensor according to claim 4, wherein
a transfer transistor of the plurality of transfer transistors includes a first gate and a second gate,
the first gate is between the photodiode and a respective floating diffusion of the plurality of floating diffusions, and
the second gate is at a position superimposed on the photodiode.

14. The image sensor according to claim 13, wherein at least one of the first gate or the second gate includes a vertical gate.

15. The image sensor according to claim 14, wherein the first gate and the second gate are simultaneously driven.

16. An imaging device, comprising:
- an image sensor; and
- a processor configured to process a signal from the image sensor, wherein the image sensor includes:
  - a substrate that includes a photodiode configured to perform photoelectric conversion;
  - a floating diffusion configured to accumulate charges from the photodiode;
  - a transfer transistor configured to transfer the charges from the photodiode to the floating diffusion;
  - a reset transistor configured to reset the floating diffusion;
  - a reset voltage control transistor configured to control a voltage applied to the reset transistor;
  - an additional control transistor configured to control addition of capacitance to the floating diffusion, wherein the floating diffusion includes a plurality of regions in the substrate; and
  - a multilayer wiring layer on the substrate, wherein the multilayer wiring layer includes:
    - first wirings that connect the plurality of regions, and
    - second wirings that are a part of the floating diffusion, and
    - the first wirings and the second wirings are in different layers of the multilayer wiring layer.

17. A ranging device, comprising:
- a light-emitting diode configured to emit irradiation light; and
- a light-receiving element configured to receive reflected light in a case where the irradiation light from the light-emitting diode is reflected from an object, wherein the light-receiving element includes:
  - a substrate that includes a photodiode configured to perform photoelectric conversion;
  - a plurality of floating diffusions configured to accumulate charges from the photodiode;
  - a plurality of transfer transistors configured to transfer the charges from the photodiode to each of the plurality of floating diffusions;
  - a plurality of reset transistors configured to reset each of the plurality of floating diffusions;
  - a plurality of reset voltage control transistors configured to control voltages applied to each of the plurality of reset transistors;
  - a plurality of additional control transistors configured to control addition of capacitance to each of the plurality of floating diffusions, wherein each floating diffusion of the plurality of floating diffusions includes a plurality of regions in the substrate; and
  - a multilayer wiring layer on the substrate, wherein the multilayer wiring layer includes:
    - first wirings that connect the plurality of regions, and
    - second wirings that are a part of the plurality of floating diffusions, and
    - the first wirings and the second wirings are in different layers of the multilayer wiring layer.

* * * * *